(12) United States Patent
Matsuzawa et al.

(10) Patent No.: US 7,655,377 B2
(45) Date of Patent: Feb. 2, 2010

(54) ANTIREFLECTION FILM AND EXPOSURE METHOD

(75) Inventors: Nobuyuki Matsuzawa, Tokyo (JP); Yoko Watanabe, Kanagawa (JP); Boontarika Thunnakart, Kanagawa (JP); Ken Ozawa, Kanagawa (JP); Yuko Yamaguchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 389 days.

(21) Appl. No.: 11/361,750

(22) Filed: Feb. 23, 2006

(65) Prior Publication Data

US 2006/0194125 A1    Aug. 31, 2006

(30) Foreign Application Priority Data

Feb. 28, 2005   (JP) .............................. 2005-054202

(51) Int. Cl.
*G03F 7/20* (2006.01)
*G03F 7/11* (2006.01)
*G03C 1/825* (2006.01)

(52) U.S. Cl. .................... 430/270.1; 430/311; 430/325; 430/326; 430/271.1; 430/272.1

(58) Field of Classification Search .................. None
See application file for complete search history.

(56) References Cited

U.S. PATENT DOCUMENTS

2007/0097514 A1* 5/2007 Matsuzawa et al. ......... 359/659

FOREIGN PATENT DOCUMENTS

JP         2001-242630        9/2001

OTHER PUBLICATIONS

B. Thunnakart, K. Ozawa and A. Someya; The anti-reflective layers for hyper NA ArF lithography; a Collection of Lecture Drafts for the 65th Scientific Lecture Meeting of the Japan Society of Applied Physics, 2p-R-9, (2004).

* cited by examiner

*Primary Examiner*—Sin J. Lee
(74) *Attorney, Agent, or Firm*—Sonnenschein Nath & Rosenthal LLP

(57) ABSTRACT

An antireflection film wherein, even where exposure light enters obliquely in a liquid immersion lithography technique, a sufficiently reduced reflectance can be achieved at the interface between a resist layer and a silicon substrate. A two-layer antireflection film is used in exposure by an exposure system having a wavelength of 190 to 195 nm and a numerical aperture of 1.0 or less and formed between the resist layer and the silicon substrate. Where complex refractive indices $N_1$ and $N_2$ and film thicknesses of upper and lower layers of the antireflection film are represented by $n_1$-$k_1$i, $n_2$-$k_2$i and $d_1$, $d_2$, respectively, and a predetermined combination of values of $[n_{10}, k_{10}, d_{10}, n_{20}, k_{20}, d_{20}]$ is selected, $n_1$, $k_1$, $d_1$, $n_2$, $k_2$ and $d_2$ satisfy $\{(n_1-n_{10})/(n_{1m}-n_{10})\}^2 + \{(k_1-k_{10})/(k_{1m}-k_{10})\}^2 + \{(d_1-d_{10})/(d_{1m}-d_{10})\}^2 + \{(n_2-n_{20})/(n_{2m}-n_{20})\}^2 + \{(k_2-k_{20})/(k_{2m}-k_{20})\}^2 + \{(d_2-d_{20})/(d_{2m}-d_{20})\}^2 \leq 1$.

15 Claims, 5 Drawing Sheets

REFLECTANCE(%)
- 0.000-0.025 : 1
- 0.025-0.050 : 2
- 0.050-0.075 : 3
- 0.075-0.100 : 4
- 0.100-0.250 : 5
- 0.250-0.400 : 6
- 0.400-0.550 : 7
- 0.550-0.700 : 8
- 0.700-0.850 : 9
- 0.850-1.000 : 10
- 1.000- : 11

| UPPER LAYER FILM THICKNESS (nm) / LOWER LAYER FILM THICKNESS (nm) | 10 | 20 | 30 | 40 | 50 | 60 | 70 | 80 | 90 | 100 | 110 | 120 | 130 | 140 | 150 | 160 | 170 | 180 | 190 | 200 | 210 | 220 | 230 | 240 | 250 |
|---|---|---|---|---|---|---|---|---|---|---|---|---|---|---|---|---|---|---|---|---|---|---|---|---|---|
| 10 | 5 | 1 | 2 | 2 | 3 | 5 | 5 | 5 | 5 | 5 | 4 | 4 | 5 | 7 | 5 | 5 | 5 | 5 | 5 | 5 | 6 | 5 | 5 | 4 | 5 |
| 20 | 5 | 1 | 1 | 1 | 2 | 3 | 5 | 5 | 5 | 4 | 4 | 5 | 5 | 6 | 5 | 4 | 5 | 5 | 5 | 5 | 5 | 5 | 5 | 4 | 4 |
| 30 | 2 | 1 | 1 | 1 | 2 | 4 | 5 | 4 | 4 | 4 | 4 | 5 | 5 | 5 | 4 | 5 | 5 | 5 | 5 | 5 | 5 | 5 | 5 | 5 | 5 |
| 40 | 2 | 1 | 1 | 1 | 2 | 3 | 4 | 3 | 3 | 3 | 3 | 4 | 5 | 5 | 5 | 5 | 5 | 5 | 5 | 5 | 6 | 5 | 5 | 5 | 5 |
| 50 | 2 | 1 | 1 | 1 | 1 | 3 | 4 | 3 | 3 | 3 | 3 | 4 | 5 | 5 | 5 | 5 | 5 | 5 | 5 | 5 | 5 | 5 | 5 | 5 | 5 |
| 60 | 3 | 1 | 1 | 1 | 1 | 3 | 5 | 3 | 3 | 3 | 3 | 4 | 5 | 5 | 4 | 5 | 5 | 5 | 5 | 5 | 5 | 5 | 5 | 5 | 5 |
| 70 | 3 | 1 | 1 | 1 | 2 | 3 | 3 | 3 | 2 | 2 | 3 | 5 | 5 | 4 | 5 | 5 | 5 | 5 | 5 | 5 | 5 | 5 | 5 | 5 | 6 |
| 80 | 2 | 1 | 1 | 1 | 2 | 3 | 3 | 3 | 2 | 3 | 3 | 5 | 5 | 4 | 5 | 5 | 5 | 5 | 5 | 5 | 5 | 5 | 5 | 5 | 5 |
| 90 | 2 | 1 | 1 | 1 | 2 | 3 | 4 | 3 | 3 | 3 | 3 | 5 | 5 | 5 | 5 | 5 | 6 | 5 | 5 | 5 | 5 | 5 | 5 | 5 | 5 |
| 100 | 2 | 1 | 1 | 1 | 2 | 4 | 5 | 4 | 4 | 3 | 4 | 6 | 5 | 5 | 5 | 5 | 6 | 6 | 5 | 5 | 5 | 5 | 5 | 5 | 6 |
| 110 | 2 | 1 | 1 | 1 | 2 | 4 | 5 | 4 | 4 | 4 | 4 | 6 | 5 | 5 | 5 | 5 | 6 | 6 | 5 | 5 | 5 | 5 | 5 | 5 | 5 |
| 120 | 2 | 1 | 1 | 1 | 2 | 4 | 5 | 4 | 4 | 4 | 4 | 6 | 5 | 5 | 5 | 6 | 6 | 5 | 5 | 6 | 5 | 5 | 5 | 5 | 5 |
| 130 | 1 | 1 | 1 | 1 | 3 | 5 | 5 | 5 | 4 | 4 | 4 | 6 | 5 | 5 | 6 | 6 | 6 | 6 | 7 | 6 | 5 | 5 | 5 | 5 | 5 |
| 140 | 1 | 1 | 1 | 1 | 3 | 5 | 5 | 4 | 4 | 4 | 4 | 6 | 5 | 5 | 6 | 6 | 6 | 6 | 7 | 6 | 5 | 5 | 5 | 5 | 5 |
| 150 | 1 | 1 | 1 | 1 | 3 | 5 | 5 | 5 | 4 | 4 | 5 | 6 | 5 | 5 | 6 | 6 | 6 | 6 | 6 | 5 | 5 | 5 | 5 | 5 | 5 |
| 160 | 1 | 1 | 1 | 1 | 3 | 5 | 5 | 5 | 5 | 4 | 5 | 6 | 5 | 6 | 6 | 6 | 6 | 6 | 5 | 5 | 5 | 5 | 5 | 5 | 5 |
| 170 | 1 | 1 | 1 | 1 | 3 | 5 | 5 | 5 | 5 | 4 | 5 | 6 | 5 | 6 | 6 | 6 | 6 | 6 | 5 | 5 | 5 | 6 | 5 | 5 | 5 |
| 180 | 1 | 1 | 1 | 2 | 3 | 5 | 5 | 5 | 5 | 5 | 5 | 6 | 5 | 6 | 6 | 6 | 6 | 6 | 5 | 5 | 5 | 6 | 5 | 5 | 5 |
| 190 | 1 | 1 | 1 | 2 | 3 | 5 | 5 | 5 | 5 | 5 | 5 | 6 | 6 | 6 | 6 | 6 | 6 | 7 | 6 | 5 | 5 | 6 | 6 | 5 | 5 |
| 200 | 1 | 1 | 1 | 2 | 3 | 5 | 5 | 5 | 5 | 5 | 5 | 6 | 6 | 6 | 6 | 6 | 6 | 6 | 6 | 5 | 6 | 5 | 5 | 5 | 5 |
| 210 | 1 | 1 | 1 | 2 | 3 | 5 | 5 | 4 | 5 | 5 | 5 | 6 | 6 | 6 | 6 | 6 | 6 | 7 | 6 | 5 | 5 | 6 | 6 | 5 | 5 |
| 220 | 1 | 1 | 2 | 2 | 3 | 5 | 5 | 5 | 5 | 5 | 5 | 6 | 6 | 6 | 6 | 6 | 5 | 6 | 5 | 5 | 5 | 6 | 5 | 5 | 5 |
| 230 | 1 | 1 | 2 | 3 | 3 | 5 | 5 | 5 | 5 | 5 | 5 | 6 | 6 | 6 | 6 | 5 | 5 | 6 | 5 | 5 | 5 | 5 | 5 | 5 | 5 |
| 240 | 1 | 1 | 2 | 2 | 3 | 5 | 5 | 5 | 5 | 5 | 5 | 6 | 6 | 6 | 6 | 5 | 5 | 5 | 5 | 5 | 5 | 5 | 5 | 5 | 5 |
| 250 | 1 | 1 | 2 | 2 | 3 | 5 | 5 | 5 | 5 | 5 | 5 | 6 | 5 | 6 | 6 | 5 | 5 | 5 | 5 | 5 | 5 | 5 | 5 | 5 | 5 |

| REFLECTANCE(%) | |
|---|---|
| 0.000-0.025 | :1 |
| 0.025-0.050 | :2 |
| 0.050-0.075 | :3 |
| 0.075-0.100 | :4 |
| 0.100-0.250 | :5 |
| 0.250-0.400 | :6 |
| 0.400-0.550 | :7 |
| 0.550-0.700 | :8 |
| 0.700-0.850 | :9 |
| 0.850-1.000 | :10 |
| 1.000- | :11 |

| UPPER LAYER FILM THICKNESS(nm) / LOWER LAYER FILM THICKNESS(nm) | 10 | 20 | 30 | 40 | 50 | 60 | 70 | 80 | 90 | 100 | 110 | 120 | 130 | 140 | 150 | 160 | 170 | 180 | 190 | 200 | 210 | 220 | 230 | 240 | 250 |
|---|---|---|---|---|---|---|---|---|---|---|---|---|---|---|---|---|---|---|---|---|---|---|---|---|---|
| 10  | 7 | 2 | 2 | 4 | 4 | 5 | 6 | 7 | 6 | 5 | 5 | 5 | 5 | 5 | 6 | 6 | 5 | 5 | 5 | 5 | 5 | 6 | 6 | 5 | 5 |
| 20  | 5 | 1 | 1 | 2 | 4 | 5 | 7 | 5 | 5 | 5 | 5 | 5 | 5 | 6 | 7 | 6 | 5 | 5 | 5 | 5 | 6 | 6 | 5 | 5 | 5 |
| 30  | 5 | 1 | 1 | 2 | 4 | 5 | 5 | 5 | 5 | 5 | 5 | 5 | 5 | 5 | 6 | 5 | 5 | 5 | 5 | 6 | 6 | 5 | 5 | 5 | 5 |
| 40  | 3 | 2 | 1 | 1 | 2 | 5 | 5 | 5 | 5 | 5 | 5 | 5 | 5 | 5 | 6 | 5 | 5 | 5 | 6 | 7 | 6 | 6 | 6 | 6 | 5 |
| 50  | 4 | 2 | 1 | 1 | 2 | 4 | 5 | 5 | 5 | 5 | 5 | 5 | 5 | 5 | 5 | 5 | 6 | 6 | 7 | 7 | 6 | 6 | 6 | 6 | 5 |
| 60  | 5 | 2 | 1 | 1 | 3 | 5 | 5 | 5 | 5 | 5 | 5 | 5 | 5 | 5 | 5 | 5 | 6 | 6 | 6 | 6 | 7 | 7 | 6 | 6 | 5 |
| 70  | 5 | 2 | 1 | 1 | 3 | 5 | 5 | 5 | 5 | 5 | 5 | 5 | 5 | 5 | 6 | 6 | 6 | 5 | 6 | 7 | 6 | 7 | 6 | 5 | 5 |
| 80  | 4 | 2 | 1 | 2 | 3 | 5 | 6 | 5 | 5 | 5 | 5 | 5 | 5 | 5 | 6 | 6 | 6 | 6 | 6 | 7 | 7 | 6 | 6 | 5 | 5 |
| 90  | 3 | 1 | 1 | 2 | 3 | 5 | 6 | 5 | 5 | 5 | 5 | 5 | 6 | 6 | 6 | 6 | 6 | 6 | 7 | 7 | 7 | 6 | 6 | 5 | 5 |
| 100 | 3 | 2 | 2 | 3 | 4 | 5 | 6 | 6 | 5 | 5 | 5 | 5 | 6 | 7 | 6 | 6 | 6 | 6 | 7 | 6 | 8 | 7 | 6 | 6 | 5 |
| 110 | 3 | 2 | 2 | 3 | 4 | 5 | 6 | 5 | 5 | 5 | 5 | 6 | 6 | 7 | 7 | 6 | 6 | 7 | 7 | 6 | 7 | 7 | 7 | 6 | 5 |
| 120 | 3 | 2 | 2 | 3 | 4 | 5 | 6 | 5 | 5 | 5 | 6 | 6 | 6 | 8 | 7 | 6 | 6 | 7 | 7 | 7 | 7 | 7 | 7 | 6 | 5 |
| 130 | 3 | 2 | 2 | 2 | 4 | 5 | 6 | 6 | 5 | 5 | 6 | 6 | 6 | 6 | 8 | 6 | 6 | 6 | 7 | 7 | 8 | 7 | 6 | 6 | 5 |
| 140 | 3 | 2 | 2 | 2 | 5 | 5 | 6 | 6 | 5 | 5 | 6 | 6 | 6 | 8 | 6 | 6 | 6 | 6 | 7 | 7 | 7 | 7 | 6 | 5 | 5 |
| 150 | 2 | 2 | 2 | 2 | 5 | 6 | 6 | 6 | 5 | 5 | 6 | 6 | 6 | 8 | 6 | 6 | 6 | 6 | 6 | 7 | 7 | 6 | 6 | 5 | 5 |
| 160 | 2 | 1 | 1 | 2 | 5 | 6 | 6 | 6 | 5 | 5 | 6 | 6 | 6 | 6 | 6 | 6 | 6 | 6 | 6 | 7 | 7 | 6 | 6 | 5 | 5 |
| 170 | 2 | 2 | 2 | 2 | 5 | 6 | 7 | 6 | 5 | 5 | 6 | 6 | 6 | 7 | 6 | 6 | 6 | 6 | 6 | 7 | 7 | 6 | 6 | 5 | 5 |
| 180 | 2 | 2 | 2 | 2 | 5 | 6 | 6 | 6 | 5 | 5 | 6 | 6 | 6 | 6 | 6 | 6 | 6 | 6 | 6 | 7 | 8 | 7 | 6 | 5 | 5 |
| 190 | 2 | 2 | 2 | 3 | 5 | 6 | 6 | 6 | 5 | 5 | 6 | 6 | 6 | 7 | 6 | 6 | 6 | 6 | 7 | 8 | 7 | 7 | 6 | 5 | 5 |
| 200 | 2 | 2 | 2 | 3 | 5 | 6 | 6 | 6 | 5 | 5 | 6 | 6 | 6 | 7 | 7 | 6 | 6 | 6 | 7 | 7 | 7 | 6 | 6 | 5 | 5 |
| 210 | 2 | 2 | 2 | 3 | 5 | 6 | 6 | 6 | 5 | 5 | 6 | 6 | 6 | 7 | 6 | 6 | 6 | 6 | 7 | 7 | 7 | 6 | 6 | 5 | 5 |
| 220 | 2 | 2 | 3 | 4 | 5 | 6 | 6 | 6 | 5 | 5 | 6 | 6 | 6 | 8 | 7 | 6 | 6 | 6 | 7 | 7 | 7 | 6 | 6 | 5 | 5 |
| 230 | 2 | 2 | 3 | 4 | 5 | 6 | 6 | 6 | 5 | 5 | 6 | 5 | 6 | 9 | 7 | 6 | 6 | 6 | 6 | 7 | 6 | 6 | 5 | 5 | 5 |
| 240 | 2 | 2 | 3 | 4 | 5 | 6 | 6 | 5 | 5 | 5 | 6 | 6 | 7 | 8 | 7 | 6 | 6 | 6 | 6 | 6 | 6 | 6 | 5 | 5 | 5 |
| 250 | 2 | 2 | 2 | 3 | 5 | 5 | 6 | 6 | 5 | 5 | 5 | 5 | 5 | 7 | 6 | 6 | 5 | 5 | 5 | 5 | 5 | 5 | 5 | 5 | 5 |

| REFLECTANCE(%) | |
|---|---|
| 0.000-0.025 | :1 |
| 0.025-0.050 | :2 |
| 0.050-0.075 | :3 |
| 0.075-0.100 | :4 |
| 0.100-0.250 | :5 |
| 0.250-0.400 | :6 |
| 0.400-0.550 | :7 |
| 0.550-0.700 | :8 |
| 0.700-0.850 | :9 |
| 0.850-1.000 | :10 |
| 1.000- | :11 |

| UPPER LAYER FILM THICKNESS(nm) / LOWER LAYER FILM THICKNESS(nm) | 10 | 20 | 30 | 40 | 50 | 60 | 70 | 80 | 90 | 100 | 110 | 120 | 130 | 140 | 150 | 160 | 170 | 180 | 190 | 200 | 210 | 220 | 230 | 240 | 250 |
|---|---|---|---|---|---|---|---|---|---|---|---|---|---|---|---|---|---|---|---|---|---|---|---|---|---|
| 10  | 9 | 4 | 3 | 5 | 5 | 6 | 9 | 7 | 6 | 5 | 5 | 6 | 5 | 5 | 6 | 6 | 7 | 6 | 5 | 5 | 6 | 6 | 6 | 6 | 6 |
| 20  | 7 | 1 | 2 | 3 | 5 | 5 | 5 | 7 | 6 | 6 | 5 | 5 | 5 | 5 | 6 | 6 | 8 | 6 | 5 | 5 | 6 | 6 | 6 | 7 | 6 |
| 30  | 6 | 2 | 1 | 2 | 4 | 5 | 6 | 7 | 5 | 5 | 5 | 5 | 5 | 5 | 6 | 6 | 7 | 6 | 5 | 6 | 6 | 6 | 6 | 6 | 5 |
| 40  | 5 | 3 | 1 | 2 | 4 | 4 | 7 | 6 | 5 | 5 | 5 | 6 | 6 | 6 | 7 | 6 | 7 | 6 | 6 | 6 | 6 | 6 | 6 | 7 | 6 |
| 50  | 5 | 4 | 2 | 2 | 4 | 5 | 7 | 6 | 5 | 6 | 6 | 6 | 6 | 6 | 7 | 7 | 7 | 7 | 6 | 6 | 6 | 6 | 6 | 6 | 6 |
| 60  | 5 | 3 | 2 | 3 | 4 | 5 | 7 | 6 | 5 | 6 | 6 | 6 | 6 | 6 | 8 | 7 | 7 | 6 | 6 | 6 | 6 | 6 | 6 | 7 | 6 |
| 70  | 5 | 2 | 3 | 4 | 5 | 5 | 8 | 6 | 5 | 6 | 6 | 6 | 6 | 6 | 7 | 7 | 7 | 6 | 6 | 6 | 7 | 6 | 6 | 7 | 5 |
| 80  | 5 | 3 | 2 | 4 | 5 | 6 | 7 | 6 | 6 | 6 | 6 | 6 | 6 | 6 | 8 | 8 | 7 | 7 | 6 | 6 | 6 | 6 | 6 | 8 | 5 |
| 90  | 5 | 3 | 3 | 4 | 5 | 6 | 7 | 6 | 6 | 6 | 7 | 6 | 6 | 6 | 8 | 7 | 7 | 6 | 6 | 6 | 6 | 6 | 6 | 7 | 6 |
| 100 | 5 | 3 | 3 | 4 | 5 | 6 | 7 | 7 | 6 | 6 | 7 | 6 | 6 | 6 | 9 | 8 | 7 | 6 | 6 | 6 | 6 | 6 | 7 | 6 | 5 |
| 110 | 5 | 3 | 3 | 4 | 5 | 6 | 8 | 7 | 6 | 7 | 7 | 7 | 6 | 7 | 10 | 10 | 8 | 7 | 6 | 6 | 6 | 6 | 7 | 6 | 5 |
| 120 | 5 | 4 | 3 | 4 | 5 | 6 | 8 | 7 | 7 | 7 | 8 | 7 | 7 | 7 | 9 | 9 | 7 | 6 | 6 | 6 | 6 | 6 | 7 | 6 | 5 |
| 130 | 5 | 3 | 3 | 4 | 5 | 6 | 9 | 8 | 7 | 7 | 10 | 8 | 7 | 8 | 8 | 8 | 7 | 6 | 6 | 6 | 6 | 6 | 7 | 6 | 5 |
| 140 | 5 | 3 | 3 | 5 | 5 | 7 | 9 | 7 | 7 | 7 | 10 | 8 | 7 | 7 | 7 | 7 | 6 | 6 | 6 | 6 | 6 | 6 | 6 | 6 | 5 |
| 150 | 5 | 3 | 3 | 4 | 5 | 6 | 9 | 7 | 6 | 6 | 10 | 9 | 7 | 7 | 8 | 7 | 6 | 6 | 6 | 6 | 6 | 6 | 6 | 6 | 5 |
| 160 | 4 | 4 | 3 | 5 | 5 | 7 | 10 | 8 | 6 | 6 | 10 | 10 | 8 | 7 | 7 | 6 | 6 | 6 | 5 | 6 | 6 | 6 | 6 | 5 | 5 |
| 170 | 3 | 4 | 4 | 5 | 6 | 7 | 8 | 8 | 6 | 7 | 10 | 9 | 8 | 7 | 7 | 6 | 6 | 5 | 5 | 6 | 6 | 6 | 5 | 5 | 5 |
| 180 | 3 | 4 | 4 | 5 | 5 | 7 | 7 | 7 | 6 | 6 | 9 | 8 | 8 | 7 | 6 | 6 | 5 | 5 | 5 | 5 | 6 | 6 | 5 | 5 | 5 |
| 190 | 4 | 4 | 4 | 5 | 5 | 6 | 9 | 7 | 6 | 6 | 8 | 7 | 7 | 7 | 6 | 6 | 6 | 6 | 6 | 6 | 6 | 6 | 5 | 6 | 5 |
| 200 | 4 | 3 | 4 | 5 | 5 | 6 | 9 | 8 | 6 | 6 | 7 | 7 | 7 | 7 | 6 | 6 | 6 | 6 | 6 | 6 | 6 | 6 | 6 | 6 | 5 |
| 210 | 4 | 3 | 3 | 5 | 5 | 6 | 10 | 7 | 6 | 6 | 7 | 7 | 7 | 6 | 6 | 6 | 6 | 6 | 6 | 6 | 6 | 6 | 6 | 6 | 5 |
| 220 | 3 | 3 | 4 | 4 | 5 | 7 | 9 | 6 | 6 | 6 | 7 | 7 | 7 | 6 | 6 | 6 | 6 | 6 | 6 | 6 | 6 | 6 | 5 | 5 | 5 |
| 230 | 3 | 3 | 4 | 5 | 5 | 7 | 8 | 6 | 6 | 6 | 7 | 6 | 7 | 6 | 6 | 6 | 6 | 6 | 6 | 6 | 6 | 6 | 5 | 6 | 5 |
| 240 | 3 | 3 | 4 | 5 | 5 | 6 | 7 | 6 | 6 | 6 | 6 | 6 | 6 | 6 | 6 | 6 | 6 | 5 | 5 | 6 | 6 | 6 | 5 | 5 | 5 |
| 250 | 3 | 3 | 3 | 4 | 5 | 6 | 7 | 6 | 6 | 6 | 6 | 6 | 5 | 5 | 6 | 6 | 6 | 6 | 5 | 5 | 5 | 5 | 5 | 5 | 5 |

| UPPER LAYER FILM THICKNESS [nm] / LOWER LAYER FILM THICKNESS [nm] | 10 | 20 | 30 | 40 | 50 | 60 | 70 | 80 | 90 | 100 | 110 | 120 | 130 | 140 | 150 | 160 | 170 | 180 | 190 | 200 | 210 | 220 | 230 | 240 | 250 |
|---|---|---|---|---|---|---|---|---|---|---|---|---|---|---|---|---|---|---|---|---|---|---|---|---|---|
| 10 | 11 | 5 | 5 | 5 | 5 | 6 | 6 | 8 | 10 | 8 | 7 | 6 | 6 | 7 | 7 | 7 | 8 | 7 | 6 | 6 | 6 | 6 | 6 | 6 | 6 |
| 20 | 9 | 2 | 3 | 5 | 5 | 5 | 6 | 10 | 8 | 7 | 6 | 6 | 6 | 7 | 8 | 10 | 8 | 7 | 6 | 6 | 6 | 6 | 6 | 6 | 7 |
| 30 | 8 | 3 | 2 | 4 | 5 | 6 | 7 | 9 | 7 | 7 | 6 | 6 | 6 | 8 | 8 | 9 | 8 | 7 | 6 | 6 | 6 | 6 | 6 | 7 | 7 |
| 40 | 6 | 5 | 3 | 4 | 5 | 6 | 7 | 8 | 7 | 7 | 6 | 6 | 7 | 8 | 8 | 9 | 8 | 6 | 6 | 6 | 6 | 6 | 6 | 7 | 7 |
| 50 | 6 | 5 | 4 | 4 | 5 | 6 | 7 | 8 | 8 | 7 | 6 | 6 | 8 | 8 | 9 | 10 | 8 | 6 | 6 | 6 | 6 | 6 | 7 | 7 | 7 |
| 60 | 6 | 5 | 4 | 5 | 5 | 6 | 7 | 9 | 8 | 8 | 7 | 8 | 8 | 9 | 9 | 11 | 8 | 7 | 6 | 6 | 7 | 6 | 7 | 7 | 8 |
| 70 | 7 | 5 | 5 | 5 | 5 | 6 | 6 | 9 | 8 | 8 | 7 | 8 | 9 | 9 | 9 | 10 | 7 | 6 | 6 | 6 | 6 | 6 | 7 | 7 | 8 |
| 80 | 7 | 5 | 5 | 5 | 5 | 6 | 7 | 10 | 9 | 8 | 8 | 8 | 8 | 9 | 9 | 9 | 7 | 6 | 6 | 6 | 6 | 6 | 6 | 7 | 8 |
| 90 | 6 | 5 | 5 | 5 | 5 | 6 | 7 | 11 | 10 | 8 | 8 | 8 | 8 | 8 | 9 | 8 | 7 | 6 | 6 | 6 | 6 | 6 | 6 | 7 | 7 |
| 100 | 5 | 5 | 5 | 5 | 6 | 7 | 7 | 11 | 10 | 8 | 8 | 8 | 8 | 8 | 9 | 8 | 7 | 6 | 6 | 6 | 6 | 6 | 6 | 7 | 7 |
| 110 | 5 | 5 | 5 | 5 | 6 | 7 | 7 | 11 | 11 | 9 | 9 | 9 | 8 | 8 | 8 | 8 | 7 | 6 | 6 | 6 | 6 | 6 | 6 | 7 | 7 |
| 120 | 5 | 5 | 5 | 5 | 6 | 7 | 7 | 11 | 11 | 10 | 10 | 9 | 8 | 8 | 8 | 8 | 7 | 6 | 6 | 6 | 6 | 6 | 6 | 7 | 8 |
| 130 | 5 | 5 | 5 | 5 | 6 | 7 | 7 | 11 | 11 | 11 | 10 | 9 | 8 | 7 | 7 | 7 | 6 | 6 | 6 | 6 | 6 | 6 | 6 | 7 | 7 |
| 140 | 5 | 5 | 5 | 5 | 6 | 7 | 8 | 11 | 11 | 10 | 9 | 8 | 7 | 7 | 7 | 7 | 6 | 6 | 6 | 6 | 6 | 6 | 7 | 8 | 7 |
| 150 | 5 | 5 | 5 | 5 | 6 | 7 | 9 | 11 | 11 | 10 | 9 | 8 | 8 | 8 | 8 | 7 | 7 | 6 | 6 | 6 | 6 | 6 | 7 | 7 | 7 |
| 160 | 5 | 5 | 5 | 5 | 6 | 7 | 9 | 11 | 10 | 9 | 8 | 7 | 7 | 7 | 7 | 7 | 6 | 6 | 6 | 6 | 6 | 6 | 6 | 7 | 7 |
| 170 | 5 | 5 | 5 | 5 | 6 | 7 | 11 | 10 | 9 | 8 | 8 | 8 | 7 | 7 | 7 | 7 | 7 | 6 | 6 | 6 | 6 | 6 | 6 | 6 | 7 |
| 180 | 5 | 5 | 5 | 5 | 6 | 8 | 11 | 10 | 8 | 8 | 7 | 7 | 7 | 7 | 7 | 7 | 6 | 6 | 6 | 6 | 6 | 6 | 6 | 6 | 6 |
| 190 | 5 | 5 | 5 | 5 | 6 | 7 | 11 | 10 | 9 | 8 | 7 | 7 | 7 | 7 | 7 | 7 | 7 | 6 | 6 | 6 | 6 | 6 | 6 | 6 | 6 |
| 200 | 5 | 5 | 5 | 6 | 6 | 7 | 9 | 10 | 8 | 7 | 6 | 7 | 7 | 7 | 7 | 7 | 6 | 6 | 6 | 6 | 6 | 6 | 6 | 6 | 6 |
| 210 | 4 | 5 | 5 | 5 | 5 | 6 | 8 | 9 | 7 | 6 | 6 | 6 | 7 | 7 | 7 | 6 | 6 | 6 | 6 | 6 | 6 | 6 | 6 | 6 | 6 |
| 220 | 4 | 4 | 5 | 5 | 6 | 6 | 11 | 8 | 7 | 6 | 6 | 7 | 7 | 7 | 6 | 6 | 6 | 6 | 6 | 6 | 6 | 6 | 6 | 5 | 6 |
| 230 | 4 | 4 | 5 | 5 | 5 | 7 | 10 | 8 | 7 | 7 | 7 | 7 | 6 | 6 | 6 | 6 | 6 | 6 | 6 | 6 | 6 | 6 | 6 | 5 | 6 |
| 240 | 4 | 5 | 5 | 5 | 6 | 6 | 11 | 9 | 8 | 7 | 7 | 6 | 6 | 6 | 6 | 8 | 7 | 6 | 6 | 6 | 5 | 5 | 5 | 5 | 6 |
| 250 | 5 | 4 | 5 | 5 | 5 | 6 | 8 | 9 | 7 | 7 | 6 | 6 | 6 | 6 | 6 | 7 | 7 | 6 | 5 | 5 | 5 | 5 | 5 | 5 | 6 |

| REFLECTANCE (%) | |
|---|---|
| 0.000–0.025 | :1 |
| 0.025–0.050 | :2 |
| 0.050–0.075 | :3 |
| 0.075–0.100 | :4 |
| 0.100–0.250 | :5 |
| 0.250–0.400 | :6 |
| 0.400–0.550 | :7 |
| 0.550–0.700 | :8 |
| 0.700–0.850 | :9 |
| 0.850–1.000 | :10 |
| 1.000– | :11 |

FIG. 5

ANTIREFLECTION FILM AND EXPOSURE METHOD

CROSS REFERENCES TO RELATED APPLICATIONS

The present invention contains subject matter related to Japanese Patent Application JP 2005-054202 filed in the Japanese Patent Office on Feb. 28, 2005, the entire contents of which being incorporated herein by reference.

BACKGROUND OF THE INVENTION

This invention relates to an antireflection film which is used for exposure of a resist film in a fabrication process of a semiconductor device and an exposure-method in which an antireflection film is used.

In the field of semiconductor devices, together with the advancement of high integration of semiconductor devices, it has become a pressing need to establish a new process technique which permits working of very fine patterns of, for example, 65 nm or less. For the working of fine patterns, a photolithography technique is required essentially. The photolithography technique at present uses an argon-fluorine (ArF) excimer laser of the wavelength of 193 nm as an exposure light source in order to assure an enhanced optical resolution thanks to a reduced wavelength of exposure light (illumination light) so as to be ready for very fine working.

A silicon semiconductor substrate is patterned usually using a photosensitive resist layer formed by coating on the surface of the silicon semiconductor substrate. However, where the reflectance of exposure light (illumination light) at the interface between the resist layer and the silicon semiconductor substrate which serves as a substrate for the resist layer is high, a standing wave is induced conspicuously in the resist layer. As a result, side faces of the resist layer patterned by development exhibit a concave and convex shape in accordance with the shape of the standing wave. Therefore, there is a problem that a pattern of a good rectangular shape cannot be formed on the resist layer. It is to be noted that a pattern formed on a resist layer is sometimes called resist pattern. For example, the reflectance where a resist layer having a refractive index of 1.70 is formed on the surface of a silicon semiconductor substrate using exposure light of a wavelength of 193 nm is a very high value of approximately 60% where the exposure light is incident perpendicularly to the resist layer.

In order to solve such a problem as described above, according to a conventional photolithography technique wherein exposure light of a wavelength of 193 nm is used, an antireflection film of a single layer is formed between the silicon semiconductor substrate and the resist layer. For example, where the complex refractive index is represented by $N_0$ (where $N_0 = n_0 - k_0 i$), if an antireflection film of a thickness of 100 nm having such values as $n_0 = 1.75$ and $k_0 = 0.30$ is formed on the silicon semiconductor substrate and a resist layer having a refractive index of 1.70 is formed on the antireflection film, then the reflectance is reduced by a great amount to approximately 2% where the exposure light is incident perpendicularly to the resist layer.

A related technique is disclosed, for example, in Japanese Patent Laid-open No. 2001-242630 (hereinafter referred to as Patent Document 1) or Boontarika, Ozawa and Someya, Extended Abstracts (The 65th Meeting2004); The Japan Society of Applied Physics, 2p-R-9 (hereinafter referred to as Non-Patent Document 1).

SUMMARY OF THE INVENTION

Incidentally, the critical resolution in the photography technique is approximately equal to 0.3 times the wavelength of exposure light. Accordingly, in a photolithography technique wherein an ArF excimer laser of a wavelength of 193 nm is used as an exposure light source, the critical resolution is approximately 60 nm.

Thus, development of a liquid immersion lithography technique which achieves a further high resolution is being proceeded as a technique for forming a pattern finer than approximately 60 nm on a silicon semiconductor substrate. According to the liquid immersion lithography technique, a medium having a refractive index higher than that of air (for example, immersion liquid formed from water) is filled between an exposure system (illumination system) and a resist layer.

Since the exposure is performed through the immersion liquid, the effective wavelength of the exposure light becomes equal to a value obtained by dividing the wavelength of the exposure light in the vacuum by the refractive index of the immersion liquid, and a higher resolution performance can be achieved. For example, where an ArF excimer laser of a wavelength of 193 nm is used as the exposure light source and water (whose refractive index at the wavelength of 193 nm is 1.44) is used as the immersion liquid, the effective wavelength is approximately 134 nm, and the critical resolution is obtained by multiplying the effective wavelength by 0.3 and is approximately 40 nm. In other words, the liquid immersion lithography wherein water is used allows formation of a pattern finer than approximately 60 nm to be formed on a silicon semiconductor substrate.

Meanwhile, the focus tolerance, i.e., depth of focus (DOF), upon exposure is given by the following expression:

$$DOF = n_{Liq} \cdot K_2 \cdot \lambda / NA^2$$

where $n_{Liq}$ is the refractive index of the immersion liquid, $K_2$ a constant which relies upon the process, $\lambda$ the wavelength of exposure light (illumination light) in the vacuum, and NA the numerical aperture of the exposure system (illumination system).

Accordingly, where the numerical aperture NA is fixed, the focus tolerance DOF in the liquid immersion lithography technique is equal to $n_{Liq}$ times that in the conventional photolithography technique which relies upon exposure in air. In other words, in the liquid immersion lithography technique wherein water is used as the immersion liquid, the focus tolerance DOF increases to 1.44 times. Therefore, a mass production process having a greater margin can be constructed.

However, such a liquid immersion lithography technique as described above has a problem that the single layer antireflection film in the prior art does not function effectively.

Exposure light is transmitted through an incidence medium and enters the resist layer and further enters the antireflection film. Where the incident angle when the exposure light enters the resist layer from the incidence medium is represented by $\theta_{in}$, the refractive index of the incidence medium by $n_{in}$, the incident angle when the exposure light enters the silicon semiconductor substrate or the antireflection film from the resist layer by $\theta_{IF}$ and the refractive index of a resist material which forms the resist layer by $n_{Res}$, the following expression is satisfied:

$$NA = n_{in} \cdot \sin(\theta_{in}) = n_{Res} \cdot \sin(\theta_{IF})$$

It is to be noted that, in the conventional photolithography technique, since the incidence medium is air, the refractive index $n_{in}$ is $n_{in}=1$, but in the liquid immersion lithography, for example, where water is used as the immersion liquid, since the incidence medium is water, the refractive index $n_{in}$ is $n_{in}=1.44$.

From the expression above, it can be recognized that, where $\theta_{in}$ is fixed, the numerical aperture NA according to the liquid immersion lithography technique increases to $n_{Liq}$ times that according to the conventional photolithography technique ($n_{in}=1.0$). In other words, if the refractive index $n_{Res}$ of the resist material from which the resist layer is formed is fixed, then $\sin(\theta_{IF})$ increases. This signifies that $\theta_{IF}$ increases with the liquid immersion lithography technique. In other words, it is considered that, according to the liquid immersion lithography technique, the exposure light enters in a more oblique direction when compared with that according to the conventional photolithography technique.

On the other hand, where an antireflection film of a single layer is used, the reflectance when exposure light enters perpendicularly can be decreased sufficiently. However, there is a problem that the reflectance in oblique incidence of exposure light cannot be reduced sufficiently.

Where an antireflection film of a thickness of 100 nm having a complex reflectance $N_0$ having such values as $n_0=1.75$ and $k_0=0.30$ is formed on the surface of a silicon semiconductor substrate and a resist layer having a refractive index of 1.70 is formed on the antireflection film, the reflectance where the exposure light enters perpendicularly (that is, the incident angle $\theta_{IF}=0$ degree) decreases significantly to approximately 2%. Accordingly, where the incident angle $\theta_{IF}$ increases to 55 degrees, the reflectance increases much to approximately 7%.

Meanwhile, as a result of the progress of refinement, the maximum tolerance to the reflectance at the interface between the resist layer and the silicon semiconductor substrate has decreased year by year, and particularly the maximum tolerance to the reflectance in such a fine generation as that wherein a liquid immersion lithography technique is applied is as low as 0.4% as disclosed in Non-Patent Document 1.

In particular, an antireflection film of a single layer used in the conventional photolithography technique cannot reduce the reflectance sufficiently in the liquid immersion lithography technique also because the exposure light enters further obliquely. Further, since the reflectance cannot be reduced sufficiently, the problem that a good rectangular pattern cannot be formed on the resist layer cannot be solved because a standing wave appears significantly in the resist layer.

Accordingly, it is desirable for the present invention to provide an antireflection film wherein, even where exposure light (illumination light) enters a resist layer obliquely in a photolithography technique such as a liquid immersion lithography technique wherein an exposure system (illumination system) has an increased numerical aperture to achieve an increased focus tolerance, a sufficiently reduced reflectance can be achieved at the interface between the resist layer and a silicon semiconductor substrate and an exposure method which uses the antireflection film.

In order to attain the desire described above, according to a first embodiment of the present invention, there is provided an antireflection film having a two-layer structure and formed between a resist layer and a surface of a silicon semiconductor substrate for being used when the resist layer is exposed by an exposure system which is used in a fabrication process of a semiconductor device and has a wavelength of 190 nm to 195 nm and a numerical aperture equal to or less than 1.0. Further, according to the first embodiment of the present invention, there is provided an exposure method for exposing a resist layer by means of an exposure system which is used in a fabrication process of a semiconductor device and has a wavelength of 190 nm to 195 nm and a numerical aperture equal to or less than 1.0, an antireflection film which has a two-layer structure being formed between the resist layer and a surface of a silicon semiconductor substrate.

The antireflection film and the exposure method according to the first embodiment are configured such that the antireflection film includes an upper layer having a complex refractive index $N_1$ equal to $n_1-k_1 i$ and a film thickness $d_1$ whose unit is nm, and a lower layer having a complex refractive index $N_2$ equal to $n_2-k_2 i$ and a film thickness $d_2$ whose unit is nm, the upper layer and the lower layer being configured such that, when one of cases [1-01] to [1-16] defined in a table given below is selected as a combination of values of [$n_{10}$, $k_{10}$, $d_{10}$, $n_{20}$, $k_{20}$, $d_{20}$], $n_1$, $k_1$, $d_1$, $n_2$, $k_2$ and $d_2$ satisfy an expression $$\{(n_1-n_{10})/(n_{1m}-n_{10})\}^2 + \{(k_1-k_{10})/(k_{1m}-k_{10})\}^2 + \{(d_1-d_{10})/(d_{1m}-d_{10})\}^2 + \{(n_2-n_{20})/(n_{2m}-n_{20})\}^2 + \{(k_2-k_{20})/(k_{2m}-k_{20})\}^2 + \{(d_2-d_{20})/(d_{2m}-d_{20})\}^2 \leq 1$$

where a value of $n_{1m}$ in the pertaining case is adopted between on a relationship in magnitude between $n_1$ and $n_{10}$, a value of $k_{1m}$ in the pertaining case is adopted between on a relationship in magnitude between $k_1$ and $k_{10}$, a value of $d_{1m}$ in the pertaining case is adopted between on a relationship in magnitude between $d_1$ and $d_{10}$, a value of $n_{2m}$ in the pertaining case is adopted between on a relationship in magnitude between $n_2$ and $n_{20}$, a value of $k_{2m}$ in the pertaining case is adopted between on a relationship in magnitude between $k_2$ and $k_{20}$, and a value of $d_{2m}$ in the pertaining case is adopted between on a relationship in magnitude between $d_2$ and $d_{20}$.

| | Case | | | | |
|---|---|---|---|---|---|
| | 1-01 | 1-02 | 1-03 | 1-04 | 1-05 |
| $n_{10}$ | 2.1616 | 1.9575 | 1.8783 | 1.8886 | 1.7671 |
| $k_{10}$ | 0.0031 | 0.1578 | 0.1120 | 0.0828 | 0.0972 |
| $d_{10}$(nm) | 16.39 | 29.70 | 22.79 | 17.43 | 89.65 |
| $n_{20}$ | 2.3326 | 3.1421 | 1.9535 | 1.8540 | 1.7266 |
| $k_{20}$ | 0.9955 | 0.5540 | 0.3987 | 0.3157 | 0.6265 |
| $d_{20}$(nm) | 21.81 | 39.99 | 133.42 | 201.01 | 35.79 |
| for $n_1 \geq n_{10}$, $n_{1m} =$ | 2.2660 | 2.0526 | 1.9695 | 1.9914 | 1.8452 |
| for $n_1 < n_{10}$, $n_{1m} =$ | 2.0674 | 1.8816 | 1.8041 | 1.8047 | 1.7221 |
| for $k_1 \geq k_{10}$, $k_{1m} =$ | 0.1058 | 0.2476 | 0.1956 | 0.1790 | 0.1791 |
| for $k_1 < k_{10}$, $k_{1m} =$ | 0.0000 | 0.0772 | 0.0266 | 0.0000 | 0.0475 |

-continued

|  | | | | | |
|---|---|---|---|---|---|
| for $d_1 \geq d_{10}$, $d_{1m}$(nm) = | 19.64 | 35.17 | 31.59 | 26.35 | 108.00 |
| for $d_1 < d_{10}$, $d_{1m}$(nm) = | 13.49 | 25.28 | 16.46 | 11.04 | 81.48 |
| for $n_2 \geq n_{20}$, $n_{2m}$ = | 2.4717 | 3.2954 | 2.1133 | 2.0045 | 1.8644 |
| for $n_2 < n_{20}$, $n_{2m}$ = | 2.1929 | 2.9698 | 1.7768 | 1.6777 | 1.5730 |
| for $k_2 \geq k_{20}$, $k_{2m}$ = | 1.1482 | 0.7497 | 0.6196 | 0.4975 | 0.7644 |
| for $k_2 < k_{20}$, $k_{2m}$ = | 0.8579 | 0.4177 | 0.2781 | 0.2069 | 0.4915 |
| for $d_2 \geq d_{20}$, $d_{2m}$(nm) = | 25.55 | 42.99 | ∞ | ∞ | 43.06 |
| for $d_2 < d_{20}$, $d_{2m}$(nm) = | 18.70 | 37.27 | 75.37 | 118.11 | 29.14 |

| | Case | | | | |
|---|---|---|---|---|---|
| | 1-06 | 1-07 | 1-08 | 1-09 | 1-10 |
| $n_{10}$ | 1.7783 | 1.7756 | 1.7637 | 1.7297 | 1.7402 |
| $k_{10}$ | 0.0854 | 0.0827 | 0.0788 | 0.0695 | 0.0705 |
| $d_{10}$(nm) | 90.09 | 89.16 | 88.60 | 159.09 | 157.00 |
| $n_{20}$ | 1.9451 | 1.8813 | 1.8074 | 1.8027 | 1.9115 |
| $k_{20}$ | 0.4110 | 0.2980 | 0.2358 | 0.6176 | 0.3647 |
| $d_{20}$(nm) | 78.70 | 136.86 | 201.53 | 30.94 | 79.38 |
| for $n_1 \geq n_{10}$, $n_{1m}$ = | 1.8547 | 1.8491 | 1.8363 | 1.8086 | 1.8145 |
| for $n_1 < n_{10}$, $n_{1m}$ = | 1.7290 | 1.7286 | 1.7192 | 1.6900 | 1.6996 |
| for $k_1 \geq k_{10}$, $k_{1m}$ = | 0.1675 | 0.1627 | 0.1158 | 0.1537 | 0.1529 |
| for $k_1 < k_{10}$, $k_{1m}$ = | 0.0321 | 0.0280 | 0.0215 | 0.0304 | 0.0296 |
| for $d_1 \geq d_{10}$, $d_{1m}$(nm) = | 108.98 | 109.36 | 112.80 | ∞ | 193.81 |
| for $d_1 < d_{10}$, $d_{1m}$(nm) = | 80.83 | 80.19 | 79.23 | 146.42 | 145.32 |
| for $n_2 \geq n_{20}$, $n_{2m}$ = | 2.0858 | 2.0287 | 1.9635 | 1.9536 | 2.0439 |
| for $n_2 < n_{20}$, $n_{2m}$ = | 1.7991 | 1.7335 | 1.6573 | 1.6453 | 1.7648 |
| for $k_2 \geq k_{20}$, $k_{2m}$ = | 0.5849 | 0.5031 | 0.4587 | 0.7451 | 0.5149 |
| for $k_2 < k_{20}$, $k_{2m}$ = | 0.2966 | 0.2049 | 0.1553 | 0.4826 | 0.2558 |
| for $d_2 \geq d_{20}$, $d_{2m}$(nm) = | 90.20 | ∞ | ∞ | 36.88 | 89.13 |
| for $d_2 < d_{20}$, $d_{2m}$(nm) = | 68.53 | 118.11 | 131.91 | 25.32 | 69.56 |

| | Case | | | | |
|---|---|---|---|---|---|
| | 1-11 | 1-12 | 1-13 | 1-14 | 1-15 |
| $n_{10}$ | 1.7416 | 1.7346 | 1.7204 | 1.7293 | 1.7290 |
| $k_{10}$ | 0.0723 | 0.0700 | 0.0573 | 0.0638 | 0.0672 |
| $d_{10}$(nm) | 154.81 | 154.48 | 226.55 | 221.51 | 219.00 |
| $n_{20}$ | 1.8276 | 1.7635 | 1.9505 | 1.9167 | 1.7992 |
| $k_{20}$ | 0.2602 | 0.2082 | 0.6496 | 0.3426 | 0.2416 |
| $d_{20}$(nm) | 140.99 | 205.63 | 25.08 | 78.00 | 142.68 |
| for $n_1 \geq n_{10}$, $n_{1m}$ = | 1.8128 | 1.8044 | 1.8037 | 1.8053 | 1.8030 |
| for $n_1 < n_{10}$, $n_{1m}$ = | 1.7051 | 1.7002 | 1.6700 | 1.6857 | 1.6894 |
| for $k_1 \geq k_{10}$, $k_{1m}$ = | 0.1493 | 0.1428 | 0.1449 | 0.1450 | 0.1411 |
| for $k_1 < k_{10}$, $k_{1m}$ = | 0.0310 | 0.0277 | 0.0218 | 0.0296 | 0.0354 |
| for $d_1 \geq d_{10}$, $d_{1m}$(nm) = | 194.11 | ∞ | ∞ | ∞ | ∞ |
| for $d_1 < d_{10}$, $d_{1m}$(nm) = | 144.88 | 144.10 | 147.03 | 206.52 | 206.86 |
| for $n_2 \geq n_{20}$, $n_{2m}$ = | 1.9727 | 1.9440 | 2.1270 | 2.0463 | 1.9388 |
| for $n_2 < n_{20}$, $n_{2m}$ = | 1.6802 | 1.6149 | 1.7784 | 1.7598 | 1.6376 |
| for $k_2 \geq k_{20}$, $k_{2m}$ = | 0.1493 | 0.4167 | 0.7867 | 0.4807 | 0.4185 |
| for $k_2 < k_{20}$, $k_{2m}$ = | 0.0310 | 0.1340 | 0.4991 | 0.2325 | 0.1559 |
| for $d_2 \geq d_{20}$, $d_{2m}$(nm) = | ∞ | ∞ | 30.06 | 87.34 | ∞ |
| for $d_2 < d_{20}$, $d_{2m}$(nm) = | 126.07 | 175.09 | 20.53 | 70.06 | 130.30 |

| | Case 1-16 |
|---|---|
| $n_{10}$ | 1.7210 |
| $k_{10}$ | 0.0630 |
| $d_{10}$(nm) | 220.18 |
| $n_{20}$ | 1.7329 |
| $k_{20}$ | 0.1973 |
| $d_{20}$(nm) | 207.16 |
| for $n_1 \geq n_{10}$, $n_{1m}$ = | 1.7917 |
| for $n_1 < n_{10}$, $n_{1m}$ = | 1.6626 |
| for $k_1 \geq k_{10}$, $k_{1m}$ = | 0.1377 |
| for $k_1 < k_{10}$, $k_{1m}$ = | 0.0303 |
| for $d_1 \geq d_{10}$, $d_{1m}$(nm) = | ∞ |
| for $d_1 < d_{10}$, $d_{1m}$(nm) = | 147.71 |
| for $n_2 \geq n_{20}$, $n_{2m}$ = | 1.9597 |
| for $n_2 < n_{20}$, $n_{2m}$ = | 1.5656 |
| for $k_2 \geq k_{20}$, $k_{2m}$ = | 0.3989 |
| for $k_2 < k_{20}$, $k_{2m}$ = | 0.1211 |
| for $d_2 \geq d_{20}$, $d_{2m}$(nm) = | ∞ |
| for $d_2 < d_{20}$, $d_{2m}$(nm) = | 174.03 |

According to a second embodiment of the present invention, there is provided an antireflection film having a two-layer structure and formed between a resist layer and a surface of a silicon semiconductor substrate for being used when the resist layer is exposed by an exposure system which is used in a fabrication process of a semiconductor device and has a wavelength of 190 nm to 195 nm and a numerical aperture more than 1.0 but equal to or less than 1.1. Further, according to the second embodiment of the present invention, there is provided an exposure method for exposing a resist layer by means of an exposure system which is used in a fabrication process of a semiconductor device and has a wavelength of 190 nm to 195 nm and a numerical aperture more than 1.0 but equal to or less than 1.1, an antireflection film which has a two-layer structure being formed between the resist layer and a surface of a silicon semiconductor substrate.

The antireflection film and the exposure method according to the second embodiment are configured such that an upper layer having a complex refractive index $N_1$ equal to $n_1-k_1 i$ and a film thickness $d_1$ whose unit is nm, and a lower layer having a complex refractive index $N_2$ equal to $n_2-k_2 i$ and a film thickness $d_2$ whose unit is nm, the upper layer and the lower layer being configured such that, when one of cases [2-01] to [2-16] defined in a table given below is selected as a combination of values of $[n_{10}, k_{10}, d_{10}, n_{20}, k_{20}, d_{20}]$, $n_1, k_1, d_1, n_2, k_2$ and $d_2$ satisfy an expression $$\{(n_1-n_{10})/(n_{1m}-n_{10})\}^2+\{(k_1-k_{10})/(k_{1m}-k_{10})\}^2+\{(d_1-d_{10})/(d_{1m}-d_{10})\}^2+\{(n_2-n_{20})/(n_{2m}-n_{20})\}^2+\{(k_2-k_{20})/(k_{2m}-k_{20})\}^2+\{(d_2-d_{20})/(d_{2m}-d_{20})\}^2 \leq 1$$

where a value of $n_{1m}$ in the pertaining case is adopted between on a relationship in magnitude between $n_1$ and $n_{10}$, a value of $k_{1m}$ in the pertaining case is adopted between on a relationship in magnitude between $k_1$ and $k_{10}$, a value of $d_{1m}$ in the pertaining case is adopted between on a relationship in magnitude between $d_1$ and $d_{10}$, a value of $n_{2m}$ in the pertaining case is adopted between on a relationship in magnitude between $n_2$ and $n_{20}$, a value of $k_{2m}$ in the pertaining case is adopted between on a relationship in magnitude between $k_2$ and $k_{20}$, and a value of $d_{2m}$ in the pertaining case is adopted between on a relationship in magnitude between $d_2$ and $d_{20}$.

| | Case | | | | |
|---|---|---|---|---|---|
| | 2-01 | 2-02 | 2-03 | 2-04 | 2-05 |
| $n_{10}$ | 2.1270 | 1.9689 | 1.8874 | 1.9059 | 1.7643 |
| $k_{10}$ | 0.0000 | 0.1461 | 0.1027 | 0.0744 | 0.0947 |
| $d_{10}$(nm) | 17.47 | 29.67 | 21.38 | 15.49 | 94.08 |
| $n_{20}$ | 2.3628 | 3.1616 | 1.9199 | 1.8297 | 1.7955 |
| $k_{20}$ | 0.9776 | 0.5440 | 0.3802 | 0.2998 | 0.6320 |
| $d_{20}$(nm) | 21.04 | 39.98 | 139.31 | 207.65 | 32.98 |
| for $n_1 \geq n_{10}$, $n_{1m}=$ | 2.2256 | 2.0568 | 1.9734 | 2.0082 | 1.8353 |
| for $n_1 < n_{10}$, $n_{1m}=$ | 2.0472 | 1.9010 | 1.8223 | 1.8296 | 1.7330 |
| for $k_1 \geq k_{10}$, $k_{1m}=$ | 0.0938 | 0.2244 | 0.1768 | 0.1635 | 0.1575 |
| for $k_1 < k_{10}$, $k_{1m}=$ | 0.0000 | 0.0685 | 0.0175 | 0.0000 | 0.0495 |
| for $d_1 \geq d_{10}$, $d_{1m}$(nm) = | 20.80 | 34.77 | 29.62 | 23.26 | 112.91 |
| for $d_1 < d_{10}$, $d_{1m}$(nm) = | 14.63 | 25.76 | 16.06 | 10.49 | 87.82 |
| for $n_2 \geq n_{20}$, $n_{2m}=$ | 2.4916 | 3.3028 | 2.0581 | 1.9623 | 1.9074 |
| for $n_2 < n_{20}$, $n_{2m}=$ | 2.2319 | 3.0031 | 1.7577 | 1.6665 | 1.6538 |
| for $k_2 \geq k_{20}$, $k_{2m}=$ | 1.1151 | 0.7242 | 0.5735 | 0.4524 | 0.7450 |
| for $k_2 < k_{20}$, $k_{2m}=$ | 0.8400 | 0.4156 | 0.2710 | 0.2013 | 0.5085 |
| for $d_2 \geq d_{20}$, $d_{2m}$(nm) = | 24.36 | 42.69 | ∞ | ∞ | 38.62 |
| for $d_2 < d_{20}$, $d_{2m}$(nm) = | 18.21 | 37.46 | 80.09 | 126.81 | 27.34 |

| | Case | | | | |
|---|---|---|---|---|---|
| | 2-06 | 2-07 | 2-08 | 2-09 | 2-10 |
| $n_{10}$ | 1.7803 | 1.7743 | 1.7445 | 1.7294 | 1.7425 |
| $k_{10}$ | 0.0868 | 0.0850 | 0.0789 | 0.0717 | 0.0762 |
| $d_{10}$(nm) | 93.23 | 91.77 | 92.02 | 166.39 | 161.95 |
| $n_{20}$ | 1.9791 | 1.8636 | 1.7368 | 1.9163 | 1.9299 |
| $k_{20}$ | 0.3951 | 0.2810 | 0.2206 | 0.6369 | 0.3467 |
| $d_{20}$(nm) | 77.05 | 139.87 | 212.33 | 26.72 | 78.23 |
| for $n_1 \geq n_{10}$, $n_{1m}=$ | 1.8462 | 1.8349 | 1.8028 | 1.8016 | 1.8041 |
| for $n_1 < n_{10}$, $n_{1m}=$ | 1.7475 | 1.7473 | 1.7193 | 1.7039 | 1.7237 |
| for $k_1 \geq k_{10}$, $k_{1m}=$ | 0.1496 | 0.1408 | 0.1323 | 0.1330 | 0.1299 |
| for $k_1 < k_{10}$, $k_{1m}=$ | 0.0394 | 0.0374 | 0.0301 | 0.0370 | 0.0455 |
| for $d_1 \geq d_{10}$, $d_{1m}$(nm) = | 109.31 | 108.27 | 115.67 | 209.20 | 195.88 |
| for $d_1 < d_{10}$, $d_{1m}$(nm) = | 87.00 | 86.56 | 85.73 | 157.85 | 156.76 |
| for $n_2 \geq n_{20}$, $n_{2m}=$ | 2.1009 | 1.9987 | 1.8971 | 2.0476 | 2.0364 |
| for $n_2 < n_{20}$, $n_{2m}=$ | 1.8504 | 1.7392 | 1.6175 | 1.7703 | 1.8051 |
| for $k_2 \geq k_{20}$, $k_{2m}=$ | 0.5318 | 0.4468 | 0.3623 | 0.7342 | 0.4294 |
| for $k_2 < k_{20}$, $k_{2m}=$ | 0.2922 | 0.2015 | 0.1499 | 0.5070 | 0.2516 |
| for $d_2 \geq d_{20}$, $d_{2m}$(nm) = | 85.43 | ∞ | ∞ | 31.20 | 85.58 |
| for $d_2 < d_{20}$, $d_{2m}$(nm) = | 68.38 | 126.05 | 181.56 | 22.38 | 72.33 |

| | Case | | | | |
|---|---|---|---|---|---|
| | 2-11 | 2-12 | 2-13 | 2-14 | 2-15 |
| $n_{10}$ | 1.7364 | 1.7194 | 1.7189 | 1.7279 | 1.7039 |
| $k_{10}$ | 0.0767 | 0.0663 | 0.0609 | 0.0714 | 0.0620 |

-continued

| | | | | | |
|---|---|---|---|---|---|
| $d_{10}$(nm) | 160.57 | 160.35 | 240.33 | 230.11 | 268.01 |
| $n_{20}$ | 1.7865 | 1.6960 | 2.2401 | 1.8887 | 1.7359 |
| $k_{20}$ | 0.2463 | 0.1988 | 0.7138 | 0.3299 | 0.2398 |
| $d_{20}$(nm) | 145.39 | 214.32 | 17.92 | 78.86 | 158.55 |
| for $n_1 \geq n_{10}$, $n_{1m} =$ | 1.7918 | 1.7729 | 1.7932 | 1.7879 | 1.7579 |
| for $n_1 < n_{10}$, $n_{1m} =$ | 1.7262 | 1.6947 | 1.6903 | 1.7176 | 1.6407 |
| for $k_1 \geq k_{10}$, $k_{1m} =$ | 0.1172 | 0.1176 | 0.1266 | 0.1177 | 0.1322 |
| for $k_1 < k_{10}$, $k_{1m} =$ | 0.0534 | 0.0312 | 0.0317 | 0.0558 | 0.0228 |
| for $d_1 \geq d_{10}$, $d_{1m}$(nm) = | 198.97 | ∞ | ∞ | ∞ | ∞ |
| for $d_1 < d_{10}$, $d_{1m}$(nm) = | 157.73 | 149.13 | 225.89 | 226.73 | 223.91 |
| for $n_2 \geq n_{20}$, $n_{2m} =$ | 1.8969 | 1.9046 | 2.4255 | 2.0020 | 1.9149 |
| for $n_2 < n_{20}$, $n_{2m} =$ | 1.6706 | 1.5895 | 2.0733 | 1.8277 | 1.4543 |
| for $k_2 \geq k_{20}$, $k_{2m} =$ | 0.3435 | 0.2910 | 0.8416 | 0.3876 | 0.4261 |
| for $k_2 < k_{20}$, $k_{2m} =$ | 0.1729 | 0.1351 | 0.5371 | 0.2258 | 0.1424 |
| for $d_2 \geq d_{20}$, $d_{2m}$(nm) = | 161.62 | ∞ | 21.50 | 87.70 | ∞ |
| for $d_2 < d_{20}$, $d_{2m}$(nm) = | 139.39 | 187.96 | 15.15 | 76.00 | 129.53 |

| | Case 2-16 |
|---|---|
| $n_{10}$ | 1.7046 |
| $k_{10}$ | 0.0595 |
| $d_{10}$(nm) | 264.54 |
| $n_{20}$ | 1.7170 |
| $k_{20}$ | 0.1955 |
| $d_{20}$(nm) | 223.28 |
| for $n_1 \geq n_{10}$, $n_{1m} =$ | 1.7716 |
| for $n_1 < n_{10}$, $n_{1m} =$ | 1.6465 |
| for $k_1 \geq k_{10}$, $k_{1m} =$ | 0.1321 |
| for $k_1 < k_{10}$, $k_{1m} =$ | 0.0178 |
| for $d_1 \geq d_{10}$, $d_{1m}$(nm) = | ∞ |
| for $d_1 < d_{10}$, $d_{1m}$(nm) = | 160.48 |
| for $n_2 \geq n_{20}$, $n_{2m} =$ | 2.1001 |
| for $n_2 < n_{20}$, $n_{2m} =$ | 1.4760 |
| for $k_2 \geq k_{20}$, $k_{2m} =$ | 0.4081 |
| for $k_2 < k_{20}$, $k_{2m} =$ | 0.1085 |
| for $d_2 \geq d_{20}$, $d_{2m}$(nm) = | ∞ |
| for $d_2 < d_{20}$, $d_{2m}$(nm) = | 143.86 |

According to a third embodiment of the present invention, there is provided an antireflection film having a two-layer structure and formed between a resist layer and a surface of a silicon semiconductor substrate for being used when the resist layer is exposed by an exposure system which is used in a fabrication process of a semiconductor device and has a wavelength of 190 nm to 195 nm and a numerical aperture more than 1.1 but equal to or less than 1.2. Further, according to the third embodiment of the present invention, there is provided an exposure method for exposing a resist layer by means of an exposure system which is used in a fabrication process of a semiconductor device and has a wavelength of 190 nm to 195 nm and a numerical aperture more than 1.1 but equal to or less than 1.2, an antireflection film which has a two-layer structure being formed between the resist layer and a surface of a silicon semiconductor substrate.

The antireflection film and the exposure method according to the third embodiment are configured such that the-antireflection film includes an upper layer having a complex refractive index $N_1$ equal to $n_1-k_1 i$ and a film thickness $d_1$ whose unit is nm, and a lower layer having a complex refractive index $N_2$ equal to $n_2-k_2 i$ and a film thickness $d_2$ whose unit is nm, the upper layer and the lower layer being configured such that, when one of cases [3-01] to [3-14] defined in a table given below is selected as a combination of values of $[n_{10}, k_{10}, d_{10}, n_{20}, k_{20}, d_{20}]$, $n_1, k_1, d_1, n_2, k_2$ and $d_2$ satisfy an expression $$\{(n_1-n_{10})/(n_{1m}-n_{10})\}^2 + \{(k_1-k_{10})/(k_{1m}-k_{10})\}^2 + \{(d_1-d_{10})/(d_{1m}-d_{10})\}^2 + \{(n_2-n_{20})/(n_{2m}-n_{20})\}^2 + \{(k_2-k_{20})/(k_{2m}-k_{20})\}^2 + \{(d_2-d_{20})/(d_{2m}-d_{20})\}^2 \leq 1$$

where a value of $n_{1m}$ in the pertaining case is adopted between on a relationship in magnitude between $n_1$ and $n_{10}$, a value of $k_{1m}$ in the pertaining case is adopted between on a relationship in magnitude between $k_1$ and $k_{10}$, a value of $d_{1m}$ in the pertaining case is adopted between on a relationship in magnitude between $d_1$ and $d_{10}$, a value of $n_{2m}$ in the pertaining case is adopted between on a relationship in magnitude between $n_2$ and $n_{20}$, a value of $k_{2m}$ in the pertaining case is adopted between on a relationship in magnitude between $k_2$ and $k_{20}$, and a value of $d_{2m}$ in the pertaining case is adopted between on a relationship in magnitude between $d_2$ and $d_{20}$.

| | Case | | | | |
|---|---|---|---|---|---|
| | 3-01 | 3-02 | 3-03 | 3-04 | 3-05 |
| $n_{10}$ | 2.1010 | 1.9972 | 1.8971 | 1.8903 | 1.7614 |
| $k_{10}$ | 0.0000 | 0.1417 | 0.0932 | 0.1047 | 0.0933 |
| $d_{10}$(nm) | 18.86 | 29.97 | 20.09 | 13.40 | 99.78 |
| $n_{20}$ | 2.3980 | 3.9849 | 1.8912 | 1.7190 | 1.8773 |

-continued

| | | | | | |
|---|---|---|---|---|---|
| $k_{20}$ | 0.9577 | 0.5156 | 0.3589 | 0.2691 | 0.6361 |
| $d_{20}$(nm) | 20.51 | 29.99 | 144.86 | 225.69 | 29.70 |
| for $n_1 \geq n_{10}$, $n_{1m} =$ | 2.1902 | 2.0806 | 1.9757 | 1.9938 | 1.8213 |
| for $n_1 < n_{10}$, $n_{1m} =$ | 2.0333 | 1.9400 | 1.8442 | 1.8243 | 1.7445 |
| for $k_1 \geq k_{10}$, $k_{1m} =$ | 0.0791 | 0.2081 | 0.1538 | 0.1917 | 0.1313 |
| for $k_1 < k_{10}$, $k_{1m} =$ | 0.0000 | 0.0680 | 0.0073 | 0.0023 | 0.0538 |
| for $d_1 \geq d_{10}$, $d_{1m}$(nm) = | 22.17 | 34.24 | 27.46 | 20.29 | 118.37 |
| for $d_1 < d_{10}$, $d_{1m}$(nm) = | 16.20 | 26.95 | 16.03 | 9.40 | 96.05 |
| for $n_2 \geq n_{20}$, $n_{2m} =$ | 2.5150 | 4.1060 | 2.0062 | 1.8367 | 1.9517 |
| for $n_2 < n_{20}$, $n_{2m} =$ | 2.2758 | 3.8579 | 1.7470 | 1.5737 | 1.7548 |
| for $k_2 \geq k_{20}$, $k_{2m} =$ | 1.0902 | 0.6644 | 0.5181 | 0.3688 | 0.7101 |
| for $k_2 < k_{20}$, $k_{2m} =$ | 0.8269 | 0.4039 | 0.2637 | 0.1833 | 0.5274 |
| for $d_2 \geq d_{20}$, $d_{2m}$(nm) = | 23.39 | 31.19 | ∞ | ∞ | 33.13 |
| for $d_2 < d_{20}$, $d_{2m}$(nm) = | 17.92 | 28.87 | 85.53 | 141.88 | 25.36 |

| | Case | | | | |
|---|---|---|---|---|---|
| | 3-06 | 3-07 | 3-08 | 3-09 | 3-10 |
| $n_{10}$ | 1.7825 | 1.7569 | 1.7277 | 1.7272 | 1.7147 |
| $k_{10}$ | 0.0898 | 0.0868 | 0.0740 | 0.0744 | 0.0633 |
| $d_{10}$(nm) | 97.07 | 96.31 | 94.69 | 178.89 | 164.15 |
| $n_{20}$ | 2.0041 | 1.7847 | 1.6779 | 2.1865 | 1.6838 |
| $k_{20}$ | 0.3750 | 0.2610 | 0.2014 | 0.6947 | 0.1862 |
| $d_{20}$(nm) | 75.78 | 148.77 | 220.98 | 19.20 | 215.48 |
| for $n_1 \geq n_{10}$, $n_{1m} =$ | 1.8327 | 1.7995 | 1.7711 | 1.7845 | 1.7573 |
| for $n_1 < n_{10}$, $n_{1m} =$ | 1.7698 | 1.7544 | 1.7097 | 1.7167 | 1.6822 |
| for $k_1 \geq k_{10}$, $k_{1m} =$ | 0.1223 | 0.0982 | 0.1152 | 0.1077 | 0.1011 |
| for $k_1 < k_{10}$, $k_{1m} =$ | 0.0533 | 0.0642 | 0.0321 | 0.0488 | 0.0264 |
| for $d_1 \geq d_{10}$, $d_{1m}$(nm) = | 109.28 | 111.91 | 114.36 | 218.45 | ∞ |
| for $d_1 < d_{10}$, $d_{1m}$(nm) = | 94.62 | 95.76 | 89.11 | 175.03 | 147.22 |
| for $n_2 \geq n_{20}$, $n_{2m} =$ | 2.0899 | 1.8293 | 1.7201 | 2.2837 | 1.7321 |
| for $n_2 < n_{20}$, $n_{2m} =$ | 1.9035 | 1.6980 | 1.5934 | 2.0604 | 1.6046 |
| for $k_2 \geq k_{20}$, $k_{2m} =$ | 0.4366 | 0.3015 | 0.2464 | 0.7527 | 0.2137 |
| for $k_2 < k_{20}$, $k_{2m} =$ | 0.2899 | 0.2021 | 0.1479 | 0.5549 | 0.1380 |
| for $d_2 \geq d_{20}$, $d_{2m}$(nm) = | 81.59 | 161.61 | ∞ | 21.11 | 235.37 |
| for $d_2 < d_{20}$, $d_{2m}$(nm) = | 70.00 | 146.51 | 196.47 | 16.79 | 195.03 |

| | Case | | | |
|---|---|---|---|---|
| | 3-11 | 3-12 | 3-13 | 3-14 |
| $n_{10}$ | 1.7036 | 1.7000 | 1.7012 | 1.7028 |
| $k_{10}$ | 0.0666 | 0.0723 | 0.0708 | 0.0661 |
| $d_{10}$(nm) | 228.90 | 216.03 | 209.55 | 205.70 |
| $n_{20}$ | 2.1518 | 1.7881 | 1.7244 | 1.7099 |
| $k_{20}$ | 0.6409 | 0.3189 | 0.2345 | 0.1906 |
| $d_{20}$(nm) | 21.01 | 93.79 | 164.15 | 230.44 |
| for $n_1 \geq n_{10}$, $n_{1m} =$ | 1.7333 | 1.7203 | 1.7336 | 1.7514 |
| for $n_1 < n_{10}$, $n_{1m} =$ | 1.6243 | 1.6387 | 1.6472 | 1.6539 |
| for $k_1 \geq k_{10}$, $k_{1m} =$ | 0.1086 | 0.1103 | 0.1181 | 0.1191 |
| for $k_1 < k_{10}$, $k_{1m} =$ | 0.0356 | 0.0460 | 0.0368 | 0.0268 |
| for $d_1 \geq d_{10}$, $d_{1m}$(nm) = | ∞ | 227.26 | 237.88 | ∞ |
| for $d_1 < d_{10}$, $d_{1m}$(nm) = | 181.97 | 190.09 | 179.63 | 173.04 |
| for $n_2 \geq n_{20}$, $n_{2m} =$ | 2.3031 | 1.9012 | 1.8497 | 1.8964 |
| for $n_2 < n_{20}$, $n_{2m} =$ | 2.0795 | 1.7532 | 1.6568 | 1.5385 |
| for $k_2 \geq k_{20}$, $k_{2m} =$ | 0.7063 | 0.3281 | 0.3333 | 0.3179 |
| for $k_2 < k_{20}$, $k_{2m} =$ | 0.5137 | 0.2264 | 0.1529 | 0.1170 |
| for $d_2 \geq d_{20}$, $d_{2m}$(nm) = | 24.52 | 111.38 | ∞ | ∞ |
| for $d_2 < d_{20}$, $d_{2m}$(nm) = | 19.07 | 89.55 | 150.63 | 157.43 |

According to a fourth embodiment of the present invention, there is provided an antireflection film having a two-layer structure and formed between a resist layer and a surface of a silicon semiconductor substrate for being used when the resist layer is exposed by an exposure system which is used in a fabrication process of a semiconductor device and has a wavelength of 190 nm to 195 nm and a numerical aperture more than 1.2 but equal to or less than 1.3. Further, according to the fourth embodiment of the present invention, there is provided an exposure method for exposing a resist layer by means of an exposure system which is used in a fabrication process of a semiconductor device and has a wavelength of 190 nm to 195 nm and a numerical aperture more than 1.2 but equal to or less than 1.3, an antireflection film which has a two-layer structure being formed between the resist layer and a surface of a silicon semiconductor substrate.

The antireflection film and the exposure method according to the fourth embodiment are configured such that the antireflection film includes an upper layer having a complex refractive index $N_1$ equal to $n_1 - k_1 i$ and a film thickness $d_1$ whose unit is nm, and a lower layer having a complex refractive index $N_2$ equal to $n_2 - k_2 i$ and a film thickness $d_2$ whose unit is nm, the upper layer and the lower layer being configured such that, when one of cases [4-01] to [4-10] defined in a table given below is selected as a combination of values of $[n_{10}, k_{10}, d_{10}, n_{20}, k_{20}, d_{20}]$, $n_1, k_1, d_1, n_2, k_2$ and $d_2$ satisfy an expression $$\{(n_1-n_{10})/(n_{1m}-n_{10})\}^2+\{(k_1-k_{10})/(k_{1m}-k_{10})\}^2+$$
$$\{(d_1-d_{10})/(d_{1m}-d_{10})\}^2+\{(n_2-n_{20})/(n_{2m}-n_{20})\}^2+$$
$$\{(k_2-k_{20})/(k_{2m}-k_{20})\}^2+\{(d_2-d_{20})/(d_{2m}-d_{20})\}^2 \leq 1$$

where a value of $n_{1m}$ in the pertaining case is adopted between on a relationship in magnitude between $n_1$ and $n_{10}$, a value of $k_{1m}$ in the pertaining case is adopted between on a relationship in magnitude between $k_1$ and $k_{10}$, a value of $d_{1m}$ in the pertaining case is adopted between on a relationship in magnitude between $d_1$ and $d_{10}$, a value of $n_{2m}$ in the pertaining case is adopted between on a relationship in magnitude between $n_2$ and $n_{20}$, a value of $k_{2m}$ in the pertaining case is adopted between on a relationship in magnitude between $k_2$ and $k_{20}$, and a value of $d_{2m}$ in the pertaining case is adopted between on a relationship in magnitude between $d_2$ and $d_{20}$.

more than 1.3 but equal to or less than 1.4. Further, according to the first embodiment of the present invention, there is provided an exposure method for exposing a resist layer by means of an exposure system which is used in a fabrication process of a semiconductor device and has a wavelength of 190 nm to 195 nm and a numerical aperture more than 1.3 but equal to or less than 1.4, an antireflection film which has a two-layer structure being formed between the resist layer and a surface of a silicon semiconductor substrate.

The antireflection film and the exposure method according to the fifth embodiment are configured such that the antireflection film includes an upper layer having a complex refractive index $N_1$ equal to $n_1-k_1i$ and a film thickness $d_1$ whose unit is nm, and a lower layer having a complex refractive index $N_2$ equal to $n_2-k_2i$ and a film thickness $d_2$ whose unit is nm, the upper layer and the lower layer being configured such

| | Case | | | | |
|---|---|---|---|---|---|
| | 4-01 | 4-02 | 4-03 | 4-04 | 4-05 |
| $n_{10}$ | 2.0750 | 2.0118 | 1.8885 | 1.8806 | 1.7567 |
| $k_{10}$ | 0.0000 | 0.1190 | 0.0999 | 0.1003 | 0.0923 |
| $d_{10}$(nm) | 20.30 | 29.87 | 17.71 | 13.44 | 108.92 |
| $n_{20}$ | 2.4310 | 4.0092 | 1.7811 | 1.7062 | 2.0485 |
| $k_{20}$ | 0.9366 | 0.5022 | 0.3211 | 0.2477 | 0.6631 |
| $d_{20}$(nm) | 19.90 | 29.99 | 159.56 | 227.84 | 23.68 |
| for $n_1 \geq n_{10}$, $n_{1m}=$ | 2.1541 | 2.0844 | 1.9589 | 1.9713 | 1.7997 |
| for $n_1 < n_{10}$, $n_{1m}=$ | 2.0215 | 1.9638 | 1.8538 | 1.8291 | 1.7557 |
| for $k_1 \geq k_{10}$, $k_{1m}=$ | 0.0610 | 0.1705 | 0.1459 | 0.1729 | 0.0954 |
| for $k_1 < k_{10}$, $k_{1m}=$ | 0.0000 | 0.0518 | 0.0187 | 0.0078 | 0.0655 |
| for $d_1 \geq d_{10}$, $d_{1m}$(nm)= | 23.54 | 33.58 | 23.82 | 19.76 | 125.01 |
| for $d_1 < d_{10}$, $d_{1m}$(nm)= | 18.03 | 27.42 | 15.13 | 10.09 | 108.67 |
| for $n_2 \geq n_{20}$, $n_{2m}=$ | 2.5291 | 4.1084 | 1.8635 | 1.7809 | 2.0547 |
| for $n_2 < n_{20}$, $n_{2m}=$ | 2.3203 | 3.9019 | 1.6624 | 1.5899 | 1.9572 |
| for $k_2 \geq k_{20}$, $k_{2m}=$ | 1.0610 | 0.6325 | 0.4092 | 0.3139 | 0.6691 |
| for $k_2 < k_{20}$, $k_{2m}=$ | 0.8178 | 0.4040 | 0.2433 | 0.1776 | 0.5710 |
| for $d_2 \geq d_{20}$, $d_{2m}$(nm)= | 22.43 | 30.97 | ∞ | ∞ | 23.86 |
| for $d_2 < d_{20}$, $d_{2m}$(nm)= | 17.62 | 29.03 | 129.86 | 149.42 | 21.22 |

| | Case | | | | |
|---|---|---|---|---|---|
| | 4-06 | 4-07 | 4-08 | 4-09 | 4-10 |
| $n_{10}$ | 1.7300 | 1.7016 | 1.7036 | 1.7088 | 1.7083 |
| $k_{10}$ | 0.0690 | 0.0665 | 0.0722 | 0.0700 | 0.0641 |
| $d_{10}$(nm) | 99.33 | 227.28 | 216.05 | 208.98 | 205.66 |
| $n_{20}$ | 1.7059 | 2.1201 | 1.7959 | 1.7311 | 1.7076 |
| $k_{20}$ | 0.1911 | 0.6392 | 0.3181 | 0.2343 | 0.1900 |
| $d_{20}$(nm) | 215.34 | 21.82 | 93.13 | 163.14 | 228.20 |
| for $n_1 \geq n_{10}$, $n_{1m}=$ | 1.7599 | 1.7325 | 1.7213 | 1.7343 | 1.7487 |
| for $n_1 < n_{10}$, $n_{1m}=$ | 1.7290 | 1.6697 | 1.6816 | 1.6905 | 1.6839 |
| for $k_1 \geq k_{10}$, $k_{1m}=$ | 0.0744 | 0.1071 | 0.1083 | 0.1002 | 0.0965 |
| for $k_1 < k_{10}$, $k_{1m}=$ | 0.0522 | 0.0350 | 0.0475 | 0.0408 | 0.0326 |
| for $d_1 \geq d_{10}$, $d_{1m}$(nm)= | 114.51 | 249.66 | 226.44 | 234.14 | ∞ |
| for $d_1 < d_{10}$, $d_{1m}$(nm)= | 98.99 | 206.91 | 203.38 | 198.02 | 187.04 |
| for $n_2 \geq n_{20}$, $n_{2m}=$ | 1.7114 | 2.2630 | 1.9107 | 1.8583 | 1.8700 |
| for $n_2 < n_{20}$, $n_{2m}=$ | 1.6501 | 2.0448 | 1.7644 | 1.6757 | 1.5497 |
| for $k_2 \geq k_{20}$, $k_{2m}=$ | 0.1929 | 0.7020 | 0.3809 | 0.3287 | 0.3066 |
| for $k_2 < k_{20}$, $k_{2m}=$ | 0.1524 | 0.5119 | 0.2256 | 0.1573 | 0.1188 |
| for $d_2 \geq d_{20}$, $d_{2m}$(nm)= | 219.55 | 25.26 | 110.64 | ∞ | ∞ |
| for $d_2 < d_{20}$, $d_{2m}$(nm)= | 205.88 | 19.68 | 89.45 | 150.12 | 160.78 |

According to a fifth embodiment of the present invention, there is provided an antireflection film having a two-layer structure and formed between a resist layer and a surface of a silicon semiconductor substrate for being used when the resist layer is exposed by an exposure system which is used in a fabrication process of a semiconductor device and has a wavelength of 190 nm to 195 nm and a numerical aperture that, when one of cases [5-01] to [5-07] defined in a table given below is selected as a combination of values of $[n_{10}, k_{10}, d_{10}, n_{20}, k_{20}, d_{20}]$, $n_1, k_1, d_1, n_2, k2$ and $d_2$ satisfy an expression $$\{(n_1-n_{10})/(n_{1m}-n_{10})\}^2+\{(k_1-k_{10})/(k_{1m}-k_{10})\}^2+$$
$$\{(d_1-d_{10})/(d_{1m}-d_{10})\}^2+\{(n_2-n_{20})/(n_{2m}-n_{20})\}^2+$$
$$\{(k_2-k_{20})/(k_{2m}-k_{20})\}^2+\{(d_2-d_{20})/(d_{2m}-d_{20})\}^2 \leq 1$$

where a value of $n_{1m}$ in the pertaining case is adopted between on a relationship in magnitude between $n_1$ and $n_{10}$, a value of $k_{1m}$ in the pertaining case is adopted between on a relationship in magnitude between $k_1$ and $k_{10}$, a value of $d_{1m}$ in the pertaining case is adopted between on a relationship in magnitude between $d_1$ and $d_{10}$, a value of $n_{2m}$ in the pertaining case is adopted between on a relationship in magnitude between $n_2$ and $n_{20}$, a value of $k_{2m}$ in the pertaining case is adopted between on a relationship in magnitude between $k_2$ and $k_{20}$, and a value of $d_{2m}$ in the pertaining-case is adopted between on a relationship in magnitude between $d_2$ and $d_{20}$.

films and the exposure methods are sometimes referred to collectively as present invention), the exposure light (illumination light) has a wavelength of 190 nm to 195 nm. However, the exposure light (illumination light) preferably has a wavelength of 192 nm to 194 nm, and more preferably, an ArF excimer laser of a wavelength of 193 nm is used as the exposure light source.

Further, it is preferable to satisfy $d_1 \leq 250$ and besides satisfy $d_2 \leq 250$. In other words, preferably the film thickness of the upper layer of the antireflection film does not exceed 250 nm and besides also the film thickness of the lower layer

|  | Case | | | | |
| --- | --- | --- | --- | --- | --- |
|  | 5-01 | 5-02 | 5-03 | 5-04 | 5-05 |
| $n_{10}$ | 2.0901 | 2.0375 | 1.8787 | 1.8780 | 1.7009 |
| $k_{10}$ | 0.0000 | 0.0819 | 0.1028 | 0.0706 | 0.0609 |
| $d_{10}$(nm) | 20.79 | 29.12 | 16.60 | 14.89 | 160.18 |
| $n_{20}$ | 2.4315 | 3.6552 | 1.7172 | 1.7467 | 1.6995 |
| $k_{20}$ | 0.9254 | 0.4960 | 0.2840 | 0.2361 | 0.1745 |
| $d_{20}$(nm) | 20.34 | 34.09 | 167.85 | 221.06 | 215.71 |
| for $n_1 \geq n_{10}$, $n_{1m}$ = | 2.1532 | 2.0916 | 1.9323 | 1.9461 | 1.7131 |
| for $n_1 < n_{10}$, $n_{1m}$ = | 2.0485 | 1.9946 | 1.8625 | 1.8482 | 1.6965 |
| for $k_1 \geq k_{10}$, $k_{1m}$ = | 0.0301 | 0.1157 | 0.1287 | 0.1125 | 0.0797 |
| for $k_1 < k_{10}$, $k_{1m}$ = | 0.0000 | 0.0234 | 0.0358 | 0.0000 | 0.0529 |
| for $d_1 \geq d_{10}$, $d_{1m}$(nm) = | 23.53 | 31.97 | 21.01 | 20.40 | 168.49 |
| for $d_1 < d_{10}$, $d_{1m}$(nm) = | 19.45 | 27.24 | 15.35 | 12.65 | 156.71 |
| for $n_2 \geq n_{20}$, $n_{2m}$ = | 2.4915 | 3.7301 | 1.7470 | 1.7894 | 1.7056 |
| for $n_2 < n_{20}$, $n_{2m}$ = | 2.3369 | 3.5977 | 1.6335 | 1.6492 | 1.6786 |
| for $k_2 \geq k_{20}$, $k_{2m}$ = | 1.0253 | 0.5706 | 0.3145 | 0.2771 | 0.1981 |
| for $k_2 < k_{20}$, $k_{2m}$ = | 0.8408 | 0.4125 | 0.2297 | 0.1801 | 0.1502 |
| for $d_2 \geq d_{20}$, $d_{2m}$(nm) = | 22.48 | 35.05 | ∞ | ∞ | 219.96 |
| for $d_2 < d_{20}$, $d_{2m}$(nm) = | 18.31 | 33.41 | 144.47 | 152.04 | 200.15 |

|  | Case | |
| --- | --- | --- |
|  | 5-06 | 5-07 |
| $n_{10}$ | 1.7204 | 1.7142 |
| $k_{10}$ | 0.0677 | 0.0552 |
| $d_{10}$(nm) | 231.66 | 225.66 |
| $n_{20}$ | 2.2460 | 1.7026 |
| $k_{20}$ | 0.6523 | 0.1831 |
| $d_{20}$(nm) | 18.88 | 210.32 |
| for $n_1 \geq n_{10}$, $n_{1m}$ = | 1.7346 | 1.7449 |
| for $n_1 < n_{10}$, $n_{1m}$ = | 1.7142 | 1.7015 |
| for $k_1 \geq k_{10}$, $k_{1m}$ = | 0.0791 | 0.0776 |
| for $k_1 < k_{10}$, $k_{1m}$ = | 0.0480 | 0.0279 |
| for $d_1 \geq d_{10}$, $d_{1m}$(nm) = | 241.66 | 269.84 |
| for $d_1 < d_{10}$, $d_{1m}$(nm) = | 227.75 | 215.83 |
| for $n_2 \geq n_{20}$, $n_{2m}$ = | 2.3315 | 1.8141 |
| for $n_2 < n_{20}$, $n_{2m}$ = | 2.2068 | 1.6257 |
| for $k_2 \geq k_{20}$, $k_{2m}$ = | 0.6941 | 0.2591 |
| for $k_2 < k_{20}$, $k_{2m}$ = | 0.5188 | 0.1258 |
| for $d_2 \geq d_{20}$, $d_{2m}$(nm) = | 20.91 | ∞ |
| for $d_2 < d_{20}$, $d_{2m}$(nm) = | 17.96 | 186.01 |

The exposure methods according to the first to fifth embodiments of the present invention are applied, for example, to working of a very fine pattern of a semiconductor device and particularly include a step of forming an antifriction film of the present invention on a silicon semiconductor substrate, a step of applying and forming a resist layer having a photosensitive action to and on the antireflection layer, a step of selectively exposing the resist layer with exposure light (ultraviolet rays), and a step of developing the resist layer to obtain a predetermined resist pattern.

In the antireflection films according to the first to fifth embodiments of the present invention or the exposure methods according to the first to fifth embodiments of the present invention (in the following description, the antireflection films and the exposure methods are sometimes referred to does not exceed 250 nm. If the film thickness of the upper layer exceeds 250 nm or the film thickness of the lower layer exceeds 250 nm, then at a step of etching a silicon semiconductor substrate using a resist layer as an etching mask after the resist layer is exposed with exposure light and developed, the work conversion difference (also called dimension conversion amount or dimension shift) which is a difference between a resist pattern dimension of the resist layer and an etching work dimension of an actual silicon semiconductor substrate may become excessively great, resulting in the possibility that a pattern having a desired shape or size may not be obtained on the silicon semiconductor substrate.

Further, the refractive index of the resist layer preferably ranges from 1.60 to 1.80. Where a resist film made of a resist material whose refractive index does not fall within the range, even if the antireflection film satisfies any of the sets of conditions of ($n_1$, $k_1$, $d_1$, $n_2$, $k_2$, $d_2$) described hereinabove, it may be difficult to suppress the reflectance at the interface between the resist layer and the silicon semiconductor substrate to 0.4% or less over the overall region from an incident angle (maximum incident angle $\theta_{in-max}$) of exposure light corresponding to the pertaining numerical aperture to the perpendicular incidence (minimum incident angle $\theta_{in-min}$), resulting in the possibility that a good resist pattern shape may not be obtained.

It is to be noted that, in the following description, the overall region from the incident angle (maximum incident angle $\theta_{in-max}$) of the exposure light corresponding to the pertaining numerical aperture to the perpendicular incidence (minimum incident angle $\theta_{in-min}$) is sometimes referred to as "overall region of the incident angle corresponding to the pertaining numerical aperture NA of the exposure system" or merely as "overall region of the incident angle".

Further, preferably the film thickness of the resist layer is equal to approximately 2 to 5 times that of the minimum resist pattern size to be formed. Although the film thickness of the resist layer is smaller than twice the minimum resist pattern size, it is possible to pattern the resist layer so as to have a predetermined pattern. However, when the silicon semiconductor substrate is etched after the patterning of the resist layer, there is the possibility that a good etching result may not be obtained. In addition, there is the possibility also that the number of film defects in the resist layer may increase. On the other hand, where the film thickness of the resist layer exceeds five times the minimum resist pattern size, there is the possibility that the pattern resist layer may collapse and a good patterning result of the silicon semiconductor substrate may not be obtained.

The material which forms each of the upper and lower layers of the antireflection film may be any material only if it satisfies any of the various sets of conditions of ($n_1$, $k_1$, $d_1$, $n_2$, $k_2$, $d_2$) described hereinabove. For example, as the materials for forming the upper and lower layers, polymer materials, inorganic oxide materials, metal materials and hybrid materials of them may be used. In particular, for example, polyimide films, SiCH films, SiCHN films, epoxy type thermal-cure resin films, acrylic type thermal-cure resin films, epoxy type ultraviolet curing resin films and acrylic type ultraviolet curing resin films may be used.

It is to be noted that, for the object of protection and so forth of the resist layer, a protective layer made of an organic substance or an inorganic substance, particularly a protective film made of, for example, polyvinyl alcohol, amorphous fluoropolymer or NaCl, may be provided on the resist film.

Further, in order to enhance the close contact and so forth between the resist layer formed on the antireflection film and the antireflection film, a surface reforming process by a silane coupling agent or the like may be performed for the surface of the upper layer which forms the antireflection film.

Usually, in a single-layer antireflection film, in whatever manner the film thickness and the complex refraction index are varied, it is impossible to suppress the reflectance to 0.4% or less over the overall region of the incident angle corresponding to the pertaining numerical aperture NA of the exposure system. Further, if the film thickness of the antireflection film is excessively great, then the problem of the work conversion difference occurs at a step of etching the silicon semiconductor substrate after the resist layer is exposed with exposure light and developed.

On the other hand, in the present invention, since the antireflection film of a two-layer configuration having a film thickness and a complex refraction factor which are individually within predetermined ranges is formed between the resist layer and the silicon semiconductor substrate, it is possible to suppress the reflectance to 0.4% or less over the overall region of the incoming angle corresponding to the pertaining numerical aperture NA of the exposure system. Consequently, a resist pattern having a better shape can be obtained, and very fine working much finer than ever can be anticipated. In other words, where the film thickness and the complex refractive index of the antireflection film of a two-layer configuration satisfy the conditions described hereinabove in the case wherein the numerical aperture of the exposure system is within the ranges of NA≦1.0, 1.0<NA≦1.1, 1.1<NA≦1.2, 1.2<NA≦1.3 and 1.3<NA≦1.4, the reflectance can be set to 0.4% or less over the overall region from the incident angle of the exposure light corresponding to the pertaining numerical aperture NA to the perpendicular incidence. As a result, a resist pattern of a good shape can be obtained. Further, the work conversion difference can be suppressed low.

The above and other objects, features and advantages of the present invention will become apparent from the following description and the appended claims, taken in conjunction with the accompanying drawings in which like parts or elements denoted by like reference symbols.

BRIEF DESCRIPTION OF THE DRAWINGS

FIG. 1 is a table illustrating maximum values, determined by theoretical calculation, of the reflectance in a condition wherein the reflectance of the perpendicular incidence side is minimized from an incident angle where exposure light enters most obliquely corresponding to the numerical aperture of an exposure system with regard to various film thicknesses of an upper layer and a lower which form an antireflection film where the numerical aperture of the exposure system is 1.0;

FIG. 2 is a table illustrating maximum values, determined by theoretical calculation, of the reflectance in a condition wherein the reflectance of the perpendicular incidence side is minimized from an incident angle where exposure light enters most obliquely corresponding to the numerical aperture of an exposure system with regard to various film thicknesses of an upper layer and a lower which form an antireflection film where the numerical aperture of the exposure system is 1.1;

FIG. 3 is a table illustrating maximum values, determined by theoretical calculation, of the reflectance in a condition wherein the reflectance of the perpendicular incidence side is minimized from an incident angle where exposure light enters most obliquely corresponding to the numerical aperture of an exposure system with regard to various film thicknesses of an upper layer and a lower which form an antireflection film where the numerical aperture of the exposure system is 1.2;

FIG. 4 is a table illustrating maximum values, determined by theoretical calculation, of the reflectance in a condition wherein the reflectance of the perpendicular incidence side is minimized from an incident angle where exposure light enters most obliquely corresponding to the numerical aperture of an exposure system with regard to various film thicknesses of an upper layer and a lower which form an antireflection film where the numerical aperture of the exposure system is 1.3; and FIG. 5 is a table illustrating maximum values, determined by theoretical calculation, of the reflectance in a condition wherein the reflectance of the perpendicular incidence side is minimized from an incident angle where exposure light enters most obliquely corresponding to the numerical aperture of an exposure system with regard to various film thicknesses of an upper layer and a lower which form an antireflection film where the numerical aperture of the exposure system is 1.4.

DETAILED DESCRIPTION OF THE PREFERRED EMBODIMENTS

Before preferred embodiments of the present invention are described with reference to the accompanying drawings, the reason why, where the present invention is applied, the reflectance is suppressed to 0.4% or less over an overall region of the incident angle corresponding to the pertaining numerical aperture NA of an exposure system (overall region from the incident angle of the exposure light corresponding to the numerical aperture NA of the exposure system to the perpendicular incidence) is described.

An optimization simulation of complex refractive indices $N_1$ and $N_2$ of an upper layer and a lower layer of an antireflection film was conducted such that the reflectance where the numerical aperture NA of the exposure system was set to 1.0, 1.1, 1.2, 1.3 and 1.4 from an incident angle (maximum incident angle $\theta_{in\text{-}max}$) from the corresponding most oblique direction to the perpendicular incidence (minimum incident angle $\theta_{in\text{-}min}=0$ degree), that is, over the overall region of the incident angle, was minimized in individual combinations of values at increments of 10 nm of the film thickness $d_1$ of the upper layer from 10 nm to 250 nm and values at increments of 10 nm of the film thickness $d_2$ of the lower layer from 10 nm to 250 nm.

In the calculation described above, for the calculation of the reflectance of the two-layer antireflection film, a calculation method based on a character matrix (refer to Mitsunobu KOBIYAMA, Basic Theories of an Optical Thin Film, Optronics, 2003) was adopted. For the optimization of the complex refractive indices of the upper layer and the lower layer, the optimization method of Fletcher-Reeves (refer to J. Kowalik and M. R. Osborne, Methods for Unconstrained Optimization Probrems, translated by Yoshiyuki YAMAMOTO and Takeo KOYAMA, Baifukan, 1970) was applied.

Upon optimization, where the numerical aperture NA was 1.0, the overall region of the incident angle is divided into twenty equal parts. Then, the reflectance at each incident angle was calculated, and the square sum of the reflectances at the incident angles was minimized. It is to be noted that, for the values 1.1, 1.2, 1.3 and 1.4 of the numerical aperture NA, similar calculation was performed using values of the reflectance at incident angles where the overall region of the incident angle was divided into 22 equal parts, 24 equal parts, 26 equal parts and 28 equal parts, respectively.

Figure 5:
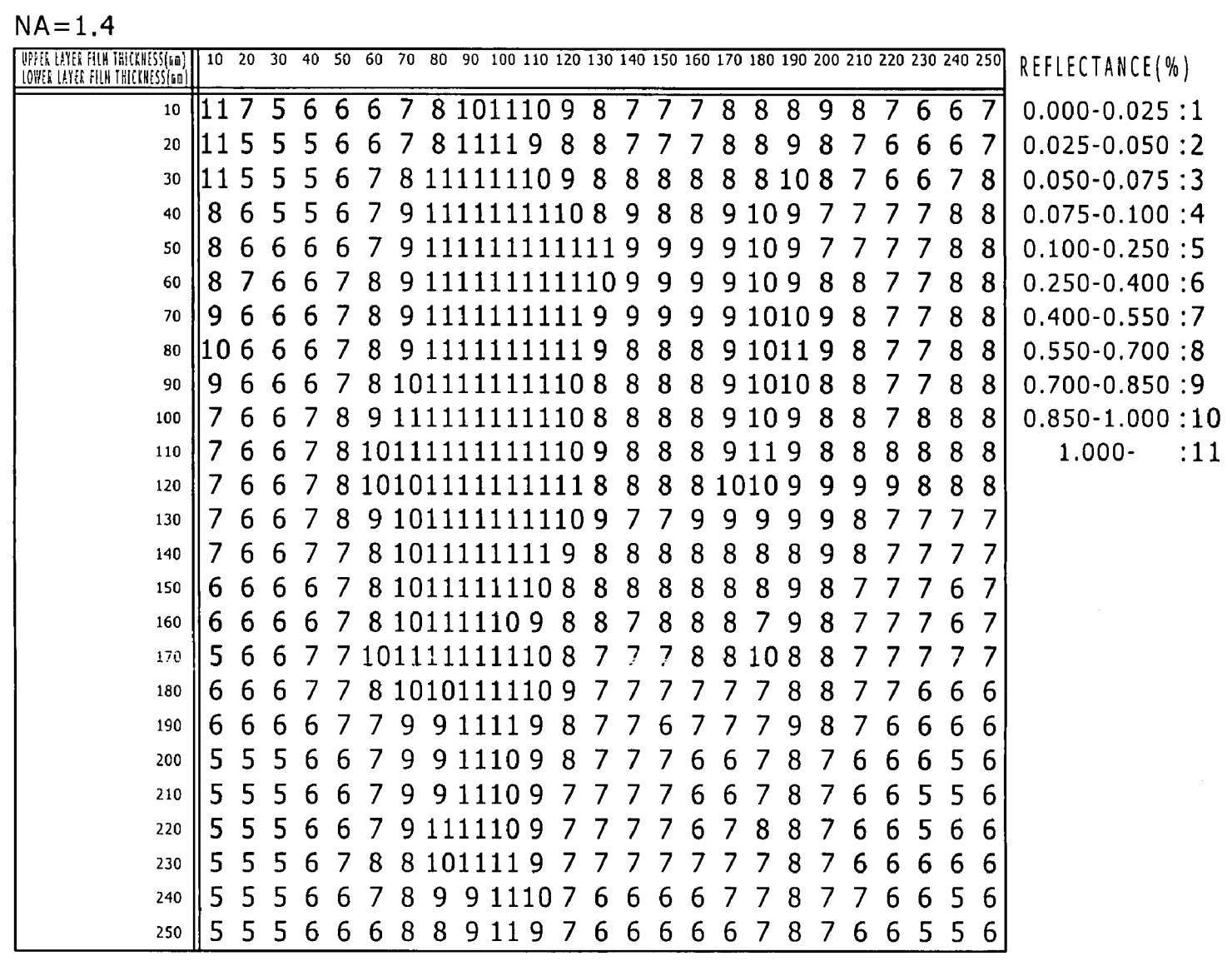

By performing optimization of the complex refractive indices of the upper layer and the lower layer of the antireflection film using the method described above for each of combinations wherein the numerical aperture NA of the exposure system is successively changed to 1.0, 1.1, 1.2, 1.3 and 1.4 and the film thickness $d_1$ of the upper layer is successively changed to increments of 10 nm from 10 nm to 250 nm while the film thickness $d_2$ of the lower layer is successively changed to increments of 10 nm from 10 nm to 250 nm in such a manner as described above, optimum complex refractive indices $N_1$ and $N_2$ for the upper layer and the lower layer were obtained. Using the complex refractive indices $N_1$ and $N_2$ of the upper layer and the lower layer obtained in this manner, maximum values among reflectances within a range from the most oblique incident angle (maximum incident angle $\theta_{in\text{-}max}$) corresponding to the numerical aperture NA of the pertaining exposure system to the vertical incident angle (minimum incident angle $\theta_{in\text{-}min}$), that is, within the overall range of the incident angle, were determined. Results of the determination are illustrated in FIGS. 1 to 5. It is to be noted that FIGS. 1 to 5 illustrate maximum values, determined from theoretical calculation, of the reflectance in the condition that the reflectance is minimized over the overall region of the incident angle (optimum complex refractive indices $N_1$ and $N_2$ of the upper layer and the lower layer) at the film thicknesses $d_1$ and $d_2$ of the upper layer and the lower layer where the numerical aperture NA of the exposure system is 1.0, 1.1, 1.2, 1.3 and 1.4, respectively.

As recognized from FIGS. 1 to 5, a film thickness condition that the maximum reflectance is equal to or less than 0.4% exists at each of the values of the numerical aperture NA.

It is to be noted that the reason why calculation for a case wherein the film thickness is greater than 250 nm was not performed is that, where the film thickness is greater than 250 nm, the work conversion difference at an etching step becomes so great that good working of a silicon semiconductor substrate cannot be anticipated.

The condition that the maximum reflectance is within a region equal to or lower than 0.4% in each of FIGS. 1 to 5 from among the film thickness conditions in which the square sum of the reflectances which is an evaluation function for optimization is minimized in each of the cases wherein the numerical aperture NA of the exposure system is set to 1.0, 1.1, 1.2, 1.3 and 1.4 and the film thickness $d_1$ of the upper layer is varied by an increment of 10 nm from 10 nm to 250 nm while the film thickness $d_2$ of the lower layer is varied by an increment from 10 nm to 250 nm is the most preferable film thickness condition. Further, corresponding complex refraction indexes of the upper and lower layers of the film thickness condition are the most preferable complex refractive indices.

Then, based on FIGS. 1 to 5, the film thickness $d_1$ of the upper layer and the film thickness $d_2$ of the lower layer were further optimized.

As a result, the most preferable combinations of the complex refractive indices and the film thickness given below were obtained. In particular, where the complex refractive index of the upper layer (layer positioned remotely from the surface of the silicon semiconductor substrate) of the two-layer antireflection film is represented by $N_1$ while the complex refractive index of the lower layer (layer formed on the surface of the silicon semiconductor substrate) is represented by $N_2$ and the complex refractive indices $N_1$ and $N_2$ are defined by $$N_1 = n_{10} - k_{10}i$$

$$N_2 = n_{20} - k_{20}i$$

and besides the film thickness (unit: nm) of the upper layer is represented by $d_{10}$ and the film thickness (unit: nm) of the lower layer is represented by $d_{20}$, combinations of values of $[n_{10}, n_{20}, k_{10}, k_{20}, d_{10}, d_{20}]$ illustrated in Table 1 and Table 2 given below are the most preferable combinations, that is, combinations with which a minimum value of the reflectance is obtained. It is to be that [case A-01] to [case A-16] are values for NA=1.0; [case B-01] to [case B-16] are values for NA=1.1; [case C-01] to [case C-14] are values for NA=1.2; [case D-01] to [case D-10] are values for NA=1.3; and [case E-01] to [case E-07] are values for NA=1.4. In the conditions described above, for NA=1.0, a minimum value of the reflectance is obtained at 16 points (16 combinations of $[n_{10}, n_{20}, k_{10}, k_{20}, d_{10}, d_{20}]$); for NA=1.1, a minimum value of the reflectance is obtained at 16 points (16 combinations of [$n_{10}$, $n_{20}$, $k_{10}$, $k_{20}$, $d_{10}$, $d_{20}$]); for NA=1.2, a minimum value of the reflectance is obtained at 14 points (14 combinations of [$n_{10}$, $n_{20}$, $k_{10}$, $k_{20}$, $d_{10}$, $d_{20}$]); for NA=1.3, a minimum value of the reflectance is obtained at 10 points (10 combinations of [$n_{10}$, $n_{20}$, $k_{10}$, $k_{20}$, $d_{10}$, $d_{20}$]); and for NA=1.4, a minimum value of the reflectance is obtained at 7 points (7 combinations of [$n_{10}$, $n_{20}$, $k_{10}$, $k_{20}$, $d_{10}$, $d_{20}$])

TABLE 1

| | Case | | | | | | | |
|---|---|---|---|---|---|---|---|---|
| | A-01 | A-02 | A-03 | A-04 | A-05 | A-06 | A-07 | A-08 |
| $n_{10}$ | 2.1616 | 1.9575 | 1.8783 | 1.8886 | 1.7671 | 1.7783 | 1.7756 | 1.7637 |
| $k_{10}$ | 0.0031 | 0.1578 | 0.1120 | 0.0972 | 0.0854 | 0.0827 | 0.0788 | |
| $d_{10}$(nm) | 16.39 | 29.70 | 22.79 | 17.43 | 89.65 | 90.09 | 89.16 | 88.60 |
| $n_{20}$ | 2.3326 | 3.1421 | 1.9535 | 1.8540 | 1.7266 | 1.9451 | 1.8813 | 1.8074 |
| $k_{20}$ | 0.9955 | 0.5540 | 0.3987 | 0.3157 | 0.6265 | 0.4110 | 0.2980 | 0.2358 |
| $d_{20}$(nm) | 21.81 | 39.99 | 133.42 | 201.01 | 35.79 | 78.70 | 136.86 | 201.53 |

| | Case | | | | | | | |
|---|---|---|---|---|---|---|---|---|
| | A-09 | A-10 | A-11 | A-12 | A-13 | A-14 | A-15 | A-16 |
| $n_{10}$ | 1.7297 | 1.7402 | 1.7416 | 1.7346 | 1.7204 | 1.7293 | 1.7290 | 1.7210 |
| $k_{10}$ | 0.0695 | 0.0705 | 0.0723 | 0.0700 | 0.0573 | 0.0638 | 0.0672 | 0.0630 |
| $d_{10}$(nm) | 159.09 | 157.00 | 154.81 | 154.48 | 226.55 | 221.51 | 219.00 | 220.18 |
| $n_{20}$ | 1.8027 | 1.9115 | 1.8276 | 1.7635 | 1.9505 | 1.9167 | 1.7992 | 1.7329 |
| $k_{20}$ | 0.6176 | 0.3647 | 0.2602 | 0.2082 | 0.6496 | 0.3426 | 0.2416 | 0.1973 |
| $d_{20}$(nm) | 30.94 | 79.38 | 140.99 | 205.63 | 25.08 | 78.00 | 142.68 | 207.16 |

| | Case | | | | | | | |
|---|---|---|---|---|---|---|---|---|
| | B-01 | B-02 | B-03 | B-04 | B-05 | B-06 | B-07 | B-08 |
| $n_{10}$ | 2.1270 | 1.9689 | 1.8874 | 1.9059 | 1.7643 | 1.7803 | 1.7743 | 1.7445 |
| $k_{10}$ | 0.0000 | 0.1461 | 0.1027 | 0.0744 | 0.0947 | 0.0868 | 0.0850 | 0.0789 |
| $d_{10}$(nm) | 17.47 | 29.67 | 21.38 | 15.49 | 94.08 | 93.23 | 91.77 | 92.02 |
| $n_{20}$ | 2.3628 | 3.1616 | 1.9199 | 1.8297 | 1.7955 | 1.9791 | 1.8636 | 1.7368 |
| $k_{20}$ | 0.9776 | 0.5440 | 0.3802 | 0.2998 | 0.6320 | 0.3951 | 0.2810 | 0.2206 |
| $d_{20}$(nm) | 21.04 | 39.98 | 139.31 | 207.65 | 32.98 | 77.05 | 139.87 | 212.33 |

| | Case | | | | | | | |
|---|---|---|---|---|---|---|---|---|
| | B-09 | B-10 | B-11 | B-12 | B-13 | B-14 | B-15 | B-16 |
| $n_{10}$ | 1.7294 | 1.7425 | 1.7364 | 1.7194 | 1.7189 | 1.7279 | 1.7039 | 1.7046 |
| $k_{10}$ | 0.0717 | 0.0762 | 0.0767 | 0.0663 | 0.0609 | 0.0714 | 0.0620 | 0.0595 |
| $d_{10}$(nm) | 166.39 | 161.95 | 160.57 | 160.35 | 240.33 | 230.11 | 268.01 | 264.54 |
| $n_{20}$ | 1.9163 | 1.9299 | 1.7865 | 1.6960 | 2.2401 | 1.8887 | 1.7359 | 1.7170 |
| $k_{20}$ | 0.6369 | 0.3467 | 0.2463 | 0.1988 | 0.7138 | 0.3299 | 0.2398 | 0.1955 |
| $d_{20}$(nm) | 26.72 | 78.23 | 145.39 | 214.32 | 17.92 | 78.86 | 158.55 | 223.28 |

TABLE 2

| | Case | | | | | | | |
|---|---|---|---|---|---|---|---|---|
| | C-01 | C-02 | C-03 | C-04 | C-05 | C-06 | C-07 | C-08 |
| $n_{10}$ | 2.1010 | 1.9972 | 1.8971 | 1.8903 | 1.7614 | 1.7825 | 1.7569 | 1.7277 |
| $k_{10}$ | 0.0000 | 0.1417 | 0.0932 | 0.1047 | 0.0933 | 0.0898 | 0.0868 | 0.0740 |
| $d_{10}$(nm) | 18.86 | 29.97 | 20.09 | 13.40 | 99.78 | 97.07 | 96.31 | 94.69 |
| $n_{20}$ | 2.3980 | 3.9849 | 1.8912 | 1.7190 | 1.8773 | 2.0041 | 1.7847 | 1.6779 |
| $k_{20}$ | 0.9577 | 0.5156 | 0.3589 | 0.2691 | 0.6361 | 0.3750 | 0.2610 | 0.2014 |
| $d_{20}$(nm) | 20.51 | 29.99 | 144.86 | 225.69 | 29.70 | 75.78 | 148.77 | 220.98 |

| | Case | | | | | |
|---|---|---|---|---|---|---|
| | C-09 | C-10 | C-11 | C-12 | C-13 | C-14 |
| $n_{10}$ | 1.7272 | 1.7147 | 1.7036 | 1.7000 | 1.7012 | 1.7028 |
| $k_{10}$ | 0.0744 | 0.0633 | 0.0666 | 0.0723 | 0.0708 | 0.0661 |
| $d_{10}$(nm) | 178.89 | 164.15 | 228.90 | 216.03 | 209.55 | 205.70 |
| $n_{20}$ | 2.1865 | 1.6838 | 2.1518 | 1.7881 | 1.7244 | 1.7099 |
| $k_{20}$ | 0.6947 | 0.1862 | 0.6409 | 0.3189 | 0.2345 | 0.1906 |
| $d_{20}$(nm) | 19.20 | 215.48 | 21.01 | 93.79 | 164.15 | 230.44 |

TABLE 2-continued

| | Case | | | | | | | |
|---|---|---|---|---|---|---|---|---|
| | D-01 | D-02 | D-03 | D-04 | D-05 | D-06 | D-07 | D-08 |
| $n_{10}$ | 2.0750 | 2.0118 | 1.8885 | 1.8806 | 1.7567 | 1.7300 | 1.7016 | 1.7036 |
| $k_{10}$ | 0.0000 | 0.1190 | 0.0999 | 0.1003 | 0.0923 | 0.0690 | 0.0665 | 0.0722 |
| $d_{10}$(nm) | 20.30 | 29.87 | 17.71 | 13.44 | 108.92 | 99.33 | 227.28 | 216.05 |
| $n_{20}$ | 2.4310 | 4.0092 | 1.7811 | 1.7062 | 2.0485 | 1.7059 | 2.1201 | 1.7959 |
| $k_{20}$ | 0.9366 | 0.5022 | 0.3211 | 0.2477 | 0.6631 | 0.1911 | 0.6392 | 0.3181 |
| $d_{20}$(nm) | 19.90 | 29.99 | 159.56 | 227.84 | 23.68 | 215.34 | 21.82 | 93.13 |

| | Case | |
|---|---|---|
| | D-09 | D-10 |
| $n_{10}$ | 1.7088 | 1.7083 |
| $k_{10}$ | 0.0700 | 0.0641 |
| $d_{10}$(nm) | 208.98 | 205.66 |
| $n_{20}$ | 1.7311 | 1.7076 |
| $k_{20}$ | 0.2343 | 0.1900 |
| $d_{20}$(nm) | 163.14 | 228.20 |

| | Case | | | | | | |
|---|---|---|---|---|---|---|---|
| | E-01 | E-02 | E-03 | E-04 | E-05 | E-06 | E-07 |
| $n_{10}$ | 2.0901 | 2.0375 | 1.8787 | 1.8780 | 1.7009 | 1.7204 | 1.7142 |
| $k_{10}$ | 0.0000 | 0.0819 | 0.1028 | 0.0706 | 0.0609 | 0.0677 | 0.0552 |
| $d_{10}$(nm) | 20.79 | 29.12 | 16.60 | 14.89 | 160.18 | 231.66 | 225.66 |
| $n_{20}$ | 2.4315 | 3.6552 | 1.7172 | 1.7467 | 1.6995 | 2.2460 | 1.7026 |
| $k_{20}$ | 0.9254 | 0.4960 | 0.2840 | 0.2361 | 0.1745 | 0.6523 | 0.1831 |
| $d_{20}$(nm) | 20.34 | 34.09 | 167.85 | 221.06 | 215.71 | 18.88 | 210.32 |

If any of the combinations of the values of [$n_{10}$, $n_{20}$, $k_{10}$, $k_{20}$, $d_{10}$, $d_{20}$] given above with which a minimum value of the reflectance is used, then the reflectance can be suppressed to 0.4% or less over the overall region of the incident angle corresponding to the pertaining numerical aperture NA of the exposure system. In other words, the combinations described above are effective combinations from the point of view that the reflectance can be made equal to or less than 0.4% even where the numerical aperture NA is smaller than the corresponding numerical aperture NA. Here, from among the combinations of the values of [$n_{10}$, $n_{20}$, $k_{10}$, $k_{20}$, $d_{10}$, $d_{20}$] given above, those combinations in the case of the numerical aperture NA=1.0 ([case A-01] to [case A-16]) are effective also where the numerical aperture NA is less than 1.0.

Meanwhile, those combinations in the case of the numerical aperture NA=1.1 ([case B-01] to [case B-16]) are effective also where the numerical aperture NA is equal to or less than 1.1, but is more preferable where the numerical aperture NA is more than 1.0 but equal to or less than 1.1. Furthermore, those combinations in the case of the numerical aperture NA=1.2 ([case C-01] to [case C-14]) are effective also where the numerical aperture NA is less than 1.2, but is more preferable where the numerical aperture NA is more than 1.1 but equal to or less than 1.2. Further, those combinations in the case of the numerical aperture NA=1.3 ([case D-01] to [case D-10]) are effective also where the numerical aperture NA is less than 1.3, but is more preferable where the numerical aperture NA is more than 1.2 but equal to or less than 1.3. Furthermore, those combinations in the case of the numerical aperture NA=1.4 ([case E-01] to [case E-07]) are effective also where the numerical aperture NA is less than 1.4, but is more preferable where the numerical aperture NA is more than 1.3 but equal to or less than 1.4.

A simulation was carried out with regard to the magnitude of variation of one of the variables of [$n_{10}$, $n_{20}$, $k_{10}$, $k_{20}$, $d_{10}$, $d_{20}$] in the combinations of the values of [$n_{10}$, $n_{20}$, $k_{10}$, $k_{20}$, $d_{10}$, $d_{20}$] given hereinabove while the remaining five variations were fixed when the reflectance exceeded 0.4%. As a result of the simulation, such variation permissible ranges indicated in Table 3 to Table 6 given below were obtained.

It is to be noted that, in the following description, $n_{1\text{-}MIN}$: minimum value of $n_{10}$ when the reflectance does not exceed 0.4%;

$n_{1\text{-}MAX}$: maximum value of $n_{10}$ when the reflectance does not exceed 0.4%;

$k_{1\text{-}MIN}$: minimum value of $k_{10}$ when the reflectance does not exceed 0.4%;

$k_{1\text{-}MAX}$: maximum value of $k_{10}$ when the reflectance does not exceed 0.4%;

$d_{1\text{-}MIN}$: minimum value of $d_{10}$ when the reflectance does not exceed 0.4%, $d_{1\text{-}MAX}$: maximum value of $d_{10}$ when the reflectance does not exceed 0.4%;

$n_{2\text{-}MIN}$: minimum value of $n_{20}$ when the reflectance does not exceed 0.4%;

$n_{2\text{-}MAX}$: maximum value of $n_{20}$ when the reflectance does not exceed 0.4%;

$k_{2\text{-}MIN}$: minimum value of $k_{20}$ when the reflectance does not exceed 0.4%;

$k_{2\text{-}MAX}$: maximum value of $k_{20}$ when the reflectance does not exceed 0.4%;

$d_{2\text{-}MIN}$: minimum value of $d_{20}$ when the reflectance does not exceed 0.4%;

$d_{2\text{-}MAX}$: maximum value of $d_{20}$ when the reflectance does not exceed 0.4%.

Further, [case A-01] to [case A-16] are values for NA=1.0; [case B-01] to [case B-16] are values for NA=1.1; [case C-01] to [case C-14] are values for NA=1.2; [case D-01] to [case D-10] are values for NA=1.3; and [case E-01] to [case E-07] are values for NA=1.4.

TABLE 3

| | Case | | | | | | |
|---|---|---|---|---|---|---|---|
| | A-01 | A-02 | A-03 | CA-04 | A-05 | A-06 | A-07 |
| $n_{1-MAX}$ | 2.2660 | 2.0526 | 1.9695 | 1.9914 | 1.8452 | 1.8547 | 1.8491 |
| $n_{1-MIN}$ | 2.0674 | 1.8816 | 1.8041 | 1.8047 | 1.7221 | 1.7290 | 1.7286 |
| $k_{1-MAX}$ | 0.1058 | 0.2476 | 0.1956 | 0.1790 | 0.1791 | 0.1675 | 0.1627 |
| $k_{1-MIN}$ | 0.0000 | 0.0772 | 0.0266 | 0.0000 | 0.0475 | 0.0321 | 0.0280 |
| $d_{1-MAX}$(nm) | 19.64 | 35.17 | 31.59 | 26.35 | 108.00 | 108.98 | 109.36 |
| $d_{1-MIN}$(nm) | 13.49 | 25.28 | 16.46 | 11.04 | 81.48 | 80.83 | 80.19 |
| $n_{2-MAX}$ | 2.4717 | 3.2954 | 2.1133 | 2.0045 | 1.8644 | 2.0858 | 2.0287 |
| $n_{2-MIN}$ | 2.1929 | 2.9698 | 1.7768 | 1.6777 | 1.5730 | 1.7991 | 1.7335 |
| $k_{2-MAX}$ | 1.1482 | 0.7497 | 0.6196 | 0.4975 | 0.7644 | 0.5849 | 0.5031 |
| $k_{2-MIN}$ | 0.8579 | 0.4177 | 0.2781 | 0.2069 | 0.4915 | 0.2966 | 0.2049 |
| $d_{2-MAX}$(nm) | 25.55 | 42.99 | ∞ | ∞ | 43.06 | 90.20 | ∞ |
| $d_{2-MIN}$(nm) | 18.70 | 37.27 | 75.37 | 118.11 | 29.14 | 68.53 | 118.11 |

| | Case | | | | | | |
|---|---|---|---|---|---|---|---|
| | A-08 | A-09 | A-10 | A-11 | A-12 | A-13 | A-14 |
| $n_{1-MAX}$ | 1.8363 | 1.8086 | 1.8145 | 1.8128 | 1.8044 | 1.8037 | 1.8053 |
| $n_{1-MIN}$ | 1.7192 | 1.6900 | 1.6996 | 1.7051 | 1.7002 | 1.6700 | 1.6857 |
| $k_{1-MAX}$ | 0.1158 | 0.1537 | 0.1529 | 0.1493 | 0.1428 | 0.1449 | 0.1450 |
| $k_{1-MIN}$ | 0.0215 | 0.0304 | 0.0296 | 0.0310 | 0.0277 | 0.0218 | 0.0296 |
| $d_{1-MAX}$(nm) | 112.80 | ∞ | 193.81 | 194.11 | ∞ | ∞ | ∞ |
| $d_{1-MIN}$(nm) | 79.23 | 146.42 | 145.32 | 144.88 | 144.10 | 147.03 | 206.52 |
| $n_{2-MAX}$ | 1.9635 | 1.9536 | 2.0439 | 1.9727 | 1.9440 | 2.1270 | 2.0463 |
| $n_{2-MIN}$ | 1.6573 | 1.6453 | 1.7648 | 1.6802 | 1.6149 | 1.7784 | 1.7598 |
| $k_{2-MAX}$ | 0.4587 | 0.7451 | 0.5149 | 0.1493 | 0.4167 | 0.7867 | 0.4807 |
| $k_{2-MIN}$ | 0.1553 | 0.4826 | 0.2558 | 0.0310 | 0.1340 | 0.4991 | 0.2325 |
| $d_{2-MAX}$(nm) | ∞ | 36.88 | 89.13 | ∞ | ∞ | 30.06 | 87.34 |
| $d_{2-MIN}$(nm) | 131.91 | 25.32 | 69.56 | 126.07 | 175.09 | 20.53 | 70.06 |

| | Case | |
|---|---|---|
| | A-15 | A-16 |
| $n_{1-MAX}$ | 1.8030 | 1.7917 |
| $n_{1-MIN}$ | 1.6894 | 1.6626 |
| $k_{1-MAX}$ | 0.1411 | 0.1377 |
| $k_{1-MIN}$ | 0.0354 | 0.0303 |
| $d_{1-MAX}$(nm) | ∞ | ∞ |
| $d_{1-MIN}$(nm) | 206.86 | 147.71 |
| $n_{2-MAX}$ | 1.9388 | 1.9597 |
| $n_{2-MIN}$ | 1.6376 | 1.5656 |
| $k_{2-MAX}$ | 0.4185 | 0.3989 |
| $k_{2-MIN}$ | 0.1559 | 0.1211 |
| $d_{2-MAX}$(nm) | ∞ | ∞ |
| $d_{2-MIN}$(nm) | 130.30 | 174.03 |

TABLE 4

| | Case | | | | | | |
|---|---|---|---|---|---|---|---|
| | B-01 | B-02 | B-03 | B-04 | B-05 | B-06 | B-07 |
| $n_{1-MAX}$ | 2.2256 | 2.0568 | 1.9734 | 2.0082 | 1.8353 | 1.8462 | 1.8349 |
| $n_{1-MIN}$ | 2.0472 | 1.9010 | 1.8223 | 1.8296 | 1.7330 | 1.7475 | 1.7473 |
| $k_{1-MAX}$ | 0.0938 | 0.2244 | 0.1768 | 0.1635 | 0.1575 | 0.1496 | 0.1408 |
| $k_{1-MIN}$ | 0.0000 | 0.0685 | 0.0175 | 0.0000 | 0.0495 | 0.0394 | 0.0374 |
| $d_{1-MAX}$(nm) | 20.80 | 34.77 | 29.62 | 23.26 | 112.91 | 109.31 | 108.27 |
| $d_{1-MIN}$(nm) | 14.63 | 25.76 | 16.06 | 10.49 | 87.82 | 87.00 | 86.56 |
| $n_{2-MAX}$ | 2.4916 | 3.3028 | 2.0581 | 1.9623 | 1.9074 | 2.1009 | 1.9987 |
| $n_{2-MIN}$ | 2.2319 | 3.0031 | 1.7577 | 1.6665 | 1.6538 | 1.8504 | 1.7392 |
| $k_{2-MAX}$ | 1.1151 | 0.7242 | 0.5735 | 0.4524 | 0.7450 | 0.5318 | 0.4468 |
| $k_{2-MIN}$ | 0.8400 | 0.4156 | 0.2710 | 0.2013 | 0.5085 | 0.2922 | 0.2015 |
| $d_{2-MAX}$(nm) | 24.36 | 42.69 | ∞ | ∞ | 38.62 | 85.43 | ∞ |
| $d_{2-MIN}$(nm) | 18.21 | 37.46 | 80.09 | 126.81 | 27.34 | 68.38 | 126.05 |

| | Case | | | | | | |
|---|---|---|---|---|---|---|---|
| | B-08 | B-09 | B-10 | B-11 | B-12 | B-13 | B-14 |
| $n_{1-MAX}$ | 1.8028 | 1.8016 | 1.8041 | 1.7918 | 1.7729 | 1.7932 | 1.7879 |
| $n_{1-MIN}$ | 1.7193 | 1.7039 | 1.7237 | 1.7262 | 1.6947 | 1.6903 | 1.7176 |

TABLE 4-continued

|  | | | | | | | |
|---|---|---|---|---|---|---|---|
| $k_{1-MAX}$ | 0.1323 | 0.1330 | 0.1299 | 0.1172 | 0.1176 | 0.1266 | 0.1177 |
| $k_{1-MIN}$ | 0.0301 | 0.0370 | 0.0455 | 0.0534 | 0.0312 | 0.0317 | 0.0558 |
| $d_{1-MAX}$(nm) | 115.67 | 209.20 | 195.88 | 198.97 | ∞ | ∞ | ∞ |
| $d_{1-MIN}$(nm) | 85.73 | 157.85 | 156.76 | 157.73 | 149.13 | 225.89 | 226.73 |
| $n_{2-MAX}$ | 1.8971 | 2.0476 | 2.0364 | 1.8969 | 1.9046 | 2.4255 | 2.0020 |
| $n_{2-MIN}$ | 1.6175 | 1.7703 | 1.8051 | 1.6706 | 1.5895 | 2.0733 | 1.8277 |
| $k_{2-MAX}$ | 0.3623 | 0.7342 | 0.4294 | 0.3435 | 0.2910 | 0.8416 | 0.3876 |
| $k_{2-MIN}$ | 0.1499 | 0.5070 | 0.2516 | 0.1729 | 0.1351 | 0.5371 | 0.2258 |
| $d_{2-MAX}$(nm) | ∞ | 31.20 | 85.58 | 161.62 | ∞ | 21.50 | 87.70 |
| $d_{2-MIN}$(nm) | 181.56 | 22.38 | 72.33 | 139.39 | 187.96 | 15.15 | 76.00 |

| | Case | |
|---|---|---|
|  | B-15 | B-16 |
| $n_{1-MAX}$ | 1.7579 | 1.7716 |
| $n_{1-MIN}$ | 1.6407 | 1.6465 |
| $k_{1-MAX}$ | 0.1322 | 0.1321 |
| $k_{1-MIN}$ | 0.0228 | 0.0178 |
| $d_{1-MAX}$(nm) | ∞ | ∞ |
| $d_{1-MIN}$(nm) | 223.91 | 160.48 |
| $n_{2-MAX}$ | 1.9149 | 2.1001 |
| $n_{2-MIN}$ | 1.4543 | 1.4760 |
| $k_{2-MAX}$ | 0.4261 | 0.4081 |
| $k_{2-MIN}$ | 0.1424 | 0.1085 |
| $d_{2-MAX}$(nm) | ∞ | ∞ |
| $d_{2-MIN}$(nm) | 129.53 | 143.86 |

TABLE 5

| | Case | | | | | | |
|---|---|---|---|---|---|---|---|
|  | C-01 | C-02 | C-03 | C-04 | C-05 | C-06 | C-07 |
| $n_{1-MAX}$ | 2.1902 | 2.0806 | 1.9757 | 1.9938 | 1.8213 | 1.8327 | 1.7995 |
| $n_{1-MIN}$ | 2.0333 | 1.9400 | 1.8442 | 1.8243 | 1.7445 | 1.7698 | 1.7544 |
| $k_{1-MAX}$ | 0.0791 | 0.2081 | 0.1538 | 0.1917 | 0.1313 | 0.1223 | 0.0982 |
| $k_{1-MIN}$ | 0.0000 | 0.0680 | 0.0073 | 0.0023 | 0.0538 | 0.0533 | 0.0642 |
| $d_{1-MAX}$(nm) | 22.17 | 34.24 | 27.46 | 20.29 | 118.37 | 109.28 | 111.91 |
| $d_{1-MIN}$(nm) | 16.20 | 26.95 | 16.03 | 9.40 | 96.05 | 94.62 | 95.76 |
| $n_{2-MAX}$ | 2.5150 | 4.1060 | 2.0062 | 1.8367 | 1.9517 | 2.0899 | 1.8293 |
| $n_{2-MIN}$ | 2.2758 | 3.8579 | 1.7470 | 1.5737 | 1.7548 | 1.9035 | 1.6980 |
| $k_{2-MAX}$ | 1.0902 | 0.6644 | 0.5181 | 0.3688 | 0.7101 | 0.4366 | 0.3015 |
| $k_{2-MIN}$ | 0.8269 | 0.4039 | 0.2637 | 0.1833 | 0.5274 | 0.2899 | 0.2021 |
| $d_{2-MAX}$(nm) | 23.39 | 31.19 | ∞ | ∞ | 33.13 | 81.59 | 161.61 |
| $d_{2-MIN}$(nm) | 17.92 | 28.87 | 85.53 | 141.88 | 25.36 | 70.00 | 146.51 |

| | Case | | | | | | |
|---|---|---|---|---|---|---|---|
|  | C-08 | C-09 | C-10 | C-11 | C-12 | C-13 | C-14 |
| $n_{1-MAX}$ | 1.7711 | 1.7845 | 1.7573 | 1.7333 | 1.7203 | 1.7336 | 1.7514 |
| $n_{1-MIN}$ | 1.7097 | 1.7167 | 1.6822 | 1.6243 | 1.6387 | 1.6472 | 1.6539 |
| $k_{1-MAX}$ | 0.1152 | 0.1077 | 0.1011 | 0.1086 | 0.1103 | 0.1181 | 0.1191 |
| $k_{1-MIN}$ | 0.0321 | 0.0488 | 0.0264 | 0.0356 | 0.0460 | 0.0368 | 0.0268 |
| $d_{1-MAX}$(nm) | 114.36 | 218.45 | ∞ | ∞ | 227.26 | 237.88 | ∞ |
| $d_{1-MIN}$(nm) | 89.11 | 175.03 | 147.22 | 181.97 | 190.09 | 179.63 | 173.04 |
| $n_{2-MAX}$ | 1.7201 | 2.2837 | 1.7321 | 2.3031 | 1.9012 | 1.8497 | 1.8964 |
| $n_{2-MIN}$ | 1.5934 | 2.0604 | 1.6046 | 2.0795 | 1.7532 | 1.6568 | 1.5385 |
| $k_{2-MAX}$ | 0.2464 | 0.7527 | 0.2137 | 0.7063 | 0.3281 | 0.3333 | 0.3179 |
| $k_{2-MIN}$ | 0.1479 | 0.5549 | 0.1380 | 0.5137 | 0.2264 | 0.1529 | 0.1170 |
| $d_{2-MAX}$(nm) | ∞ | 21.11 | 235.37 | 24.52 | 111.38 | ∞ | ∞ |
| $d_{2-MIN}$(nm) | 196.47 | 16.79 | 195.03 | 19.07 | 89.55 | 150.63 | 157.43 |

TABLE 6

| | Case | | | | | | |
|---|---|---|---|---|---|---|---|
|  | D-01 | D-02 | D-03 | D-04 | D-05 | D-06 | D-07 |
| $n_{1-MAX}$ | 2.1541 | 2.0844 | 1.9589 | 1.9713 | 1.7997 | 1.7599 | 1.7325 |
| $n_{1-MIN}$ | 2.0215 | 1.9638 | 1.8538 | 1.8291 | 1.7557 | 1.7290 | 1.6697 |
| $k_{1-MAX}$ | 0.0610 | 0.1705 | 0.1459 | 0.1729 | 0.0954 | 0.0744 | 0.1071 |
| $k_{1-MIN}$ | 0.0000 | 0.0518 | 0.0187 | 0.0078 | 0.0655 | 0.0522 | 0.0350 |

TABLE 6-continued

| | | | | | | | |
|---|---|---|---|---|---|---|---|
| $d_{1-MAX}$(nm) | 23.54 | 33.58 | 23.82 | 19.76 | 125.01 | 114.51 | 249.66 |
| $d_{1-MIN}$(nm) | 18.03 | 27.42 | 15.13 | 10.09 | 108.67 | 98.99 | 206.91 |
| $n_{2-MAX}$ | 2.5291 | 4.1084 | 1.8635 | 1.7809 | 2.0547 | 1.7114 | 2.2630 |
| $n_{2-MIN}$ | 2.3203 | 3.9019 | 1.6624 | 1.5899 | 1.9572 | 1.6501 | 2.0448 |
| $k_{2-MAX}$ | 1.0610 | 0.6325 | 0.4092 | 0.3139 | 0.6691 | 0.1929 | 0.7020 |
| $k_{2-MIN}$ | 0.8178 | 0.4040 | 0.2433 | 0.1776 | 0.5710 | 0.1524 | 0.5119 |
| $d_{2-MAX}$(nm) | 22.43 | 30.97 | ∞ | ∞ | 23.86 | 219.55 | 25.26 |
| $d_{2-MIN}$(nm) | 17.62 | 29.03 | 129.86 | 149.42 | 21.22 | 205.88 | 19.68 |

| | Case | | |
|---|---|---|---|
| | D-08 | D-09 | D-10 |
| $n_{1-MAX}$ | 1.7213 | 1.7343 | 1.7487 |
| $n_{1-MIN}$ | 1.6816 | 1.6905 | 1.6839 |
| $k_{1-MAX}$ | 0.1083 | 0.1002 | 0.0965 |
| $k_{1-MIN}$ | 0.0475 | 0.0408 | 0.0326 |
| $d_{1-MAX}$(nm) | 226.44 | 234.14 | ∞ |
| $d_{1-MIN}$(nm) | 203.38 | 198.02 | 187.04 |
| $n_{2-MAX}$ | 1.9107 | 1.8583 | 1.8700 |
| $n_{2-MIN}$ | 1.7644 | 1.6757 | 1.5497 |
| $k_{2-MAX}$ | 0.3809 | 0.3287 | 0.3066 |
| $k_{2-MIN}$ | 0.2256 | 0.1573 | 0.1188 |
| $d_{2-MAX}$(nm) | 110.64 | ∞ | ∞ |
| $d_{2-MIN}$(nm) | 89.45 | 150.12 | 160.78 |

| | Case | | | | | | |
|---|---|---|---|---|---|---|---|
| | E-01 | E-02 | E-03 | E-04 | E-05 | E-06 | E-07 |
| $n_{1-MAX}$ | 2.1532 | 2.0916 | 1.9323 | 1.9461 | 1.7131 | 1.7346 | 1.7449 |
| $n_{1-MIN}$ | 2.0485 | 1.9946 | 1.8625 | 1.8482 | 1.6965 | 1.7142 | 1.7015 |
| $k_{1-MAX}$ | 0.0301 | 0.1157 | 0.1287 | 0.1125 | 0.0797 | 0.0791 | 0.0776 |
| $k_{1-MIN}$ | 0.0000 | 0.0234 | 0.0358 | 0.0000 | 0.0529 | 0.0480 | 0.0279 |
| $d_{1-MAX}$(nm) | 23.53 | 31.97 | 21.01 | 20.40 | 168.49 | 241.66 | 269.84 |
| $d_{1-MIN}$(nm) | 19.45 | 27.24 | 15.35 | 12.65 | 156.71 | 227.75 | 215.83 |
| $n_{2-MAX}$ | 2.4915 | 3.7301 | 1.7470 | 1.7894 | 1.7056 | 2.3315 | 1.8141 |
| $n_{2-MIN}$ | 2.3369 | 3.5977 | 1.6335 | 1.6492 | 1.6786 | 2.2068 | 1.6257 |
| $k_{2-MAX}$ | 1.0253 | 0.5706 | 0.3145 | 0.2771 | 0.1981 | 0.6941 | 0.2591 |
| $k_{2-MIN}$ | 0.8408 | 0.4125 | 0.2297 | 0.1801 | 0.1502 | 0.5188 | 0.1258 |
| $d_{2-MAX}$(nm) | 22.48 | 35.05 | ∞ | ∞ | 219.96 | 20.91 | ∞ |
| $d_{2-MIN}$(nm) | 18.31 | 33.41 | 144.47 | 152.04 | 200.15 | 17.96 | 186.01 |

The combinations of the values of [$n_{10}$, $n_{20}$, $k_{10}$, $k_{20}$, $d_{10}$, $d_{20}$] are combinations which minimize the reflectances over the overall region of the incident angle corresponding to the corresponding numerical aperture NA of the exposure system. In particular, where the evaluation function for the minimization is represented by f, the evaluation function f is a function of $n_{10}$, $n_{20}$, $k_{10}$, $k_{20}$, $d_{10}$ and $d_{20}$, and the combinations which minimize the $f(n_{10}, n_{20}, k_{10}, k_{20}, d_{10}, d_{20})$ is such combinations of the values of [$n_{10}$, $n_{20}$, $k_{10}$, $k_{20}$, $d_{10}$, $d_{20}$] as given hereinabove. In other words, the evaluation function f is minimized with such combinations of the values of [$n_{10}$, $n_{20}$, $k_{10}$, $k_{20}$, $d_{10}$, $d_{20}$] as given hereinabove.

Generally, where the evaluation function $f(x_i)$ (i=0, 1, 2, ..., n) exhibits a minimum value at $x_i = x_{i-MIN}$, in the proximity of the minimum value, the evaluation function $f(x_i)$ can be represented by the following expression (1):

$$f(x_i) = \Sigma a_i (x_i - x_{i-MIN})^2 + b \quad (1)$$

In other words, the evaluation function $f(x_i)$ can be approximated with a quadratic function. It is to be noted that the symbol "Σ" signifies the sum total for i=0, 1, 2, ..., n. This similarly applies also to the expression (2).

In this instance, a condition that the evaluation function $f(x_i)$ is smaller than a fixed number c which is greater than b can be represented by an elliptic function of the following expression (2):

$$\Sigma (x_i - x_{1-MIN})^2 / (x_{i-c} - x_{i-MIN})_2 \leq 1 \quad (2)$$

where $x_{i-c}$ is the value of $x_i$ with which $f(x_i) = c$ is obtained when all of the other variables are fixed while only $x_i$ is varied.

Therefore, if $n_{10}$, $n_{20}$, $k_{10}$, $k_{20}$, $d_{10}$ and $d_{20}$ which satisfy the following expression (3) using values of $n_{1-MAX}$, $n_{1-MIN}$, $k_{1-MAX}$, $k_{1-MIN}$, $d_{1-MAX}$, $d_{1-MIN}$, $n_{2-MAX}$, $n_{2-MIN}$, $k_{2-MAX}$, $k_{2-MIN}$, $d_{2-MAX}$ and $d_{2-MIN}$ which are values with which the reflectance of 0.4% is obtained when only one of the variables is varied while the other variables are fixed are adopted, then the reflectance does not exceed 0.4%.

$$\{(n_1-n_{10})/(n_{1m}-n_{10})\}^2 + \{(k_1-k_{10})/(k_{1m}-k_{10})\}^2 + \{(d_1-d_{10})/(d_{1m}-d_{10})\}^2 + \{(n_2-n_{20})/(n_{2m}-n_{20})\}^2 + \{(k_2-k_{20})/(k_{2m}-k_{20})\}^2 + \{(d_2-d_{20})/(d_{2m}-d_{20})\}^2 \leq 1 \quad (3)$$

where $n_{1m}$, $k_{1m}$, $d_{1m}$, $n_{2m}$, $k_{2m}$ and $d_{2m}$ assume the following values:

$n_{1m}$: for $n_1 \geq n_{10}$, $n_{1-MAX}$, for $n_1 < n_{10}$, $n_{1-MIN}$ $k_{1m}$: for $k_1 \geq k_{10}$, $k_{1-MAX}$, for $k_1 < k_{10}$, $k_{1-MIN}$ $d_{1m}$: for $d_1 \geq d_{10}$, $d_{1-max}$, for $d_1 < d_{10}$, $d_{1-MIN}$ $n_{2m}$: for $n_2 \geq n_{20}$, $n_{2-MAX}$, for $n_2 < n_{20}$, $n_{2-MIN}$ $k_{2m}$: for $k_2 \geq k_{20}$, $k_{2-MAX}$, for $k_2 < k_{20}$, $k_{2-MIN}$ $d_{2m}$: for $d_2 \geq d_{20}$, $d_{2-MAX}$, for $d_2 < d_{20}$, $d_{2-MIN}$ It is to be noted that the reason why the values of $n_{1m}$, $k_{1m}$, $d_{1m}$, $n_{2m}$, $k_{2m}$ and $d_{2m}$ are separated depending upon the relationship in magnitude where $n_1$, $n_2$, $k_1$, $k_2$, $d_1$ and $d_2$ are compared with $n_{10}$, $n_{20}$, $k_{10}$, $k_{20}$, $d_{10}$ and $d_{20}$, respectively, is that, since $$n_{1\text{-}MAX}\text{-}n_{10}=n_{10}\text{-}n_{1\text{-}MIN}$$

$$k_{1\text{-}MAX}\text{-}k_{10}=k_{10}\text{-}k_{1\text{-}MIN}$$

$$d_{1\text{-}MAX}\text{-}d_{10}=d_{10}\text{-}d_{1\text{-}MIN}$$

$$n_{2\text{-}MAX}\text{-}n_{20}=n_{20}\text{-}n_{2\text{-}MIN}$$

$$k_{2\text{-}MAX}\text{-}k_{20}=k_{20}\text{-}k_{2\text{-}MIN}$$

$$d_{2\text{-}MAX}\text{-}d_{20}=d_{20}\text{-}d_{2\text{-}MIN}$$

are not always satisfied, the definition of an ellipsoid defined by the expression (2) given above is separated depending upon the relationship in magnitude when $n_1$, $n_2$, $k_1$, $k_2$, $d_1$ and $d_2$ are compared with $n_{10}$, $n_{20}$, $k_{10}$, $k_{20}$, $d_{10}$ and $d_{20}$, respectively. In other words, this is because the curvature of an ellipsoid exhibits different values, for example, whether $n_1 \geq n_{10}$ or $n_1 < n_{10}$, and this similarly applies also to $k_{10}$, $d_{10}$, $n_{20}$, $k_{20}$ and $d_{20}$.

Thus, where, as a combination of values of $[n_{10}, n_{20}, k_{10}, k_{20}, d_{10}, d_{20}]$, for $NA \leq 1.0$, one of the case [1-01] to the case [1-16],
for $1.0 < NA \leq 1.1$, one of the case [2-01] to the case [2-16],
for $1.1 < NA \leq 1.2$, one of the case [3-01] to the case [3-14],
for $1.2 < NA \leq 1.3$, one of the case [4-01] to the case [4-10], or
for $1.3 < NA \leq 1.4$, one of the case [5-01] to the case [5-07]

is adopted, it is guaranteed that the reflectance does not exceed 0.4%. Besides, where the value of $n_{1m}$ for the pertaining case is adopted based on the relationship in magnitude between $n_1$ and $n_{10}$,
the value of $k_{1m}$ for the pertaining case is adopted based on the relationship in magnitude between $k_1$ and $k_{10}$,
the value of $d_{1m}$ for the pertaining case is adopted based on the relationship in magnitude between $d_1$ and $d_{10}$,
the value of $n_{2m}$ for the pertaining case is adopted based on the relationship in magnitude between $n_2$ and $n_{20}$,
the value of $k_{2m}$ for the pertaining case is adopted based on the relationship in magnitude between $k_2$ and $k_{20}$, and
the value of $d_{2m}$ for the pertaining case is adopted based on the relationship in magnitude between $d_2$ and $d_{20}$, if $n_1$ is within the range between the maximum value ($n_{1\text{-}MAX}$) and the minimum value ($n_{1\text{-}MIN}$) of $n_{1m}$ for the pertaining case,
$k_1$ is within the range between the maximum value ($k_{1\text{-}MAX}$) and the minimum value ($k_{1\text{-}MIN}$) of $k_{1m}$ for the pertaining case,
$d_1$ is within the range between the maximum value ($d_{1\text{-}MAX}$) and the minimum value ($d_{1\text{-}MIN}$) of $d_{1m}$ for the pertaining case,
$n_2$ is within the range between the maximum value ($n_{2\text{-}MAX}$) and the minimum value ($n_{2\text{-}MIN}$) of $n_{2m}$ for the pertaining case,
$k_2$ is within the range between the maximum value ($k_{2\text{-}MAX}$) and the minimum value ($k_{2\text{-}MIN}$) of $k_{2m}$ for the pertaining case, and
$d_2$ is within the range between the maximum value ($d_{2\text{-}MAX}$) and the minimum value ($d_{2\text{-}MIN}$) of $d_{2m}$ for the pertaining case, then it is guaranteed that the reflectance of the antireflection film from the silicon semiconductor substrate does not exceed 0.4%. As a result, a good resist pattern can be obtained.

In other words, where a six-dimensional ellipsis whose center is given by ($n_{10}$, $n_{20}$, $k_{10}$, $k_{20}$, $d_{10}$, $d_{20}$) and whose diameter is defined by six variables of ($n_1$, $k_1$, $d_1$, $n_2$, $k_2$, $d_2$) which are absolute values of ($n_{1m}$-$n_{10}$), ($k_{1m}$-$k_{10}$), ($d_{1m}$-$d_{10}$), ($n_{2m}$-$n_{20}$), ($k_{2m}$-$k_{20}$), ($d_{2m}$-$d_{20}$), respectively, is assumed, if a combination of arbitrary values of $n_1$, $k_1$, $d_1$, $n_2$, $k_2$, $d_2$ within the range of the inside of the ellipsis is selected, then the reflectance of the antireflection film can be suppressed to 0.4% or less.

EXAMPLES

Two-layer antireflection films having reflectances and film thicknesses indicated in Table 7 and hereinafter described were formed on the surface of a silicon semiconductor substrate by a plasma enhanced CVD method disclosed in Japanese Patent 2001-242630, K. Babich et al., Proceedings of SPIE 2003, 5039, 152 and so forth.

It is to be noted that the plasma enhanced CVD method is a film formation method which is carried out in a parallel electrode reactor as explained in detail in the documents mentioned above, and a silicon semiconductor substrate is placed on one of the electrodes. A negative bias is applied from the electrode to the silicon semiconductor substrate, and layers having various values of the complex refractive index can be formed by controlling the pressure in the reactor, the type (tetramethylsilane, trimethylsilane, tetramethyltetrasiloxane, tetramethylgermane, oxygen or the like) and the flow rate of a reaction precursor to be introduced into the reactor and the substrate temperature.

It is to be noted that, in Table 7, examples 1 to 7 represent antireflection films which satisfy the conditions of the present invention while a comparative example 1 and comparative examples 2 to 4 represent antireflection films for comparison which do not satisfy the conditions of the present invention.

More particularly, the examples 1 and 6 are antireflection films which satisfy the conditions of the present invention where the numerical aperture NA of the exposure system is within the range of $NA \leq 1.0$, and the examples 2 and 7 are antireflection films which satisfy the conditions of the present invention where the numerical aperture NA of the exposure system is within the range of $1.0 < NA \leq 1.1$. Meanwhile, the example 3 is an antireflection film which satisfies the conditions of the present invention where the numerical aperture NA of the exposure system is within the range of $1.1 < NA \leq 1.2$, and the example 4 is an antireflection film which satisfies the conditions of the present invention where the numerical aperture NA of the exposure system is within the range of $1.2 < NA \leq 1.3$. Further, the example 5 is an antireflection film which satisfies the conditions of the present invention where the numerical aperture NA of the exposure system is within the range of $1.3 < NA \leq 1.4$. In all of the antireflection films of the examples 1 to 7 and the comparative examples 1 to 4 described below, the upper layer and the lower layer are formed from a material of SiCOH. It is to be noted that the complex refractive index of each film was measured using an ellipsometer by SOPRA.

The comparative example 1 is an antireflection film which satisfies none of the conditions of the present invention where the numerical aperture NA of the exposure system is within the range of $NA \leq 1.0$ and the conditions of the present invention where the numerical aperture NA of the exposure system is within the range of $1.0 < NA \leq 1.1$. Meanwhile, the comparative examples 2, 3 and 4 are antireflection films which do not satisfy the conditions of the present invention where the numerical aperture NA of the exposure system is within the ranges of $1.1 < NA \leq 1.2$, $1.2 < NA \leq 1.3$, and $1.3 < NA \leq 1.4$, respectively.

A photoresist ARX2014J by JSR was spin coated to a film thickness of 100 nm as a resist layer on the two-layer antireflection film of the examples 1 to 7 and the comparative examples 1 to 4, and then a baking process was performed for 60 seconds at 20° C. Then, a top coat material TCX001 by JSR was spin coated to a film thickness of 30 nm. Thereafter, a baking process was performed for the entire films for 30 seconds at 100° C.

Any of the samples produced in such a manner as described above was exposed by a two-beam interference exposure apparatus. The two-beam interference exposure apparatus uses an ArF excimer laser as a light source and includes a prism having a triangular or pentagonal cross section and disposed on a light path of the laser. The sample was disposed below the lower face of the prism such that the distance between the sample and the lower face of the prism was 1 mm. For example, where a prism having a triangular cross section is used, a vertex of the prism is disposed at a central location of the light path of the laser, and the face of the prism opposing to the vertex is determined as the lower face. If a laser beam is illuminated on the prism from above the prism toward the lower face of the prism, then the laser beam incident to the two side faces of the prism is refracted by the side faces relying upon the angles between the side faces and the incident laser beam and changes the direction of the light path thereof so that it is split into two laser beams. The two laser beam portions from the two side faces having different advancing directions intersect and interfere with each other on the lower face of the prism thereby to form a periodic optical intensity distribution on the sample. Consequently, the resist layer can be sensitized.

Then, the angles between the side faces of the prism and the incident laser beam can be varied by using various prisms having various different vertical angles as the prism, and an optical intensity distribution having an arbitrary pitch can be obtained on the sample below the lower face of the prism. Since the resist layer is resolved in accordance with the optical intensity distribution, if only the shape of the prism is changed in the exposure method, then a line and space pattern of an arbitrary pitch can be obtained.

Liquid immersion exposure in which water was used as the liquid for liquid immersion by introducing water into the gap of 1 mm between the sample and the prism making use of a capillarity.

Further, five different prisms were prepared for the two-beam interference exposure test. The five prisms have numerical apertures NA of 0.75, 1.06, 1.15, 1.22 and 1.39.

For the examples 1 and 6, the prism whose numerical aperture NA is 0.75 was used for the exposure; for the examples 2 and 7, the prism whose numerical aperture NA is 1.06 was used; for the example 3, the prism whose numerical aperture NA is 1.15 was used; for the example 4, the prism whose numerical aperture NA is 1.22 was used; and for the example 5, the prism whose numerical aperture NA is 1.39 was used.

Meanwhile, for the comparative example 1, the prism whose numerical aperture NA is 1.06 was used for the exposure; for the comparative example 2, the prism whose numerical aperture NA is 1.15 was used; for the comparative example 3, the prism whose numerical aperture NA is 1.22 was used; and for the comparative example 4, the prism whose numerical aperture NA is 1.39 was used.

A baking process was applied for 90 seconds at 120° C. to the samples after the exposure, and then development was performed with a standard developer made of 2.38% TMAH (tetramethyl ammonium hydroxide) to produce samples for resist pattern observation. The shape observation of the resist layer was performed by dividing the silicon semiconductor substrate and observing the cross section using a scanning electron microscope.

As a result of the observation, any sample whose resist pattern has a good rectangular cross section is indicated by a round mark "o" while any sample whose resist pattern does not have a good rectangular cross section is indicated by a cross mark "x" in Table 7.

TABLE 7

| | | Upperlayer Double Refractive Index $N_1$ $N_1 = n_1 - k_1 i$ | | Upperlayer Film thickness (nm) | Lowerlayer Double refractive Index $N_2$ $N_2 = n_2 - k_2 i$ | | Lowerlayer Film thickness (nm) | Conversion numerical aperture | Sectional pattern |
|---|---|---|---|---|---|---|---|---|---|
| | Case | $n_1$ | $k_1$ | $d_1$ | $n_2$ | $k_2$ | $d_2$ | | |
| Example 1 | A-03 | 1.88 | 0.10 | 23 | 1.95 | 0.40 | 135 | 0.75 | ○ |
| Example 2 | B-03 | 1.88 | 0.10 | 21 | 1.95 | 0.40 | 135 | 1.06 | ○ |
| Example 3 | C-03 | 1.88 | 0.10 | 21 | 1.89 | 0.36 | 145 | 1.15 | ○ |
| Example 4 | D-03 | 1.90 | 0.10 | 18 | 1.79 | 0.32 | 160 | 1.22 | ○ |
| Example 5 | E-03 | 1.88 | 0.10 | 17 | 1.65 | 0.28 | 168 | 1.39 | ○ |
| Example 6 | A-16 | 1.72 | 0.06 | 220 | 1.73 | 0.20 | 207 | 0.75 | ○ |
| Example 7 | B-16 | 1.72 | 0.06 | 265 | 1.73 | 0.20 | 220 | 1.06 | ○ |
| Comparative example 1 | — | 1.90 | 0.10 | 31 | 1.60 | 0.40 | 135 | 1.06 | X |
| Comparative example 2 | — | 1.80 | 0.10 | 30 | 1.55 | 0.40 | 135 | 1.15 | X |
| Comparative example 3 | — | " | " | " | " | " | " | 1.22 | X |
| Comparative example 4 | — | " | " | " | " | " | " | 1.39 | X |

As apparently seen from Table 7, the antireflection films of a two-layer configuration to which the present invention is applied have a better cross sectional shape of a resist than the antireflection films of a two-layer configuration to which the present invention is not applied.

In this manner, where an antireflection film of a two-layer configuration which has a double refractive index and a film thickness which are individually within particular ranges is formed between a resist layer and the surface of a silicon semiconductor substrate by applying the present invention, the reflectance from the silicon semiconductor substrate in the antireflection film corresponding to the numerical aperture NA of the exposure system which is within a fixed range can be reduced. Consequently, a good resist pattern can be obtained.

It is to be noted that, while, in the examples described above, an antireflection film of a two-layer configuration formed by a plasma enhanced CVD method is described as an example, according to the present invention, the antireflection film of a two-layer configuration is not limited to this but may be formed, for example, by a spin coating method or any other method.

Semiconductor devices were fabricated using the antireflection films of a two-layer configuration of the present invention. It is to be noted that a phase shift mask was used as the exposure mask while an ArF excimer laser (wavelength $\lambda$: 193 nm) was used as the light source for exposure light, and a zone illumination method was adopted. Further, the surface of the resist layer was covered with a water layer. Then, it was verified whether or not a desired pattern could be formed on the resist layer without any fluctuation in line width or shape. As a result, it was found that, in any case, a desired pattern could be formed on the resist layer without any fluctuation in line width or shape. Besides, in any case, the reflectance was equal to or less than 0.4.

In particular, formation of an element isolation region having a trench structure was performed. More particularly, an antireflection film having a two-layer structure was formed on a silicon semiconductor substrate, and a resist layer was formed on the antireflection film and then exposed and developed to obtain a patterned resist layer. Then, the silicon semiconductor substrate was etched to a predetermined depth by an RIE method using the patterned resist layer as an etching mask to form a trench on the silicon semiconductor substrate. Thereafter, an insulator film is formed on the overall face of the silicon semiconductor substrate including the trench, and then the insulator film on the surface of the silicon semiconductor substrate was removed to obtain an element isolation region having a trench structure wherein the isolation film is embedded in the trench formed on the silicon semiconductor substrate.

While preferred examples of the present invention are described above, the present invention is not limited to the specific examples, but the configuration of the antireflection film and the film thicknesses and the complex refraction indices of the layers which form the antireflection film in the examples are for illustrative purposes only and can be altered suitably.

What is claimed is:

1. A method for patterning a resist layer comprising the steps of:
providing a silicon semiconductor substrate;
providing a resist layer above the semiconductor substrate;
providing an antireflection film between a surface of the silicon semiconductor substrate and said resist layer; and
exposing the resist layer to light having a wavelength of 190 nm to 195 nm via a system having a numerical aperture equal to or less than 1, wherein, said antireflection film includes an upper layer having a complex refractive index $N_1$ equal to $n_1-k_1 i$ and a film thickness $d_1$, and a lower layer having a complex refractive index $N_2$ equal to $n_2-k_2 i$ and a film thickness $d_2$, said upper layer and said lower layer configured such that the values of $n_{10}$, $k_{10}$, $d_{10}$, $n_{20}$, $k_{20}$, $d_{20}$, $n_1$, $k_1$, $d_1$, $n_2$, $k_2$ and $d_2$ satisfy a Formula 1

$$\{(n_1-n_{10})/(n_{1m}-n_{10})\}^2+\{(k_1-k_{10})/(k_{1m}-k_{10})\}^2+$$
$$\{(d_1-d_{10})/(d_{1m}-d_{10})\}^2+\{(n_2-n_{20})/(n_{2m}-n_{20})\}^2+$$
$$\{(k_2-k_{20})/(k_{2m}-k_{20})\}^2+\{(d_2-d_{20})/(d_{2m}-d_{20})\}^2 \leq 1, \quad \text{Formula 1:}$$

the values of $n_{10}$, $k_{10}$, $d_{10}$, $n_{20}$, $k_{20}$, $d_{20}$, $n_1$, $k_1$, $d_1$, $n_2$, $k_2$ and $d_2$ are defined by one of cases [0-01] to [1-16] in Tables 1-1 through 1-4, (a) a value of $n_{1m}$ in the pertaining case is adopted based on a relationship in magnitude between $n_1$ and $n_{10}$; (b) a value of $k_{1m}$ in the pertaining case is adopted based on a relationship in magnitude between $k_1$ and $k_{10}$; (c) a value of $d_{1m}$ in the pertaining case is adopted based on a relationship in magnitude between $d_1$ and $d_{10}$; (d) a value of $n_{2m}$ in the pertaining case is adopted based on a relationship in magnitude between $n_2$ and $n_{20}$; (e) a value of $k_{2m}$ in the pertaining case is adopted based on a relationship in magnitude between $k_2$ and $k_{20}$; and (f) a value of $d_{2m}$ in the pertaining case is adopted based on a relationship in magnitude between $d_2$ and $d_{20}$, and Tables 1-1 through 1-4 are:

TABLE 1-1

| Case | 1-01 | 1-02 | 1-03 | 1-04 | 1-05 |
| --- | --- | --- | --- | --- | --- |
| $n_{10}$ | 2.1616 | 1.9575 | 1.8783 | 1.8886 | 1.7671 |
| $k_{10}$ | 0.0031 | 0.1578 | 0.1120 | 0.0828 | 0.0972 |
| $d_{10}$ (nm) | 16.39 | 29.70 | 22.79 | 17.43 | 89.65 |
| $n_{20}$ | 2.3326 | 3.1421 | 1.9535 | 1.8540 | 1.7266 |
| $k_{20}$ | 0.9955 | 0.5540 | 0.3987 | 0.3157 | 0.6265 |
| $d_{20}$ (nm) | 21.81 | 39.99 | 133.42 | 201.01 | 35.79 |
| for $n_1 \geq$ | 2.2660 | 2.0526 | 1.9695 | 1.9914 | 1.8452 |
| $n_{10}, n_{1m} =$ | | | | | |
| for $n_1 <$ | 2.0674 | 1.8816 | 1.8041 | 1.8047 | 1.7221 |
| $n_{10}, n_{1m} =$ | | | | | |
| for $k_1 \geq$ | 0.1058 | 0.2476 | 0.1956 | 0.1790 | 0.1791 |
| $k_{10}, k_{1m} =$ | | | | | |
| for $k_1 <$ | 0.0000 | 0.0772 | 0.0266 | 0.0000 | 0.0475 |
| $k_{10}, k_{1m} =$ | | | | | |
| for $d_1 \geq$ | 19.64 | 35.17 | 31.59 | 26.35 | 108.00 |
| $d_{10}, d_{1m}$ (nm) $=$ | | | | | |
| for $d_1 <$ | 13.49 | 25.28 | 16.46 | 11.04 | 81.48 |
| $d_{10}, d_{1m}$ (nm) $=$ | | | | | |
| for $n_2 \geq$ | 2.4717 | 3.2954 | 2.1133 | 2.0045 | 1.8644 |
| $n_{20}, n_{2m} =$ | | | | | |
| for $n_2 <$ | 2.1929 | 2.9698 | 1.7768 | 1.6777 | 1.5730 |
| $n_{20}, n_{2m} =$ | | | | | |
| for $k_2 \geq$ | 1.1482 | 0.7497 | 0.6196 | 0.4975 | 0.7644 |
| $k_{20}, k_{2m} =$ | | | | | |
| for $k_2 <$ | 0.8579 | 0.4177 | 0.2781 | 0.2069 | 0.4915 |
| $k_{20}, k_{2m} =$ | | | | | |
| for $d_2 \geq$ | 25.55 | 42.99 | ∞ | ∞ | 43.06 |
| $d_{20}, d_{2m}$ (nm) $=$ | | | | | |
| for $d_2 <$ | 18.70 | 37.27 | 75.37 | 118.11 | 29.14 |
| $d_{20}, d_{2m}$ (nm) $=$ | | | | | |

TABLE 1-2

| Case | 1-06 | 1-07 | 1-08 | 1-09 | 1-10 |
|---|---|---|---|---|---|
| $n_{10}$ | 1.7783 | 1.7756 | 1.7637 | 1.7297 | 1.7402 |
| $k_{10}$ | 0.0854 | 0.0827 | 0.0788 | 0.0695 | 0.0705 |
| $d_{10}$ (nm) | 90.09 | 89.16 | 88.60 | 159.09 | 157.00 |
| $n_{20}$ | 1.9451 | 1.8813 | 1.8074 | 1.8027 | 1.9115 |
| $k_{20}$ | 0.4110 | 0.2980 | 0.2358 | 0.6176 | 0.3647 |
| $d_{20}$ (nm) | 78.70 | 136.86 | 201.53 | 30.94 | 79.38 |
| $n_{10}, n_{1m} =$ for $n_1 \geq$ | 1.8547 | 1.8491 | 1.8363 | 1.8086 | 1.8145 |
| $n_{10}, n_{1m} =$ for $n_1 <$ | 1.7290 | 1.7286 | 1.7192 | 1.6900 | 1.6996 |
| $n_{10}, n_{1m} =$ for $k_1 \geq$ | 0.1675 | 0.1627 | 0.1158 | 0.1537 | 0.1529 |
| $k_{10}, k_{1m} =$ for $k_1 <$ | 0.0321 | 0.0280 | 0.0215 | 0.0304 | 0.0296 |
| $k_{10}, k_{1m} =$ for $d_1 \geq$ | 108.98 | 109.36 | 112.80 | ∞ | 193.81 |
| $d_{10}, d_{1m}$ (nm) = for $d_1 <$ | 80.83 | 80.19 | 79.23 | 146.42 | 145.32 |
| $d_{10}, d_{1m}$ (nm) = for $n_2 \geq$ | 2.0858 | 2.0287 | 1.9635 | 1.9536 | 2.0439 |
| $n_{20}, n_{2m} =$ for $n_2 <$ | 1.7991 | 1.7335 | 1.6573 | 1.6453 | 1.7648 |
| $n_{20}, n_{2m} =$ for $k_2 \geq$ | 0.5849 | 0.5031 | 0.4587 | 0.7451 | 0.5149 |
| $k_{20}, k_{2m} =$ for $k_2 <$ | 0.2966 | 0.2049 | 0.1553 | 0.4826 | 0.2558 |
| $k_{20}, k_{2m} =$ for $d_2 \geq$ | 90.20 | ∞ | ∞ | 36.88 | 89.13 |
| $d_{20}, d_{2m}$ (nm) = for $d_2 <$ | 68.53 | 118.11 | 131.91 | 25.32 | 69.56 |
| $d_{20}, d_{2m}$ (nm) = | | | | | |

TABLE 1-3

| Case | 1-11 | 1-12 | 1-13 | 1-14 | 1-15 |
|---|---|---|---|---|---|
| $n_{10}$ | 1.7416 | 1.7346 | 1.7204 | 1.7293 | 1.7290 |
| $k_{10}$ | 0.0723 | 0.0700 | 0.0573 | 0.0638 | 0.0672 |
| $d_{10}$ (nm) | 154.81 | 154.48 | 226.55 | 221.51 | 219.00 |
| $n_{20}$ | 1.8276 | 1.7635 | 1.9505 | 1.9167 | 1.7992 |
| $k_{20}$ | 0.2602 | 0.2082 | 0.6496 | 0.3426 | 0.2416 |
| $d_{20}$ (nm) | 140.99 | 205.63 | 25.08 | 78.00 | 142.68 |
| for $n_1 \geq$ | 1.8128 | 1.8044 | 1.8037 | 1.8053 | 1.8030 |
| $n_{10}, n_{1m} =$ for $n_1 <$ | 1.7051 | 1.7002 | 1.6700 | 1.6857 | 1.6894 |
| $n_{10}, n_{1m} =$ for $k_1 \geq$ | 0.1493 | 0.1428 | 0.1449 | 0.1450 | 0.1411 |
| $k_{10}, k_{1m} =$ for $k_1 <$ | 0.0310 | 0.0277 | 0.0218 | 0.0296 | 0.0354 |
| $k_{10}, k_{1m} =$ for $d_1 \geq$ | 194.11 | ∞ | ∞ | ∞ | ∞ |
| $d_{10}, d_{1m}$ (nm) = for $d_1 <$ | 144.88 | 144.10 | 147.03 | 206.52 | 206.86 |
| $d_{10}, d_{1m}$ (nm) = for $n_2 \geq$ | 1.9727 | 1.9440 | 2.1270 | 2.0463 | 1.9388 |
| $n_{20}, n_{2m} =$ for $n_2 <$ | 1.6802 | 1.6149 | 1.7784 | 1.7598 | 1.6376 |
| $n_{20}, n_{2m} =$ for $k_2 \geq$ | 0.1493 | 0.4167 | 0.7867 | 0.4807 | 0.4185 |
| $k_{20}, k_{2m} =$ for $k_2 <$ | 0.0310 | 0.1340 | 0.4991 | 0.2325 | 0.1559 |
| $k_{20}, k_{2m} =$ for $d_2 \geq$ | ∞ | ∞ | 30.06 | 87.34 | ∞ |
| $d_{20}, d_{2m}$ (nm) = for $d_2 <$ | 126.07 | 175.09 | 20.53 | 70.06 | 130.30 |
| $d_{20}, d_{2m}$ (nm) = | | | | | |

TABLE 1-4

| Case | 1-16 |
|---|---|
| $n_{10}$ | 1.7210 |
| $k_{10}$ | 0.0630 |
| $d_{10}$ (nm) | 220.18 |
| $n_{20}$ | 1.7329 |
| $k_{20}$ | 0.1973 |
| $d_{20}$ (nm) | 207.16 |
| for $n_1 \geq$ | 1.7917 |
| $n_{10}, n_{1m} =$ for $n_1 <$ | 1.6626 |
| $n_{10}, n_{1m} =$ for $k_1 \geq$ | 0.1377 |
| $k_{10}, k_{1m} =$ for $k_1 <$ | 0.0303 |
| $k_{10}, k_{1m} =$ for $d_1 \geq$ | ∞ |
| $d_{10}, d_{1m}$ (nm) = for $d_1 <$ | 147.71 |
| $d_{10}, d_{1m}$ (nm) = for $n_2 \geq$ | 1.9597 |
| $n_{20}, n_{2m} =$ for $n_2 <$ | 1.5656 |
| $n_{20}, n_{2m} =$ for $k_2 \geq$ | 0.3989 |
| $k_{20}, k_{2m} =$ for $k_2 <$ | 0.1211 |
| $k_{20}, k_{2m} =$ for $d_2 \geq$ | ∞ |
| $d_{20}, d_{2m}$ (nm) = for $d_2 <$ | 174.03. |
| $d_{20}, d_{2m}$ (nm) = | |

2. The patterning method according to claim 1, wherein the film thickness $d_1$ of said upper layer satisfies $d_1 \leq 250$, and the film thickness $d_2$ of said lower layer satisfies $d_2 \leq 250$.

3. The patterning method according to claim 1, wherein the resist layer has a refractive index of 1.60 to 1.80.

4. A method for patterning a resist layer comprising the steps of:

providing a silicon semiconductor substrate;

providing a resist layer above the semiconductor substrate;

providing an antireflection film between a surface of the silicon semiconductor substrate and said resist layer; and exposing the resist layer to light having a wavelength of 190 nm to 195 nm via a system having a numerical aperture of more than 1.0 but less than or equal to 1.1, wherein, said antireflection film includes an upper layer having a complex refractive index $N_1$ equal to $n_1-k_1i$ and a film thickness $d_1$, and a lower layer having a complex refractive index $N_2$ equal to $n_2-k_2i$ and a film thickness $d_2$;

said upper layer and said lower layer configured such that the values of $n_{10}, k_{10}, d_{10}, n_{20}, k_{20}, d_{20}$] $n_1, k_1, d_1, n_2, k_2$ and $d_2$ satisfy a Formula 1

$$\{(n_1-n_{10})/(n_{1m}-n_{10})\}^2 + \{(k_1-k_{10})/(k_{1m}-k_{10})\}^2 + \{(d_1-d_{10})/(d_{1m}-d_{10})\}^2 + \{(n_2-n_{20})/(n_{2m}-n_{20})\}^2 + \{(k_2-k_{20})/(k_{2m}-k_{20})\}^2 + \{(d_2-d_{20})/(d_{2m}-d_{20})\}^2 \leq 1,$$ Formula 1:

the values of $n_{10}, k_{10}, d_{10}, n_{20}, k_{20}, d_{20}$] $n_1, k_1, d_1, n_2, k_2$ and $d_2$ are defined by one of cases [2-01] to [2-16] in Tables 2-1 through 2-4, (a) a value of $n_{1m}$ in the pertaining case is adopted based on a relationship in magnitude between $n_1$ and $n_{10}$; (b) a value of $k_{1m}$ in the pertaining case is adopted based on a relationship in magnitude between $k_1$ and $k_{10}$; (c) a value of $d_{1m}$ in the pertaining case is adopted based on a relationship in magnitude between $d_1$ and $d_{10}$; (d) a value of $n_{2m}$ in the pertaining case is adopted based on a relationship in magnitude between $n_2$ and $n_{20}$; (e) a value of $k_{2m}$ in the pertaining case is adopted based on a relationship in magnitude between $k_2$ and $k_{20}$; and (f) a value of $d_{2m}$ in the pertaining case is adopted based on a relationship in magnitude between $d_2$ and $d_{20}$, and Tables 2-1 through 2-4 are:

TABLE 2-1

| Case | 2-01 | 2-02 | 2-03 | 2-04 | 2-05 |
|---|---|---|---|---|---|
| $n_{10}$ | 2.1270 | 1.9689 | 1.8874 | 1.9059 | 1.7643 |
| $k_{10}$ | 0.0000 | 0.1461 | 0.1027 | 0.0744 | 0.0947 |
| $d_{10}$ (nm) | 17.47 | 26.67 | 21.38 | 15.49 | 94.08 |
| $n_{20}$ | 2.3628 | 3.1616 | 1.9199 | 1.8297 | 1.7955 |
| $k_{20}$ | 0.9776 | 0.5440 | 0.3802 | 0.2998 | 0.6320 |
| $d_{20}$ (nm) | 21.04 | 39.98 | 139.31 | 207.65 | 32.98 |
| for $n_1 \geq$ $n_{10}, n_{1m} =$ | 2.2256 | 2.0568 | 1.9734 | 2.0082 | 1.8353 |
| for $n_1 <$ $n_{10}, n_{1m} =$ | 2.0472 | 1.9010 | 1.8223 | 1.8296 | 1.7330 |
| for $k_1 \geq$ $k_{10}, k_{1m} =$ | 0.0938 | 0.2244 | 0.1768 | 0.1635 | 0.1575 |
| for $k_1 <$ $k_{10}, k_{1m} =$ | 0.0000 | 0.0685 | 0.0175 | 0.0000 | 0.0495 |
| for $d_1 \geq$ $d_{10}, d_{1m}$ (nm) = | 20.80 | 34.77 | 29.62 | 23.26 | 112.91 |
| for $d_1 <$ $d_{10}, d_{1m}$ (nm) = | 14.63 | 25.76 | 16.06 | 10.49 | 87.82 |
| for $n_2 \geq$ $n_{20}, n_{2m} =$ | 2.4916 | 3.3028 | 2.0581 | 1.9623 | 1.0974 |
| for $n_2 <$ $n_{20}, n_{2m} =$ | 2.2319 | 3.0031 | 1.7577 | 1.6665 | 1.6538 |
| for $k_2 \geq$ $k_{20}, k_{2m} =$ | 1.1151 | 0.7242 | 0.5735 | 0.4524 | 0.7450 |
| for $k_2 <$ $k_{20}, k_{2m} =$ | 0.8400 | 0.4156 | 0.2710 | 0.2013 | 0.5085 |
| for $d_2 \geq$ $d_{20}, d_{2m}$ (nm) = | 24.36 | 42.69 | ∞ | ∞ | 39.62 |
| for $d_2 <$ $d_{20}, d_{2m}$ (nm) = | 18.21 | 37.46 | 80.09 | 126.81 | 27.34 |

TABLE 2-1

| Case | 2-06 | 2-07 | 2-08 | 2-09 | 2-10 |
|---|---|---|---|---|---|
| $n_{10}$ | 1.7803 | 1.7743 | 1.7445 | 1.7294 | 1.7425 |
| $k_{10}$ | 0.0868 | 0.0850 | 0.0789 | 0.0717 | 0.0762 |
| $d_{10}$ (nm) | 93.23 | 91.77 | 92.02 | 166.39 | 161.95 |
| $n_{20}$ | 1.9791 | 1.8636 | 1.7368 | 1.9163 | 1.9299 |
| $k_{20}$ | 0.3951 | 0.2810 | 0.2206 | 0.6369 | 0.3467 |
| $d_{20}$ (nm) | 77.05 | 139.87 | 212.33 | 26.72 | 78.23 |
| for $n_1 \geq$ $n_{10}, n_{1m} =$ | 1.8462 | 1.8349 | 1.8028 | 1.8016 | 1.8041 |
| for $n_1 <$ $n_{10}, n_{1m} =$ | 1.7475 | 1.7473 | 1.7193 | 1.7039 | 1.7237 |
| for $k_1 \geq$ $k_{10}, k_{1m} =$ | 0.1496 | 0.1408 | 0.1323 | 0.1330 | 0.1299 |
| for $k_1 <$ $k_{10}, k_{1m} =$ | 0.0394 | 0.0374 | 0.0301 | 0.0370 | 0.0455 |
| for $d_1 \geq$ $d_{10}, d_{1m}$ (nm) = | 109.31 | 108.27 | 115.67 | 209.20 | 195.88 |
| for $d_1 <$ $d_{10}, d_{1m}$ (nm) = | 87.00 | 86.56 | 85.73 | 157.85 | 156.76 |
| for $n_2 \geq$ $n_{20}, n_{2m} =$ | 2.1009 | 1.9987 | 1.8971 | 2.0476 | 2.0364 |
| for $n_2 <$ $n_{20}, n_{2m} =$ | 1.8504 | 1.7392 | 1.6175 | 1.7703 | 1.8051 |
| for $k_2 \geq$ $k_{20}, k_{2m} =$ | 0.5318 | 0.4468 | 0.3623 | 0.7342 | 0.4294 |
| for $k_2 <$ $k_{20}, k_{2m} =$ | 0.2922 | 0.2015 | 0.1499 | 0.5070 | 0.2516 |
| for $d_2 \geq$ $d_{20}, d_{2m}$ (nm) = | 85.43 | ∞ | ∞ | 31.20 | 85.58 |
| for $d_2 <$ $d_{20}, d_{2m}$ (nm) = | 68.38 | 126.05 | 181.56 | 22.38 | 72.33 |

TABLE 2-3

| Case | 2-11 | 2-12 | 2-13 | 2-14 | 2-15 |
|---|---|---|---|---|---|
| $n_{10}$ | 1.7364 | 1.7194 | 1.7189 | 1.7279 | 1.7039 |
| $k_{10}$ | 0.0767 | 0.0663 | 0.0609 | 0.0714 | 0.0620 |
| $d_{10}$ (nm) | 160.57 | 160.35 | 240.33 | 230.11 | 268.01 |
| $n_{20}$ | 1.7865 | 1.6960 | 2.2401 | 1.8887 | 1.7359 |
| $k_{20}$ | 0.2463 | 0.1988 | 0.7138 | 0.3299 | 0.2398 |
| $d_{20}$ (nm) | 145.39 | 214.32 | 17.92 | 78.86 | 158.55 |
| for $n_1 \geq$ $n_{10}, n_{1m} =$ | 1.7918 | 1.7729 | 1.7932 | 1.7879 | 1.7579 |
| for $n_1 <$ $n_{10}, n_{1m} =$ | 1.7262 | 1.6947 | 1.6903 | 1.7176 | 1.6407 |
| for $k_1 \geq$ $k_{10}, k_{1m} =$ | 0.1172 | 0.1176 | 0.1266 | 0.1177 | 0.1322 |
| for $k_1 <$ $k_{10}, k_{1m} =$ | 0.0534 | 0.0312 | 0.0317 | 0.0558 | 0.0228 |
| for $d_1 \geq$ $d_{10}, d_{1m}$ (nm) = | 198.97 | ∞ | ∞ | ∞ | ∞ |
| for $d_1 <$ $d_{10}, d_{1m}$ (nm) = | 157.73 | 149.13 | 225.89 | 226.73 | 223.91 |
| for $n_2 \geq$ $n_{20}, n_{2m} =$ | 1.8969 | 1.9046 | 2.4255 | 2.0020 | 1.9149 |
| for $n_2 <$ $n_{20}, n_{2m} =$ | 1.6706 | 1.5895 | 2.0733 | 1.8277 | 1.4543 |
| for $k_2 \geq$ $k_{20}, k_{2m} =$ | 0.3435 | 0.2910 | 0.8416 | 0.3876 | 0.4261 |
| for $k_2 <$ $k_{20}, k_{2m} =$ | 0.1729 | 0.1351 | 0.5371 | 0.2258 | 0.1424 |
| for $d_2 \geq$ $d_{20}, d_{2m}$ (nm) = | 161.62 | ∞ | 21.50 | 87.70 | ∞ |
| for $d_2 <$ $d_{20}, d_{2m}$ (nm) = | 139.39 | 187.96 | 15.15 | 76.00 | 129.53 |

TABLE 2-4

| Case | 2-4 |
|---|---|
| $n_{10}$ | 1.7046 |
| $k_{10}$ | 0.0595 |
| $d_{10}$ (nm) | 264.54 |
| $n_{20}$ | 1.7170 |
| $k_{20}$ | 0.1955 |
| $d_{20}$ (nm) | 223.28 |
| for $n_1 \geq$ $n_{10}, n_{1m} =$ | 1.7716 |
| for $n_1 <$ $n_{10}, n_{1m} =$ | 1.6465 |
| for $k_1 \geq$ $k_{10}, k_{1m} =$ | 0.1321 |
| for $k_1 <$ $k_{10}, k_{1m} =$ | 0.0178 |
| for $d_1 \geq$ $d_{10}, d_{1m}$ (nm) = | ∞ |
| for $d_1 <$ $d_{10}, d_{1m}$ (nm) = | 160.48 |
| for $n_2 \geq$ $n_{20}, n_{2m} =$ | 2.1001 |
| for $n_2 <$ $n_{20}, n_{2m} =$ | 1.4760 |
| for $k_2 \geq$ $k_{20}, k_{2m} =$ | 0.4081 |
| for $k_2 <$ $k_{20}, k_{2m} =$ | 0.1085 |
| for $d_2 \geq$ $d_{20}, d_{2m}$ (nm) = | ∞ |
| for $d_2 <$ $d_{20}, d_{2m}$ (nm) = | 143.86. |

5. The patterning method according to claim 4, wherein the film thickness $d_1$ of said upper layer satisfies $d_1 \leq 250$, and the film thickness $d_2$ of said lower layer satisfies $d_2 \leq 250$.

6. The patterning method according to claim 4, wherein the resist layer has a refractive index of 1.60 to 1.80.

7. A method for patterning a resist layer comprising the steps of:

providing a silicon semiconductor substrate;

providing a resist layer above the semiconductor substrate;

providing an antireflection film between a surface of the silicon semiconductor substrate and said resist layer; and exposing the resist layer to a light having a wave length of 190 nm to 195 nm via a system having a numerical aperture of more than 1.1 but less than or equal to 1.2, wherein, said antireflection film includes an upper layer having a complex refractive index $N_1$ equal to $n_1 - k_1 i$ and a film thickness $d_1$, and a lower layer having a complex refractive index $N_2$ equal to $n_2 - k_2 i$ and a film thickness $d_2$, said upper layer and said lower layer configured such that, the values of $n_{10}, k_{10}, d_{10}, n_{20}, k_{20}, d_{20}, n_1, k_1, d_1, n_2, k_2$ and $d_2$ satisfy a Formula 1

$$\{(n_1-n_{10})/(n_{1m}-n_{10})\}^2 + \{(k_1-k_{10})/(k_{1m}-k_{10})\}^2 + \{(d_1-d_{10})/(d_{1m}-d_{10})\}^2 + \{(n_2-n_{20})/(n_{2m}-n_{20})\}^2 + \{(k_2-k_{20})/(k_{2m}-k_{20})\}^2 + \{(d_2-d_{20})/(d_{2m}-d_{20})\}^2 \leq 1, \quad \text{Formula 1:}$$

the values of $n_{10}, k_{10}, d_{10}, n_{20}, k_{20}, d_{20}, n_1, k_1, d_1, n_2, k_2$ and $d_2$ are defined by one of cases [3-01] to [3-04] in Tables 3-1 to 3-4, (a) a value of $n_{1m}$ in the pertaining case is adopted based on a relationship in magnitude between $n_1$ and $n_{10}$; (b) a value of $k_{1m}$ in the pertaining case is adopted based on a relationship in magnitude between $k_1$ and $k_{10}$; (c) a value of $d_{1m}$ in the pertaining case is adopted based on a relationship in magnitude between $d_1$ and $d_{10}$; (d) a value of $n_{2m}$ in the pertaining case is adopted based on a relationship in magnitude between $n_2$ and $n_2$; (e) a value of $k_{2m}$ in the pertaining case is adopted based on a relationship in magnitude between $k_2$ and $k_{20}$; and (f) a value of $d_{2m}$ in the pertaining case is adopted based on a relationship in magnitude between $d_2$ and $d_{20}$, and Tables 4-1 through 4-4 are:

TABLE 4-1

| Case | 3-01 | 3-02 | 3-03 | 3-04 | 3-05 |
|---|---|---|---|---|---|
| $n_{10}$ | 2.1010 | 1.9972 | 1.8971 | 1.8903 | 1.7614 |
| $k_{10}$ | 0.0000 | 0.1417 | 0.0932 | 0.1047 | 0.0933 |
| $d_{10}$ (nm) | 18.86 | 29.97 | 20.09 | 13.40 | 99.78 |
| $n_{20}$ | 2.3980 | 3.9849 | 1.8912 | 1.7190 | 1.8773 |
| $k_{20}$ | 0.9577 | 0.5156 | 0.3589 | 0.2691 | 0.6361 |
| $d_{20}$ (nm) | 20.51 | 29.99 | 144.86 | 225.69 | 29.70 |
| for $n_1 \geq$ $n_{10}, n_{1m} =$ | 2.1902 | 2.0806 | 1.9757 | 1.9938 | 1.8213 |
| for $n_1 <$ $n_{10}, n_{1m} =$ | 2.0333 | 1.9400 | 1.8442 | 1.8243 | 1.7445 |
| for $k_1 \geq$ $k_{10}, k_{1m} =$ | 0.0791 | 0.2081 | 0.1538 | 0.1917 | 0.1313 |
| for $k_1 <$ $k_{10}, k_{1m} =$ | 0.0000 | 0.0680 | 0.0073 | 0.0023 | 0.0538 |
| for $d_1 \geq$ $d_{10}, d_{1m}$ (nm) = | 22.17 | 34.24 | 27.46 | 20.29 | 118.37 |
| for $d_1 <$ $d_{10}, d_{1m}$ (nm) = | 16.20 | 26.95 | 16.03 | 9.40 | 96.05 |
| for $n_2 \geq$ $n_{20}, n_{2m} =$ | 2.5150 | 4.1060 | 2.0062 | 1.8367 | 1.9517 |
| for $n_2 <$ $n_{20}, n_{2m} =$ | 2.2758 | 3.8579 | 1.7470 | 1.5737 | 1.7548 |
| for $k_2 \geq$ $k_{20}, k_{2m} =$ | 1.0902 | 0.6644 | 0.5181 | 0.3688 | 0.7101 |
| for $k_2 <$ $k_{20}, k_{2m} =$ | 0.8269 | 0.4039 | 0.2637 | 0.1833 | 0.5274 |
| for $d_2 \geq$ $d_{20}, d_{2m}$ (nm) = | 23.39 | 31.19 | ∞ | ∞ | 33.13 |

TABLE 4-1-continued

| Case | 3-01 | 3-02 | 3-03 | 3-04 | 3-05 |
|---|---|---|---|---|---|
| for $d_2 <$ $d_{20}, d_{2m}$ (nm) = | 17.92 | 28.87 | 85.53 | 141.88 | 25.36 |

TABLE 4-2

| Case | 3-06 | 3-07 | 3-08 | 3-09 | 3-10 |
|---|---|---|---|---|---|
| $n_{10}$ | 1.7825 | 1.7569 | 1.7277 | 1.7272 | 1.7147 |
| $k_{10}$ | 0.0898 | 0.0868 | 0.0740 | 0.0744 | 0.0633 |
| $d_{10}$ (nm) | 97.07 | 96.31 | 94.69 | 178.89 | 164.15 |
| $n_{20}$ | 2.0041 | 1.7847 | 1.6779 | 2.1865 | 1.6838 |
| $k_{20}$ | 0.3750 | 0.2610 | 0.2014 | 0.6947 | 0.1862 |
| $d_{20}$ (nm) | 75.78 | 148.77 | 220.98 | 19.20 | 215.48 |
| for $n_1 \geq$ $n_{10}, n_{1m} =$ | 1.8327 | 1.7995 | 1.7711 | 1.7845 | 1.7573 |
| for $n_1 <$ $n_{10}, n_{1m} =$ | 1.7698 | 1.7544 | 1.7097 | 1.7167 | 1.6822 |
| for $k_1 \geq$ $k_{10}, k_{1m} =$ | 0.1223 | 0.0982 | 0.1152 | 0.1077 | 0.1011 |
| for $k_1 <$ $k_{10}, k_{1m} =$ | 0.0533 | 0.0642 | 0.0321 | 0.0488 | 0.0264 |
| for $d_1 \geq$ $d_{10}, d_{1m}$ (nm) = | 109.28 | 111.91 | 114.36 | 218.45 | ∞ |
| for $d_1 <$ $d_{10}, d_{1m}$ (nm) = | 94.62 | 95.76 | 89.11 | 175.03 | 147.22 |
| for $n_2 \geq$ $n_{20}, n_{2m} =$ | 2.0899 | 1.8293 | 1.7201 | 2.2837 | 1.7321 |
| for $n_2 <$ $n_{20}, n_{2m} =$ | 1.9035 | 1.6980 | 1.5934 | 2.0604 | 1.6046 |
| for $k_2 \geq$ $k_{20}, k_{2m} =$ | 0.4366 | 0.3015 | 0.2464 | 0.7527 | 0.2137 |
| for $k_2 <$ $k_{20}, k_{2m} =$ | 0.2899 | 0.2021 | 0.1479 | 0.5549 | 0.1380 |
| for $d_2 \geq$ $d_{20}, d_{2m}$ (nm) = | 81.59 | 161.61 | ∞ | 21.11 | 235.37 |
| for $d_2 <$ $d_{20}, d_{2m}$ (nm) = | 70.00 | 146.51 | 196.47 | 16.79 | 195.03 |

TABLE 4-3

| Case | 3-11 | 3-12 | 3-13 | 3-14 |
|---|---|---|---|---|
| $n_{10}$ | 1.7036 | 1.7000 | 1.7012 | 1.7028 |
| $k_{10}$ | 0.0666 | 0.0723 | 0.0708 | 0.0661 |
| $d_{10}$ (nm) | 228.90 | 216.03 | 209.55 | 205.70 |
| $n_{20}$ | 2.1518 | 1.7881 | 1.7244 | 1.7099 |
| $k_{20}$ | 0.6409 | 0.3189 | 0.2345 | 0.1906 |
| $d_{20}$ (nm) | 21.01 | 93.79 | 164.15 | 230.44 |
| for $n_1 \geq$ $n_{10}, n_{1m} =$ | 1.7333 | 1.7203 | 1.7336 | 1.7514 |
| for $n_1 <$ $n_{10}, n_{1m} =$ | 1.6243 | 1.6387 | 1.6472 | 1.6539 |
| for $k_1 \geq$ $k_{10}, k_{1m} =$ | 0.1086 | 0.1103 | 0.1181 | 0.1191 |
| for $k_1 <$ $k_{10}, k_{1m} =$ | 0.0356 | 0.0460 | 0.0368 | 0.0268 |
| for $d_1 \geq$ $d_{10}, d_{1m}$ (nm) = | ∞ | 227.26 | 237.88 | ∞ |
| for $d_1 <$ $d_{10}, d_{1m}$ (nm) = | 181.97 | 190.09 | 179.63 | 173.04 |
| for $n_2 \geq$ $n_{20}, n_{2m} =$ | 2.3031 | 1.9012 | 1.8497 | 1.8964 |
| for $n_2 <$ $n_{20}, n_{2m} =$ | 2.0795 | 1.7532 | 1.6568 | 1.5385 |
| for $k_2 \geq$ $k_{20}, k_{2m} =$ | 0.7063 | 0.3281 | 0.3333 | 0.3179 |
| for $k_2 <$ $k_{20}, k_{2m} =$ | 0.5137 | 0.2264 | 0.1529 | 0.1170 |
| for $d_2 \geq$ $d_{20}, d_{2m}$ (nm) = | 24.52 | 111.38 | ∞ | ∞ |
| for $d_2 <$ $d_{20}, d_{2m}$ (nm) = | 19.07 | 89.55 | 150.63 | 157.43. |

8. The patterning method according to claim 7, wherein the film thickness $d_1$ of said upper layer satisfies $d_1 \leq 250$, and the film thickness $d_2$ of said lower layer satisfies $d_2 \leq 250$.

9. The patterning method according to claim 7, wherein the resist layer has a refractive index of 1.60 to 1.80.

10. A method for patterning a resist layer comprising: the steps of:
providing a silicon semiconductor substrate;
providing a resist layer above the semiconductor substrate;
providing an antireflection film between a surface of the silicon semiconductor substrate and said resist layer; and
exposing the resist layer to light having a wavelength of 190 nm to 195 nm via a system having a numerical aperture of more than 1.2 but less than or equal to 1.3, wherein,
said antireflection film includes an upper layer having a complex refractive index $N_1$ equal to $n_1 - k_1 i$ and a film thickness $d_1$, and a lower layer having a complex refractive index $N_2$ equal to $n_2 - k_2 i$ and a film thickness $d_2$,
said upper layer and said lower layer configured such that $n_{10}, k_{10}, d_{10}, n_{20}, k_{20}, d_{20}, n_1, k_1, d_1, n_2, k_2$ and $d_2$ satisfy a Formula 1

$$\{(n_1-n_{10})/(n_{1m}-n_{10})\}^2+\{(k_1-k_{10})/(k_{1m}-k_{10})\}^2+$$
$$\{(d_1-d_{10})/(d_{1m}-d_{10})\}^2+\{(n_2-n_{20})/(n_{2m}-n_{20})\}^2+$$
$$\{(k_2-k_{20})/(k_{2m}-k_{20})\}^2+\{(d_2-d_{20})/(d_{2m}-d_{20})\}^2 \leq 1, \quad \text{Formula 1:}$$

the values of $n_{10}, k_{10}, d_{10}, n_{20}, k_{20}, d_{20}, n_1, k_1, d_1, n_2, k_2$ and $d_2$ are defined by one of cases [4-01] to [4-10] in Tables 4-1 through 4-2, (a) a value of $n_{1m}$ in the pertaining case is adopted based on a relationship in magnitude between $n_1$ and $n_{10}$; (b) a value of $k_{1m}$ in the pertaining case is adopted based on a relationship in magnitude between $k_1$ and $k_{10}$; (c) a value of $d_{1m}$ in the pertaining case is adopted based on a relationship in magnitude between $d_1$ and $d_{10}$; (d) a value of $n_{2m}$ in the pertaining case is adopted based on a relationship in magnitude between $n_2$ and $n_{20}$; (e) a value of $k_{2m}$ in the pertaining case is adopted based on a relationship in magnitude between $k_2$ and $k_{20}$; and (f) a value of $d_{2m}$ in the pertaining case is adopted based on a relationship in magnitude between $d_2$ and $d_{20}$, and Tables 4-1 through 4-4 are:

TABLE 4-1

| Case | 4-01 | 4-02 | 4-03 | 4-04 | 4-05 |
|---|---|---|---|---|---|
| $n_{10}$ | 2.0750 | 2.0118 | 1.8885 | 1.8806 | 1.7567 |
| $k_{10}$ | 0.0000 | 0.1190 | 0.0999 | 0.1003 | 0.0923 |
| $d_{10}$ (nm) | 20.30 | 29.87 | 17.71 | 13.44 | 108.92 |
| $n_{20}$ | 2.4310 | 4.0092 | 1.7811 | 1.7062 | 2.0485 |
| $k_{20}$ | 0.9366 | 0.5022 | 0.3211 | 0.2477 | 0.6631 |
| $d_{20}$ (nm) | 19.90 | 29.99 | 159.56 | 227.84 | 23.68 |
| for $n_1 \geq$ $n_{10}, n_{1m} =$ | 2.1541 | 2.0844 | 1.9589 | 1.9713 | 1.7997 |
| for $n_1 <$ $n_{10}, n_{1m} =$ | 2.0215 | 1.9638 | 1.8538 | 1.8291 | 1.7557 |
| for $k_1 \geq$ $k_{10}, k_{1m} =$ | 0.0610 | 0.1705 | 0.1459 | 0.1729 | 0.0954 |
| for $k_1 <$ $k_{10}, k_{1m} =$ | 0.0000 | 0.0518 | 0.0187 | 0.0078 | 0.0655 |
| for $d_1 \geq$ $d_{10}, d_{1m}$(nm) = | 23.54 | 33.58 | 23.82 | 19.76 | 125.01 |
| for $d_1 <$ $d_{10}, d_{1m}$(nm) = | 18.03 | 27.42 | 15.13 | 10.09 | 108.67 |
| for $n_2 \geq$ $n_{20}, n_{2m}=$ | 2.5291 | 4.1084 | 1.8635 | 1.7809 | 2.0547 |
| for $n_2 <$ $n_{20}, n_{2m}=$ | 2.3203 | 3.9019 | 1.6624 | 1.5899 | 1.9572 |
| for $k_2 \geq$ $k_{20}, k_{2m}=$ | 1.0610 | 0.6325 | 0.4092 | 0.3139 | 0.6691 |

TABLE 4-1-continued

| Case | 4-01 | 4-02 | 4-03 | 4-04 | 4-05 |
|---|---|---|---|---|---|
| for $k_2 <$ $k_{20}, k_{2m}=$ | 0.8178 | 0.4040 | 0.2433 | 0.1176 | 0.5710 |
| for $d_2 \geq$ $d_{20}, d_{2m}$(nm) = | 22.43 | 30.97 | ∞ | ∞ | 23.86 |
| for $d_2 <$ $d_{20}, d_{2m}$(nm) = | 17.62 | 29.03 | 129.86 | 149.42 | 21.22 |

TABLE 4-2

| Case | 4-06 | 4-07 | 4-08 | 4-09 | 4-10 |
|---|---|---|---|---|---|
| $n_{10}$ | 1.7300 | 1.7016 | 1.7036 | 1.7088 | 1.7083 |
| $k_{10}$ | 0.0690 | 0.0665 | 0.0722 | 0.0700 | 0.0641 |
| $d_{10}$ (nm) | 99.33 | 227.28 | 216.05 | 208.98 | 205.66 |
| $n_{20}$ | 1.7059 | 2.1201 | 1.7959 | 1.7311 | 1.7076 |
| $k_{20}$ | 0.1911 | 0.6392 | 0.3181 | 0.2343 | 0.1900 |
| $d_{20}$ (nm) | 215.34 | 21.82 | 93.13 | 163.14 | 228.20 |
| for $n_1 \geq$ $n_{10}, n_{1m} =$ | 1.7599 | 1.7325 | 1.7213 | 1.7343 | 1.7487 |
| for $n_1 <$ $n_{10}, n_{1m} =$ | 1.7290 | 1.6697 | 1.6816 | 1.6905 | 1.6839 |
| for $k_1 \geq$ $k_{10}, k_{1m} =$ | 0.0744 | 0.1071 | 0.1083 | 0.1002 | 0.0965 |
| for $k_1 <$ $k_{10}, k_{1m} =$ | 0.0522 | 0.0350 | 0.0475 | 0.0408 | 0.0326 |
| for $d_1 \geq$ $d_{10}, d_{1m}$ (nm) = | 114.51 | 249.66 | 226.44 | 234.14 | ∞ |
| for $d_1 <$ $d_{10}, d_{1m}$ (nm) = | 98.99 | 206.91 | 203.38 | 198.02 | 187.04 |
| for $n_2 \geq$ $n_{20}, n_{2m} =$ | 1.7114 | 2.2630 | 1.9107 | 1.8583 | 1.8700 |
| for $n_2 <$ $n_{20}, n_{2m} =$ | 1.6501 | 2.0448 | 1.7644 | 1.6757 | 1.5497 |
| for $k_2 \geq$ $k_{20}, k_{2m} =$ | 0.1929 | 0.7020 | 0.3809 | 0.3287 | 0.3066 |
| for $k_2 <$ $k_{20}, k_{2m} =$ | 0.1524 | 0.5119 | 0.2256 | 0.1573 | 0.1188 |
| for $d_2 \geq$ $d_{20}, d_{2m}$ (nm) = | 219.55 | 25.26 | 110.64 | ∞ | ∞ |
| for $d_2 <$ $d_{20}, d_{2m}$ (nm) = | 205.88 | 19.68 | 89.45 | 150.12 | 160.78. |

11. The patterning method according to claim 10, wherein the film thickness $d_1$ of said upper layer satisfies $d_1 \leq 250$, and the film thickness $d_2$ of said lower layer satisfies $d_2 \leq 250$.

12. The patterning method according to claim 10, wherein the resist layer has a refractive index of 1.60 to 1.80.

13. A method for patterning a resist layer comprising the steps of:
providing silicon semiconductor substrate;
providing a resist layer above the semiconductor substrate;
providing an antireflection film between a surface of the silicon semiconductor substrate and said resist layer; and
exposing the resist layer to light having a wave length of 190 nm to 195 nm via a system having a numerical aperture of more than 1.3 but less than or equal to 1.4, wherein,
said antireflection film includes an upper layer having a complex refractive index $N_1$ equal to $n_1-k_1i$ and a film thickness $d_1$, and a lower layer having a complex refractive index $N_2$ equal to $n_2-k_2i$ and a film thickness $d_2$,
said upper layer and said lower layer configured such that the values of $n_{10}, k_{10}, d_{10}, n_{20}, k_{20}, d_{20}, n_1, k_1, d_1, n_2, k_2$ and $d_2$ satisfy a Formula 1

$$\{(n_1-n_{10})/(n_{1m}-n_{10})\}^2+\{(k_1-k_{10})/(k_{1m}-k_{10})\}^2+$$
$$\{(d_1-d_{10})/(d_{1m}-d_{10})\}^2+\{(n_2-n_{20})/(n_{2m}-n_{20})\}^2+$$
$$\{(k_2-k_{20})/(k_{2m}-k_{20})\}^2+\{(d_2-d_{20})/(d_{2m}-d_{20})\}^2 \leq 1, \quad \text{Formula 1:}$$

the values of $n_{10}, k_{10}, d_{10}, n_{20}, k_{20}, d_{20}, n_1, k_1, d_1, n_2, k_2$ and $d_2$ are defined by on of cases [5-01] to[5-07] in Table 5-1 through 5-2, (a) a value of $n_{1m}$ in the pertaining case is adopted based on a relationship in magnitude between $n_1$ and $n_{10}$; (b) a value of $k_{1m}$ in the pertaining case is adopted based on a relationship in magnitude between $k_1$ and $k_{10}$; (c) a value of $d_{1m}$ in the pertaining case is adopted based on a relationship in magnitude between $d_1$ and $d_{10}$; a value of $n_{2m}$ in the pertaining case is adopted based on a relationship in magnitude between $n_2$ and $n_{20}$; (e) a value of $k_{2m}$ in the pertaining case is adopted based on a relationship in magnitude between $k_2$ and $k_{20}$; and (f) a value of $d_{2m}$ in the pertaining case is adopted based on a relationship in magnitude between $d_2$ and $d_{20}$, and Tables 5-1 through 5-4 are:

TABLE 5-1

| Case | 5-01 | 5-02 | 5-03 | 5-04 | 5-05 |
|---|---|---|---|---|---|
| $n_{10}$ | 2.0901 | 2.0375 | 1.8787 | 1.8780 | 1.7009 |
| $k_{10}$ | 0.0000 | 0.0819 | 0.1028 | 0.0706 | 0.0609 |
| $d_{10}$ (nm) | 20.79 | 29.12 | 16.60 | 14.89 | 160.18 |
| $n_{20}$ | 2.4315 | 3.6552 | 1.7172 | 1.7467 | 1.6995 |
| $k_{20}$ | 0.9254 | 0.4960 | 0.2840 | 0.2361 | 0.1745 |
| $d_{20}$ (nm) | 20.34 | 34.09 | 167.85 | 221.06 | 215.71 |
| for $n_1 \geqq$ $n_{10}, n_{1m} =$ | 2.1532 | 2.0916 | 1.9323 | 1.9461 | 1.7131 |
| for $n_1 <$ $n_{10}, n_{1m} =$ | 2.0485 | 1.9946 | 1.8625 | 1.8482 | 1.6965 |
| for $k_1 \geqq$ $k_{10}, k_{1m} =$ | 0.0301 | 0.1157 | 0.1287 | 0.1125 | 0.0797 |
| for $k_1 <$ $k_{10}, k_{1m} =$ | 0.0000 | 0.0234 | 0.0358 | 0.0000 | 0.0529 |
| for $d_1 \geqq$ $d_{10}, d_{1m}$ (nm) = | 23.53 | 31.97 | 21.01 | 20.40 | 168.49 |
| for $d_1 <$ $d_{10}, d_{1m}$ (nm) = | 19.45 | 27.24 | 15.35 | 12.65 | 156.71 |
| for $n_2 \geqq$ $n_{20}, n_{2m} =$ | 2.4915 | 3.7301 | 1.7470 | 1.7894 | 1.7056 |
| for $n_2 <$ $n_{20}, n_{2m} =$ | 2.3369 | 3.5977 | 1.6335 | 1.6492 | 1.6786 |
| for $k_2 \geqq$ $k_{20}, k_{2m} =$ | 1.0253 | 0.5706 | 0.3145 | 0.2771 | 0.1981 |
| for $k_2 <$ $k_{20}, k_{2m} =$ | 0.8408 | 0.4125 | 0.2297 | 0.1801 | 0.1502 |
| for $d_2 \geqq$ $d_{20}, d_{2m}$ (nm) = | 22.48 | 35.05 | ∞ | ∞ | 219.96 |

TABLE 5-1-continued

| Case | 5-01 | 5-02 | 5-03 | 5-04 | 5-05 |
|---|---|---|---|---|---|
| for $d_2 <$ $d_{20}, d_{2m}$ (nm) = | 18.31 | 33.41 | 144.47 | 152.04 | 200.15 |

TABLE 5-2

| Case | 5-06 | 5-07 |
|---|---|---|
| $n_{10}$ | 1.7204 | 1.7142 |
| $k_{10}$ | 0.0677 | 0.0552 |
| $d_{10}$ (nm) | 231.66 | 225.66 |
| $n_{20}$ | 2.2460 | 1.7026 |
| $k_{20}$ | 0.6523 | 0.1831 |
| $d_{20}$ (nm) | 18.88 | 210.32 |
| for $n_1 \geqq$ $n_{10}, n_{1m} =$ | 1.7346 | 1.7449 |
| for $n_1 <$ $n_{10}, n_{1m} =$ | 1.7142 | 1.7015 |
| for $k_1 \geqq$ $k_{10}, k_{1m} =$ | 0.0791 | 0.0776 |
| for $k_1 <$ $k_{10}, k_{1m} =$ | 0.0480 | 0.0279 |
| for $d_1 \geqq$ $d_{10}, d_{1m}$ (nm) = | 241.66 | 269.84 |
| for $d_1 <$ $d_{10}, d_{1m}$ (nm) = | 227.75 | 215.83 |
| for $n_2 \geqq$ $n_{20}, n_{2m} =$ | 2.3315 | 1.8141 |
| for $n_2 <$ $n_{20}, n_{2m} =$ | 2.2068 | 1.6257 |
| for $k_2 \geqq$ $k_{20}, k_{2m} =$ | 0.6941 | 0.2591 |
| for $k_2 <$ $k_{20}, k_{2m} =$ | 0.5188 | 0.1258 |
| for $d_2 \geqq$ $d_{20}, d_{2m}$ (nm) = | 20.91 | ∞ |
| for $d_2 <$ $d_{20}, d_{2m}$ (nm) = | 17.96 | 186.01. |

14. The patterning method according to claim 13, wherein the film thickness $d_1$ of said upper layer satisfies $d_1 \leqq 250$, and the film thickness $d_2$ of said lower layer satisfies $d_2 \leqq 250$.

15. The patterning method according to claim 13, wherein the resist layer has a refractive index of 1.60 to 1.80.

* * * * *